US012641942B2

(12) United States Patent
Cha et al.

(10) Patent No.: US 12,641,942 B2
(45) Date of Patent: May 26, 2026

(54) DISPLAY DEVICE

(71) Applicant: Samsung Display Co., LTD., Yongin-si (KR)

(72) Inventors: Jong Hwan Cha, Suwon-si (KR); Ki Nyeng Kang, Sejong-si (KR); Hong Joon Moon, Cheonan-si (KR); Kwang Taek Hong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 621 days.

(21) Appl. No.: 17/963,857

(22) Filed: Oct. 11, 2022

(65) Prior Publication Data

US 2023/0142777 A1 May 11, 2023

(30) Foreign Application Priority Data

Nov. 11, 2021 (KR) ........................ 10-2021-0154674

(51) Int. Cl.
H10H 29/14 (2025.01)
H10H 20/01 (2025.01)
H10H 20/821 (2025.01)
H10H 20/84 (2025.01)

(52) U.S. Cl.
CPC .......... H10H 29/142 (2025.01); H10H 20/01 (2025.01); H10H 20/821 (2025.01); H10H 20/84 (2025.01)

(58) Field of Classification Search
CPC .... H10H 29/142; H10H 20/01; H10H 20/821; H10H 20/84; H10H 20/857; H10H 20/831; H10H 20/852; H10D 86/441; H10D 86/60; H10D 86/481; H10K 59/131; H01L 25/0753
See application file for complete search history.

(56) References Cited

U.S. PATENT DOCUMENTS

| 2019/0081261 | A1 | 3/2019 | Lee et al. |
| 2019/0326348 | A1 | 10/2019 | Im et al. |
| 2020/0075667 | A1* | 3/2020 | Lee ........................ H10H 20/83 |
| 2021/0313498 | A1 | 10/2021 | Kim et al. |

FOREIGN PATENT DOCUMENTS

| EP | 3905331 A1 | 11/2021 |
| KR | 2019-0029831 A | 3/2019 |
| KR | 2019-0121894 A | 10/2019 |

* cited by examiner

*Primary Examiner* — Sitaramarao S Yechuri
(74) *Attorney, Agent, or Firm* — Womble Bond Dickinson (US) LLP

(57) ABSTRACT

A display device includes an emission area, a first sub-region on one side of the emission area in a first direction, and a second sub-region on an other side of the emission area in the first direction, a bank layer surrounding the emission area, the first sub-region, and the second sub-region, a first voltage line extending in a second direction crossing the first direction in the first sub-region, and a second voltage line extending in the second direction in the second sub-region, a first electrode extending in the first direction and disposed across the first sub-region, the emission area, and the second sub-region, a second electrode extending in the first direction and including a portion spaced from the first electrode in the second direction in the emission area, and a plurality of light emitting elements on the first electrode and the second electrode in the emission area.

20 Claims, 30 Drawing Sheets

CNE: CNE1, CNE2, CNE3
RME: RME1, RME2

T2: ACT2, G2, D2, S2
CNE: CNE1, CNE2, CNE3
RME: RME1, RME2
ED: ED1, ED2

FIG. 12

CNE: CNE1, CNE2, CNE3
RME: RME1, RME2
ED: ED1, ED2

CNE: CNE1, CNE2, CNE3
RME: RME1, RME2

CNE_1: CNE1_1, CNE2_1, CNE3
RME: RME1, RME2

DISPLAY DEVICE

CROSS-REFERENCE TO RELATED APPLICATION

This application claims priority to and the benefit of Korean Patent Application No. 10-2021-0154674 filed on Nov. 11, 2021 in the Korean Intellectual Property Office, the entire content of which is incorporated by reference herein.

BACKGROUND

1. Field

The present disclosure relates to a display device.

2. Description of the Related Art

The importance of display devices has steadily increased with the development of multimedia technology. In response thereto, various types of display devices such as an organic light emitting diode (OLED) display, a liquid crystal display (LCD) and the like have been used.

As a device for displaying an image of a display device, there is a self-light emitting display device including a light emitting element. The self-light emitting display device includes an organic light emitting display device using an organic material as a light emitting material as a light emitting element, an inorganic light emitting display device using an inorganic material as a light emitting material, or the like.

SUMMARY

Aspects and features of embodiments of the present disclosure provide a display device including a bridge electrode connecting an electrode to voltage lines, and connection electrodes electrically connected to a voltage line and a light emitting element without being in contact with the electrodes.

However, aspects and features of embodiments of the present disclosure are not restricted to the one set forth herein. The above and other aspects of the present disclosure will become more apparent to one of ordinary skill in the art to which the present disclosure pertains by referencing the detailed description of the present disclosure given below.

According to one or more embodiments of the present disclosure, a display device includes an emission area, a first sub-region on one side of the emission area in a first direction, and a second sub-region on an other side of the emission area in the first direction, a bank layer surrounding the emission area, the first sub-region, and the second sub-region, a first voltage line extending in a second direction crossing the first direction in the first sub-region, and a second voltage line extending in the second direction in the second sub-region, a first electrode extending in the first direction and located across the first sub-region, the emission area, and the second sub-region, a second electrode extending in the first direction and including a portion spaced from the first electrode in the second direction in the emission area, a plurality of light emitting elements on the first electrode and the second electrode in the emission area, an electrode pattern in the first sub-region and spaced from the first electrode in the first direction, a first bridge electrode overlapping the electrode pattern and the first voltage line in the first sub-region while being in direct contact with each of the electrode pattern and the first voltage line, and a second bridge electrode partially located in the second sub-region, and overlapping the second electrode and the second voltage line while being in direct contact with each of the second electrode and the second voltage line.

The display device may further include a first via hole in the first sub-region and overlapping the first voltage line without overlapping the electrode pattern, and a first contact portion overlapping the electrode pattern, wherein the first bridge electrode may overlap the first via hole and the first contact portion.

The display device may further include a second via hole overlapping the second voltage line without overlapping the second electrode, and a second contact portion overlapping the second electrode, wherein the second bridge electrode may overlap the second via hole and the second contact portion under the bank layer.

The second via hole and the second contact portion may overlap a portion of the bank layer on one side of the second sub-region in the second direction.

The display device may further include a first connection electrode on the first electrode and in contact with some of the plurality of light emitting elements, and a second connection electrode on the second electrode and in contact with some of the plurality of light emitting elements.

The first connection electrode may extend from the emission area to the other side in the first direction so that a portion thereof is disposed to overlap a first electrode contact hole disposed not to overlap the first electrode in the second sub-region.

The display device may further include a scan line on one side of the second voltage line in the first direction and extending in the second direction in the second sub-region, and a gate pattern extending from the scan line to one side in the first direction and located across the emission area and the second sub-region in which the first electrode contact hole is formed.

The display device may further include a scan line on one side of the second voltage line in the first direction and extending in the second direction in the second sub-region, and a gate pattern extending from the scan line to one side in the first direction and disposed across the emission area and the second sub-region in which the first electrode contact hole is not formed.

The first connection electrode may extend from the emission area to one side in the first direction so that a portion thereof overlaps a first electrode contact hole located between the first electrode and the second electrode in the first sub-region.

The second connection electrode may extend from the emission area to the other side in the first direction so that a portion thereof is located in the second sub-region, and be in direct contact with the second bridge electrode through a second electrode contact hole in the second sub-region while overlapping the second bridge electrode.

The second connection electrode may extend from the emission area to the other side in the first direction so that a portion thereof is in the second sub-region, and be in direct contact with the second voltage line through a second electrode contact hole in the second sub-region while overlapping the second voltage line.

The second electrode may include an electrode stem portion extending in the first direction, and a first electrode branch portion and a second electrode branch portion branched from the electrode stem portion, the first electrode branch portion of the second electrode and the second electrode branch portion of another second electrode may be located in the emission area with the first electrode interposed therebetween, and the plurality of light emitting elements may include a first light emitting element and a second light emitting element, the first light emitting element being on the first electrode and the second electrode branch portion, and the second light emitting element being on the first electrode and the first electrode branch portion.

The first connection electrode may be on the first electrode and is in contact with the first light emitting element, and the second connection electrode may be on the first electrode branch portion of the second electrode and is in contact with the second light emitting element, the display device may further include a third connection electrode located across the first electrode and the second electrode branch portion of another second electrode, the third connection electrode being in contact with each of the first light emitting element and the second light emitting element.

According to one or more embodiments of the present disclosure, a display device includes a first substrate including a display area and a pad area on one side of the display area, a first conductive layer on the first substrate, the first conductive layer including a plurality of voltage lines in the display area and a plurality of pad electrodes in the pad area, a first passivation layer on the first conductive layer, a via layer on the first passivation layer in the display area and including a plurality of via holes overlapping the plurality of voltage lines, a first electrode and a second electrode on the via layer in the display area, and spaced from each other without overlapping the via holes, a first insulating layer on the first electrode and the second electrode in the display area and located on the first passivation layer in the pad area, a plurality of bridge electrodes overlapping any one of the first and second electrodes and the via hole, a plurality of light emitting elements on the first electrode and the second electrode that are spaced from each other on the first insulating layer, and a first connection electrode on the first electrode and in contact with some of the plurality of light emitting elements, and a second connection electrode on the second electrode and in contact with some of the plurality of light emitting elements, wherein the plurality of bridge electrode includes a first bridge electrode and a second bridge electrode, the first bridge electrode being in direct contact with a first voltage line of the plurality of voltage lines and the first electrode through a first via hole exposing a part of a top surface of the first voltage line and a first contact portion exposing a part of a top surface of the first electrode, respectively, and the second bridge electrode in direct contact with a second voltage line of the plurality of voltage lines and the second electrode through a second via hole exposing a part of a top surface of the second voltage line and a second contact portion exposing a part of a top surface of the second electrode, respectively.

The first insulating layer and the first passivation layer may include openings exposing parts of top surfaces of the first voltage line and the second voltage line in the first via hole and the second via hole, respectively, and the first bridge electrode and the second bridge electrode may be in direct contact with the first voltage line and the second voltage line through the openings, respectively.

Inner sidewalls of the first insulating layer and the first passivation layer may be aligned with each other in the opening.

The first connection electrode may be in direct contact with a first electrode connection portion of the first conductive layer through a first electrode contact hole penetrating the via layer without overlapping the first electrode, and the first passivation layer and the first insulating layer may further include an opening exposing a part of a top surface of the first electrode connection portion in the first electrode contact hole.

The display device may further include a second insulating layer on the plurality of light emitting elements and the first insulating layer, and a third insulating layer on the second insulating layer, wherein the second connection electrode may be in direct contact with the second bridge electrode through a second electrode contact hole penetrating the second insulating layer and the third insulating layer to expose a part of a top surface of the second bridge electrode without overlapping the second electrode.

The second connection electrode may be in direct contact with the second voltage line through a second electrode contact hole penetrating the via layer without overlapping the second electrode.

The first insulating layer and the first passivation layer may include openings exposing parts of top surfaces of the pad electrodes, the display device may further include pad bridge electrodes in direct contact with the pad electrodes through the openings.

The display device according to one or more embodiments may include a bridge electrode connecting an electrode to voltage lines, and connection electrodes electrically connected to a voltage line and a light emitting element without being in contact with electrodes.

The display device may prevent an increase in contact resistance that may occur when the connection electrode is brought into contact with the electrode. In addition, the electrodes may be formed in a state where the voltage lines are not exposed to protect the voltage lines, and as the bridge electrode is disposed on the electrode, damage to a material between the bridge electrode and the electrode may be prevented.

However, the effects, aspects, and features of the present disclosure are not limited to the aforementioned effects, aspects, and features and various other effects, aspects, and features are included in the specification.

BRIEF DESCRIPTION OF THE DRAWINGS

The above and other aspects and features of the present disclosure will become more apparent by describing in detail embodiments thereof with reference to the attached drawings, in which:

FIG. 12 is a cross-sectional view taken along the lines Q4-Q4', Q5-Q5', and Q6-Q6' of FIG. 8;

DETAILED DESCRIPTION

Embodiments of the present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments will be described with reference to the accompanying drawings.

Figure 1:
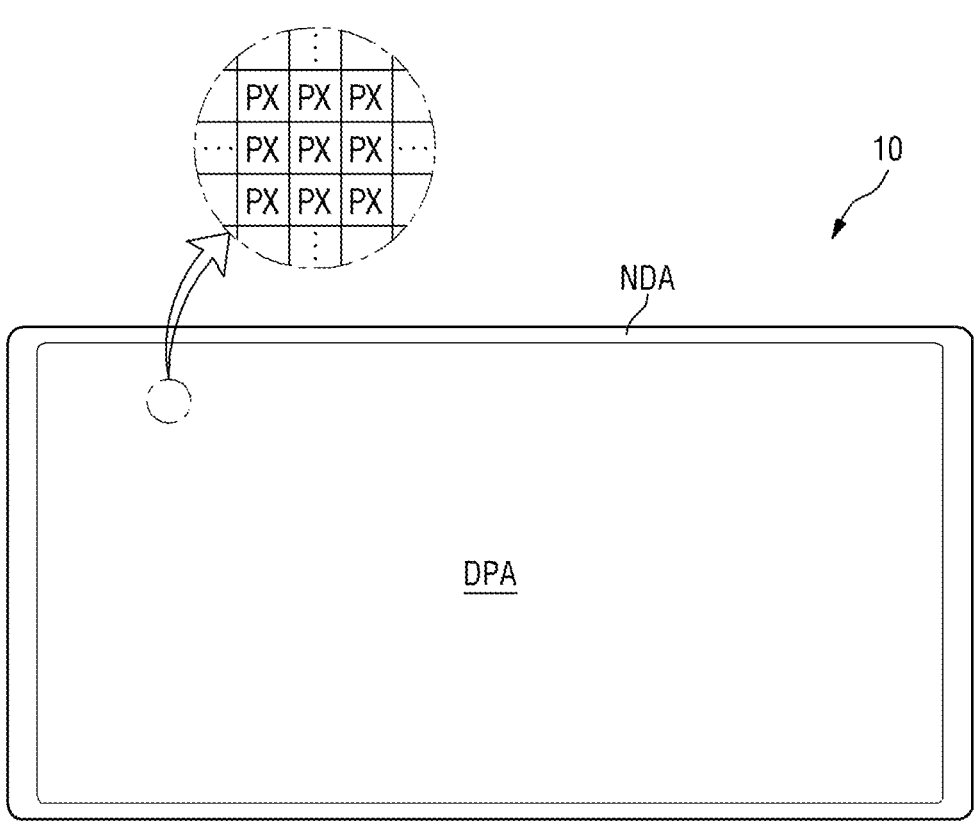
FIG. 1 is a schematic plan view of a display device according to one or more embodiments.
Figure 1:
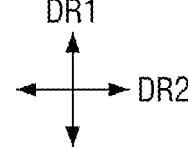

FIG. 1 is a schematic plan view of a display device according to one or more embodiments.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 includes a display panel that provides a display screen. Examples of the display panel may include an inorganic light emitting diode display panel, an organic light emitting display panel, a quantum dot light emitting display panel, a plasma display panel, and a field emission display panel. In the following description, a case where an inorganic light emitting diode display panel is applied as a display panel will be exemplified, but the present disclosure is not limited thereto, and other display panels may be applied within the same scope of technical spirit.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (e.g., vertices), another polygonal shape and a circular shape. The shape of a display area DPA of the display device 10 may also be similar to the overall shape of the display device 10. FIG. 1 illustrates the display device 10 having a rectangular shape elongated in a second direction DR2.

The display device 10 may include the display area DPA and a non-display area NDA around the edge or periphery of the display area. The display area DPA is an area where an image can be displayed, and the non-display area NDA is an area where no image is displayed. The display area DPA may also be referred to as an active region, and the non-display area NDA may also be referred to as a non-active region. The display area DPA may substantially occupy the center (or the central region) of the display device 10.

The display area DPA may include a plurality of pixels PX. The plurality of pixels PX may be arranged in a matrix. For example, the plurality of pixels may be arranged along rows and columns of a matrix. The shape of each pixel PX may be a rectangular or square shape in a plan view. However, the present disclosure is not limited thereto, and it may be a rhombic shape in which each side is inclined with respect to one direction. The pixels PX may be arranged in a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. In addition, each of the pixels PX may include one or more light emitting elements that emit light of a specific wavelength band to display a specific color.

The non-display area NDA may be disposed around the edge or periphery of the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

Figure 2:
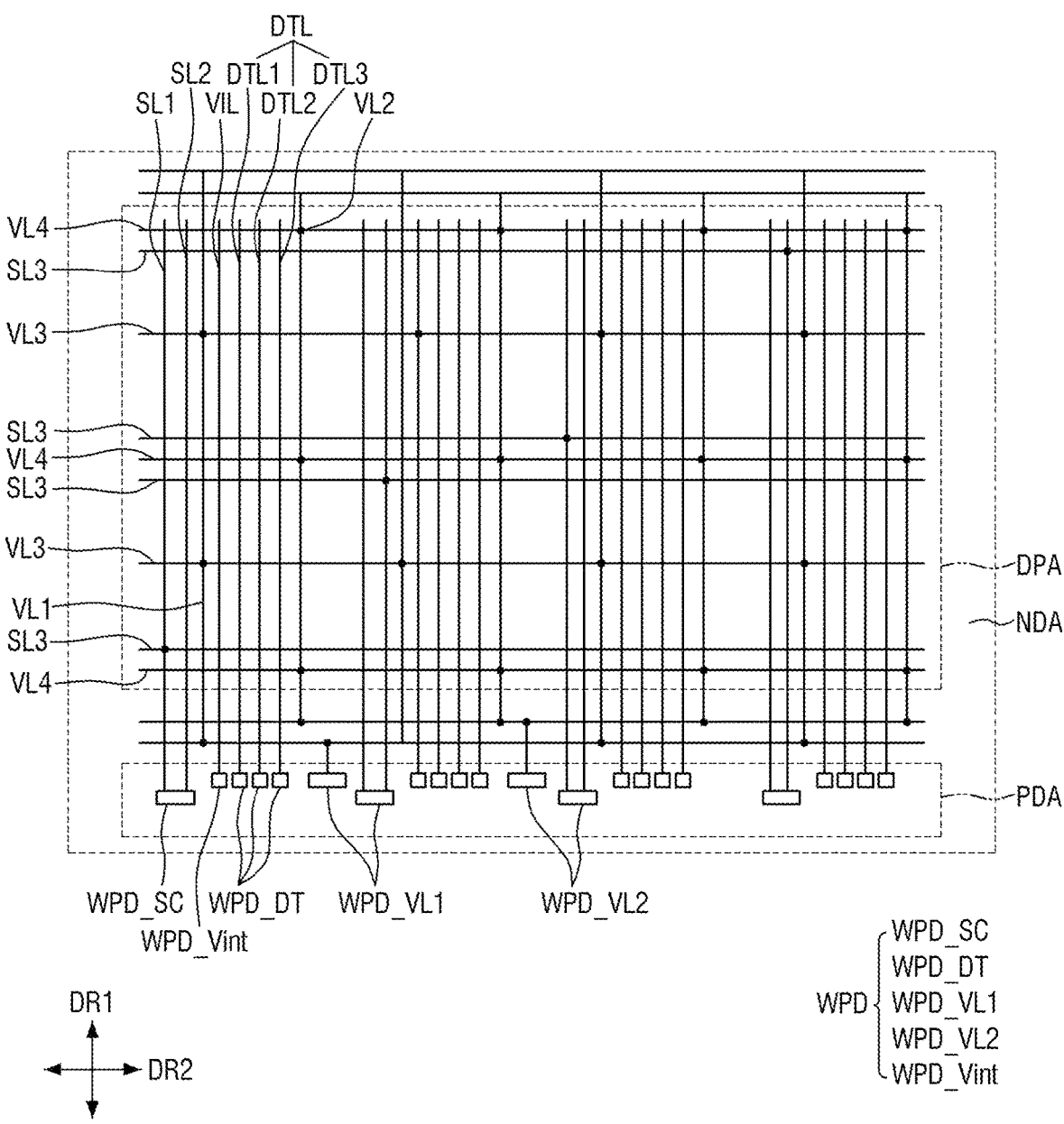
FIG. 2 is a schematic layout view illustrating a plurality of wires of a display device according to one or more embodiments.

FIG. 2 is a schematic layout view illustrating a plurality of wires of a display device according to one or more embodiments.

Referring to FIG. 2, the display device 10 may include a plurality of wires. The display device 10 may include a plurality of scan lines SL (SL1, SL2, and SL3), a plurality of data lines DTL (DTL1, DTL2, and DTL3), an initialization voltage line VIL, and a plurality of voltage lines VL (VL1, VL2, VL3, and VL4). In one or more embodiments, other wires may be further provided in the display device 10. The plurality of wires may include wires formed of a first conductive layer and extending in a first direction DR1, and wires formed of a third conductive layer and extending in the second direction DR2.

The first scan line SL1 and the second scan line SL2 may be disposed to extend in the first direction DR1. The first scan line SL1 and the second scan line SL2 may be disposed adjacent to each other, and may be disposed to be spaced from the different first scan line SL1 and second scan line SL2 in the second direction DR2. The first scan line SL1 and the second scan line SL2 may be connected to a scan line pad WPD_SC connected to a scan driver. The first scan line SL1 and the second scan line SL2 may be disposed to extend from the pad area PDA disposed in the non-display area NDA to the display area DPA.

The third scan line SL3 may be disposed to extend in the second direction DR2, and may be disposed to be spaced from the other third scan line SL3 in the first direction DR1. One third scan line SL3 may be connected to one or more first scan lines SL1 or one or more second scan lines SL2. The plurality of scan lines SL may have a mesh structure in the entire surface of the display area DPA, but is not limited thereto.

Meanwhile, the term "connected" as used herein may mean not only that one member is connected to another member through a physical contact, but also that one member is connected to another member through yet another member. This may also be understood as one part and the other part as integral elements are connected into an integrated element via another element. Furthermore, if one element is connected to another element, this may be construed as a meaning including an electrical connection via another element in addition to a direct connection in physical contact.

The data line DTL may be disposed to extend in the first direction DR1. The data line DTL includes a first data line DTL1, a second data line DTL2, and a third data line DTL3, and each one of the first to third data lines DTL1, DTL2, and DTL3 forms a pair and is disposed adjacent to each other. Each of the data lines DTL1, DTL2, and DTL3 may be disposed to extend from the pad WPD_DT in the pad area PDA disposed in the non-display area NDA to the display area DPA.

The initialization voltage line VIL may also be disposed to extend in the first direction DR1. The initialization voltage line VIL may be disposed between the data lines DTL and the second scan line SL2. The initialization voltage line VIL may be disposed to extend from the pad WPD_Vint in the pad area PDA disposed in the non-display area NDA to the display area DPA.

The first voltage line VL1 and the second voltage line VL2 are disposed to extend in the first direction DR1, and the third voltage line VL3 and the fourth voltage line VL4 are disposed to extend in the second direction DR2. The first voltage line VL1 and the second voltage line VL2 may be alternately arranged along the second direction DR2, and the third voltage line VL3 and the fourth voltage line VL4 may be alternately arranged along the first direction DR1. The first voltage line VL1 and the second voltage line VL2 may be disposed to extend in the first direction DR1 to cross the display area DPA, and as for the third voltage line VL3 and the fourth voltage line VL4, some of the wires may be disposed in the display area DPA and other wires may be disposed in the non-display area NDA positioned on both sides of the display area DPA in the first direction DR1, respectively. As will be described later, the first voltage line VL1 and the second voltage line VL2 may be formed of the first conductive layer, and the third voltage line VL3 and the fourth voltage line VL4 may be formed of the third conductive layer disposed on a layer different from the first conductive layer. The first voltage line VL1 may be connected to at least one third voltage line VL3, the second voltage line VL2 may be connected to at least one fourth voltage line VL4, and the plurality of voltage lines VL may have a mesh structure in the entire display area DPA.

The first scan line SL1, the second scan line SL2, the data line DTL, the initialization voltage line VIL, the first voltage line VL1, and the second voltage line VL2 may be electrically connected to at least one line pad WPD. Each line pad WPD may be disposed in the non-display area NDA. In one or more embodiments, each of the line pads WPD may be disposed in the pad area PDA positioned on the lower side, which is the other side of the display area DPA in the first direction DR1. The first scan line SL1 and the second scan line SL2 are connected to the scan line pad WPD_SC disposed in the pad area PDA, and the plurality of data lines DTL are connected to the data line pads WPD_DT different from each other, respectively. The initialization voltage line VIL is connected to an initialization line pad WPD_Vint, the first voltage line VL1 is connected to a first voltage line pad WPD_VL1, and the second voltage line VL2 is connected to a second voltage line pad WPD_VL2. The external devices may be mounted on the line pads WPD. The external devices may be mounted on the line pads WPD by applying an anisotropic conductive film, ultrasonic bonding or the like. The drawing exemplifies that each of the line pads WPD is disposed on the pad area PDA disposed on the lower side of the display area DPA, but is not limited thereto. Some of the plurality of line pads WPD may be disposed in any one area on the upper side or on the left and right sides of the display area DPA.

Each pixel PX or sub-pixel SPXn (n being an integer of 1 to 3) of the display device 10 includes a pixel driving circuit. The above-described wires may pass through each pixel PX or the periphery thereof to apply a driving signal to each pixel driving circuit. The pixel driving circuit may include transistors and capacitors. The number of transistors and capacitors of each pixel driving circuit may be variously modified. According to one or more embodiments, in each sub-pixel SPXn of the display device 10, the pixel driving circuit may have a 3T1C structure including three transistors and one capacitor. Hereinafter, the pixel driving circuit of the 3T1C structure will be described as an example, but the present disclosure is not limited thereto, and various other modified structures such as a 2T1C structure, a 7T1C structure, and a 6T1C structure may be applied.

Figure 3A:
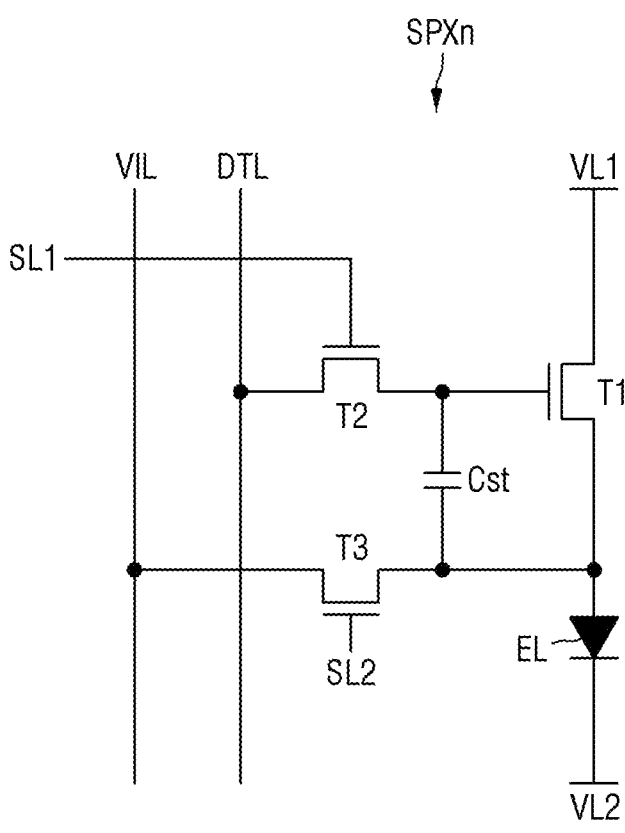
FIGS. 3A and 3B are equivalent circuit diagrams of one sub-pixel according to one or more embodiments.
Figure 3B:
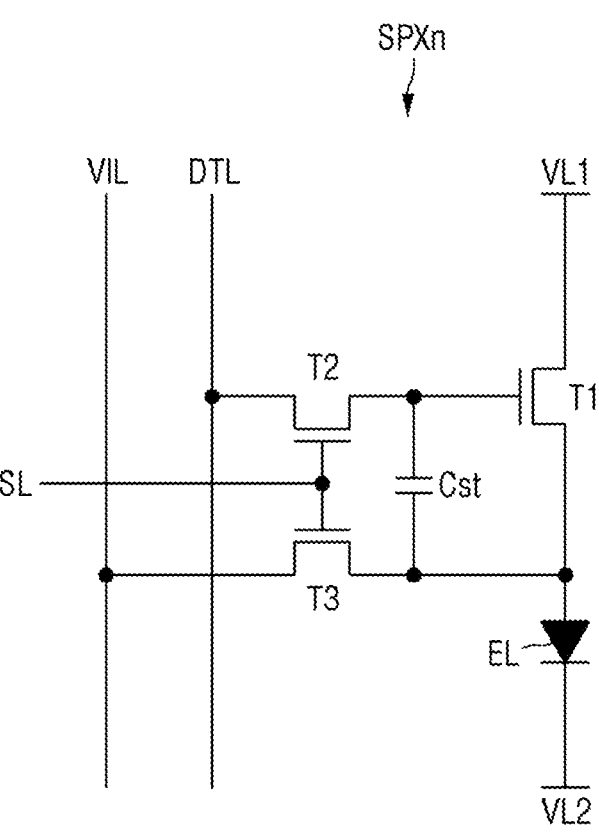

FIGS. 3A and 3B are equivalent circuit diagrams of one sub-pixel according to one embodiment.

Referring to FIGS. 3A and 3B, each sub-pixel SPXn of the display device 10 according to one or more embodiments includes three transistors T1, T2, and T3 and one storage capacitor Cst in addition to a light emitting diode EL.

The light emitting diode EL emits light by a current supplied through a first transistor T1 (e.g., a driving transistor). The light emitting diode EL includes a first electrode, a second electrode, and at least one light emitting element disposed between them. The light emitting element may emit light of a specific wavelength band by electrical signals transmitted from the first electrode and the second electrode.

One end of the light emitting diode EL may be connected to the source electrode of the first transistor T1, and the other end thereof may be connected to the second voltage line VL2 to which a low potential voltage (hereinafter, a second power voltage) lower than a high potential voltage (hereinafter, a first power voltage) of the first voltage line VL1 is supplied.

The first transistor T1 adjusts a current flowing from the first voltage line VL1, to which the first power voltage is supplied, to the light emitting diode EL according to the voltage difference between the gate electrode and the source electrode of the first transistor T1. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage line VL1 to which the first power voltage is applied.

The second transistor T2 (e.g., a switching transistor) is turned on by a scan signal of the scan line SL1 to connect the data line DTL to the gate electrode of the first transistor T1. The gate electrode of the second transistor T2 may be connected to the first scan line SL1, the source electrode thereof may be connected to the gate electrode of the first transistor T1, and the drain electrode thereof may be connected to the data line DTL.

The third transistor T3 is turned on by a scan signal of the scan line SL2 to connect the initialization voltage line VIL to one end of the light emitting diode EL. The gate electrode of the third transistor T3 may be connected to the second scan line SL2, the drain electrode thereof may be connected to the initialization voltage line VIL, and the source electrode thereof may be connected to one end of the light emitting diode EL or to the source electrode of the first transistor T1.

In the embodiment of FIG. 3A, the gate electrode of the second transistor T2 may be connected to the first scan line SL1, and the gate electrode of the third transistor T3 may be connected to the second scan line SL2. The first scan line SL1 and the second scan line SL2 may be different scan lines, and the second transistor T2 and the third transistor T3 may be turned on in response to scan signals applied from different scan lines. However, the present disclosure is not limited thereto.

In the embodiment of FIG. 3B, the gate electrodes of the second transistor T2 and the third transistor T3 may be connected to the same scan line SL. The second transistor T2 and the third transistor T3 may be concurrently (e.g., simultaneously) turned on by a scan signal applied from the same scan line.

In one or more embodiments, the source electrode and the drain electrode of each of the transistors T1, T2, and T3 are not limited to those described above, and vice versa. Further, each of the transistors T1, T2, and T3 may be formed of a thin film transistor. In addition, in FIG. 3, each of the transistors T1, T2, and T3 has been described as being formed of an N-type metal oxide semiconductor field effect transistor (MOSFET), but is not limited thereto. For example, each of the transistors T1, T2, and T3 may be formed of a P-type MOSFET. Alternatively, some of the transistors T1, T2, and T3 may be formed of an N-type MOSFET and the others may be formed of a P-type MOSFET.

The storage capacitor Cst is formed between the gate electrode and the source electrode of the first transistor T1. The storage capacitor Cst stores a difference voltage between a gate voltage and a source voltage of the first transistor T1.

Hereinafter, a structure of one pixel PX of the display device 10 according to one or more embodiments will be described in detail with further reference to other drawings.

Figure 4:
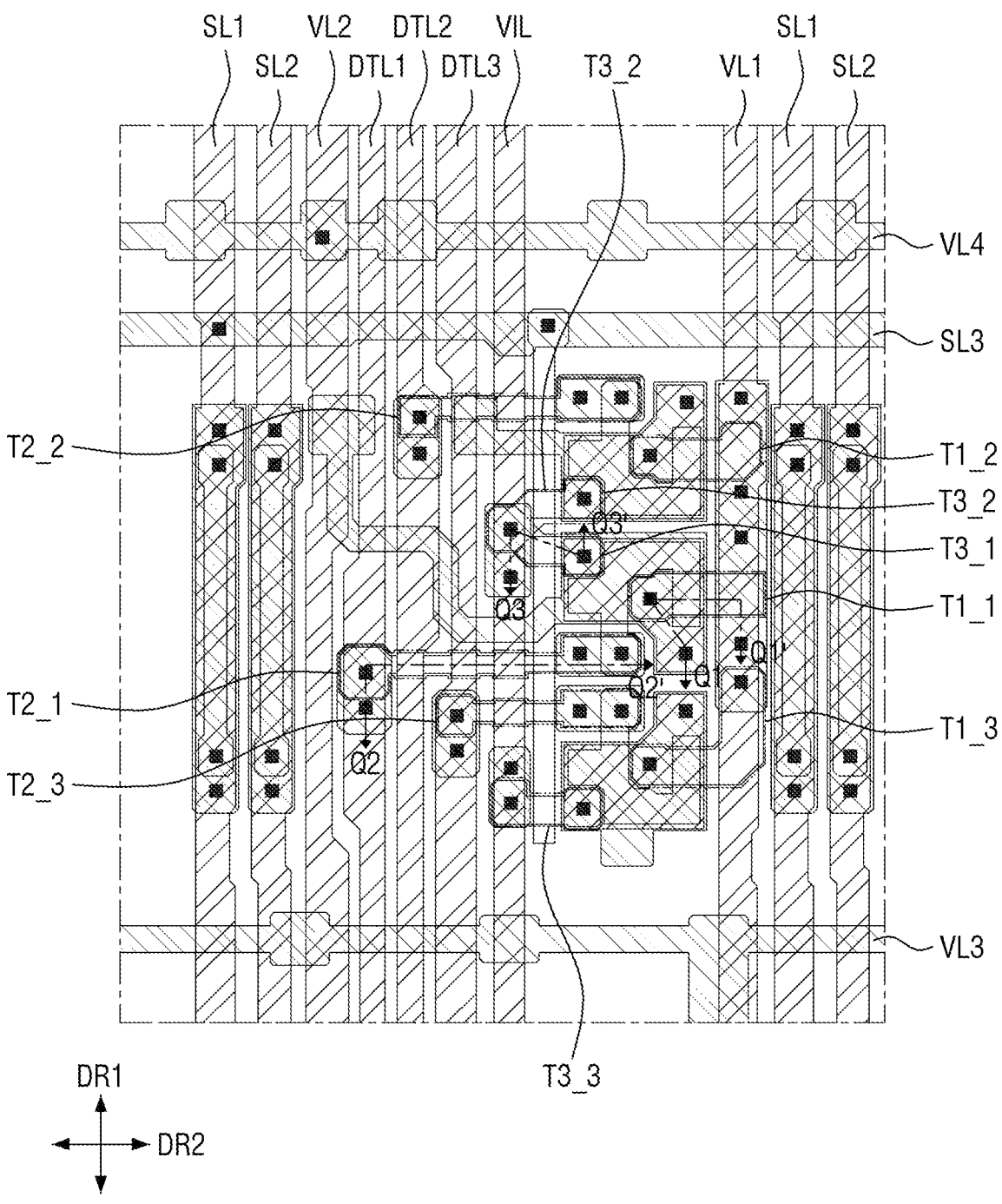
FIG. 4 is a layout diagram illustrating a plurality of wires disposed in a display device according to one or more embodiments.
Figure 5:
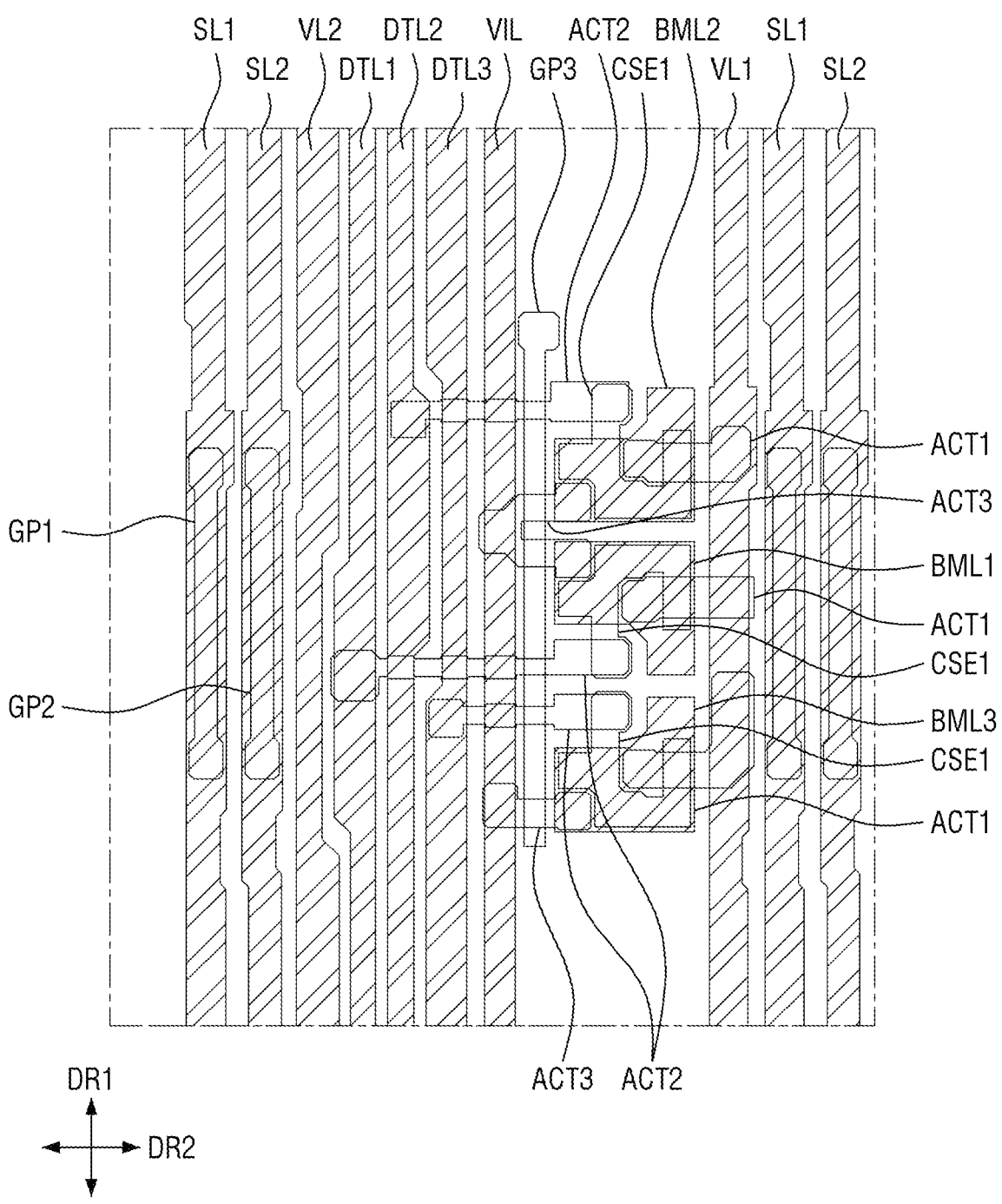
FIGS. 5 and 6 are layout views illustrating some wires of the plurality of wires of FIG. 4 that are distinguished.
Figure 6:
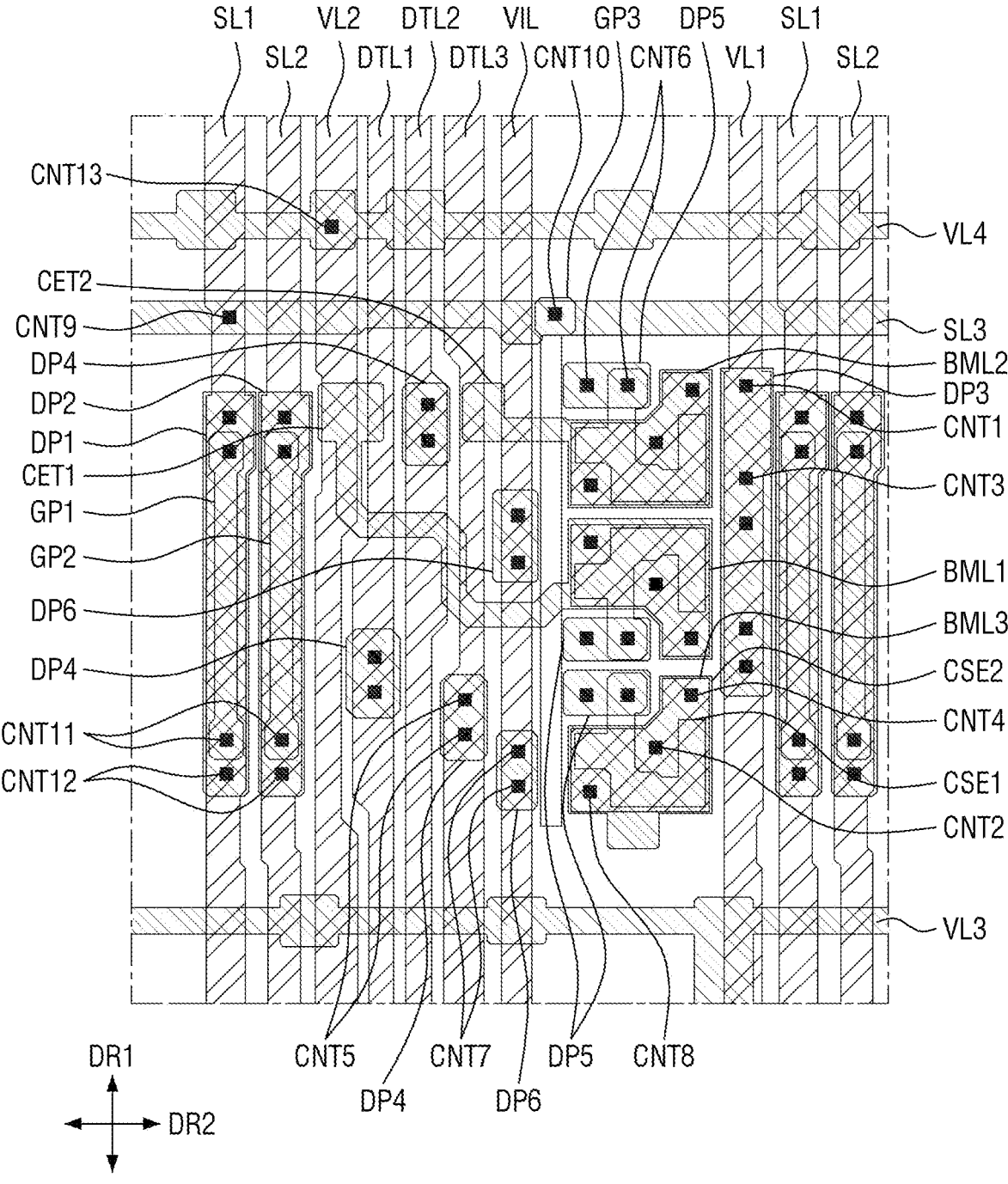
Figure 7:
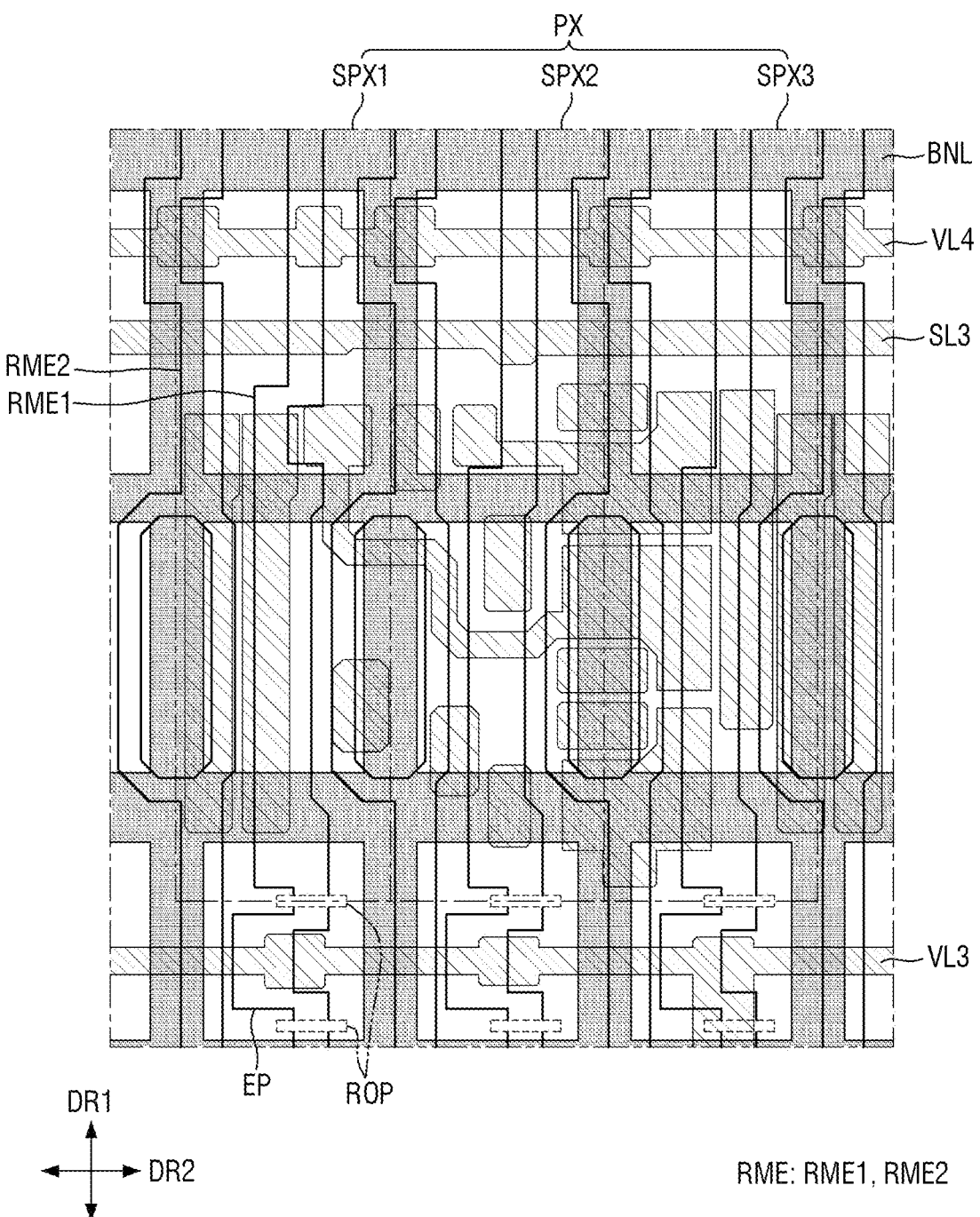
FIG. 7 is a plan view illustrating the arrangement of some of the plurality of wires of FIG. 4 and electrodes disposed in one pixel.
Figure 8:
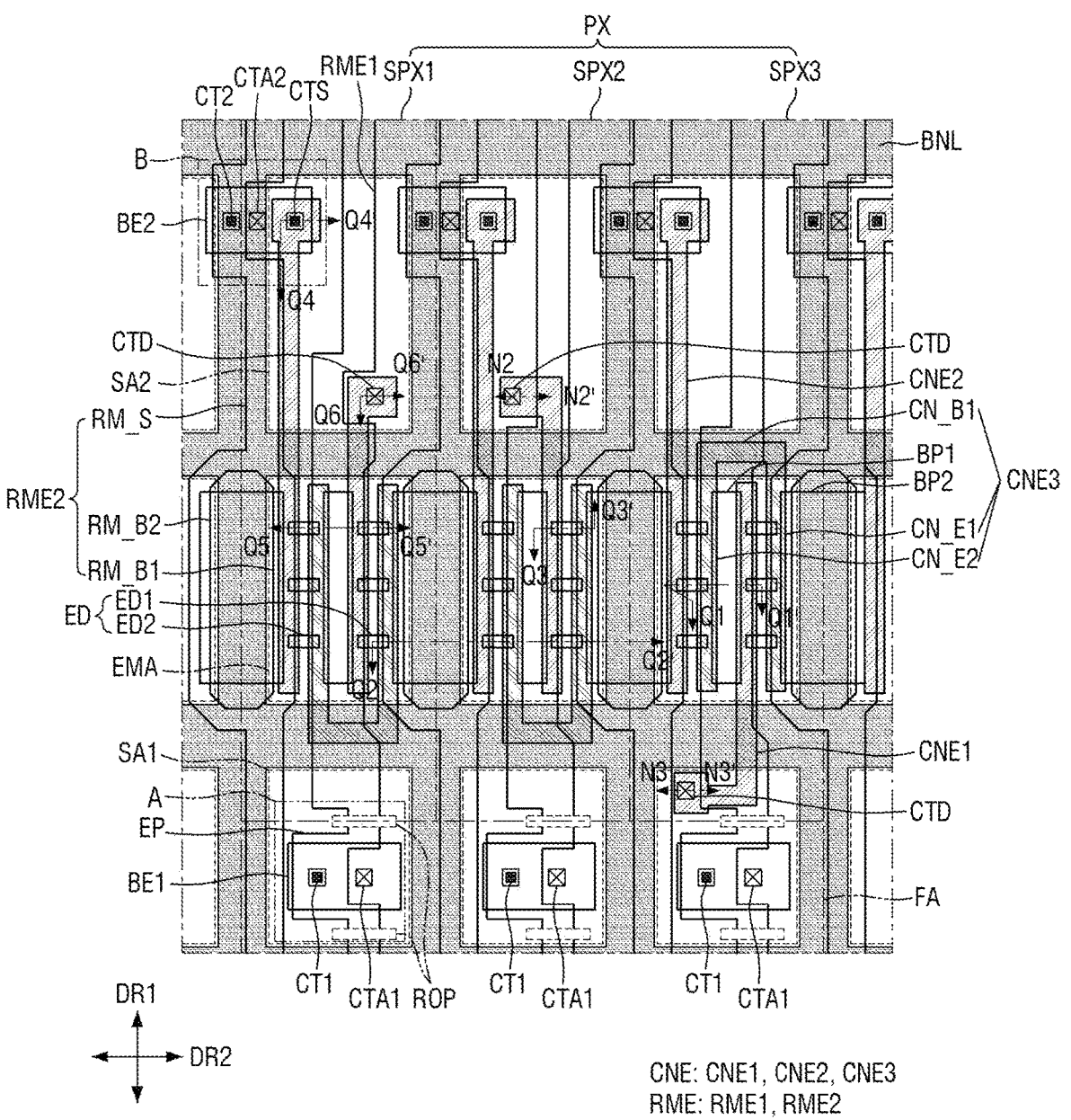
FIG. 8 is a schematic plan view illustrating a plurality of electrodes and a bank layer included in one pixel of a display device according to one or more embodiments.
Figure 9:
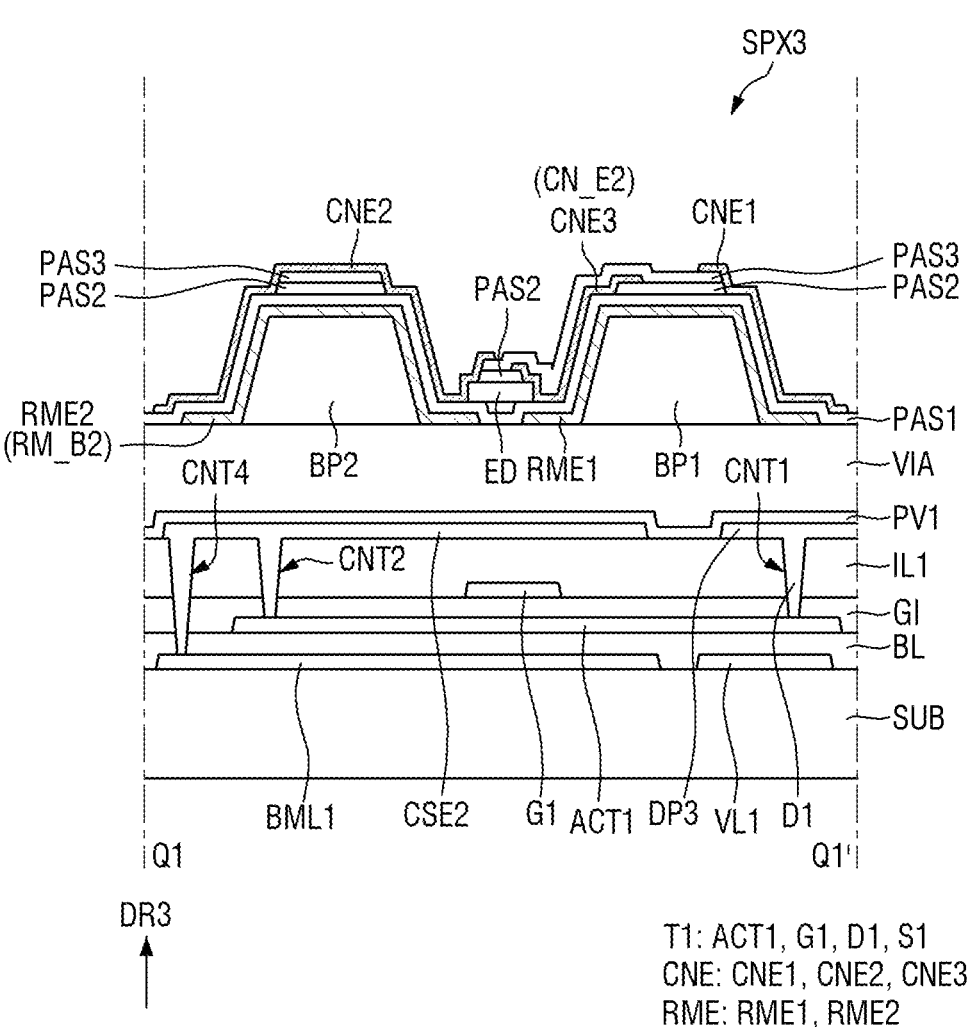
FIG. 9 is a cross-sectional view taken along the line Q1-Q1' of FIGS. 4 and 8.
Figure 10:
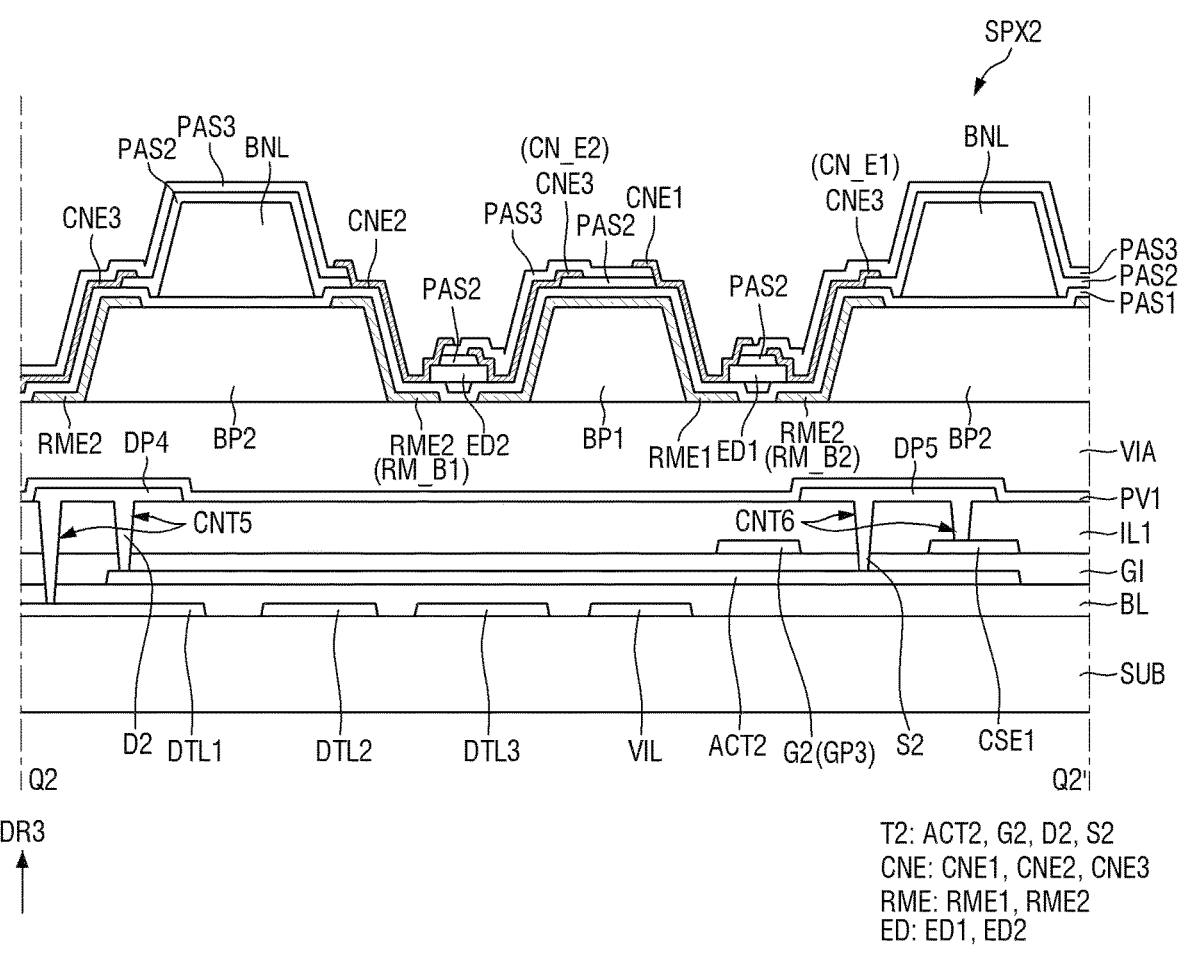
FIG. 10 is a cross-sectional view taken along the line Q2-Q2' of FIGS. 4 and 8.
Figure 11:
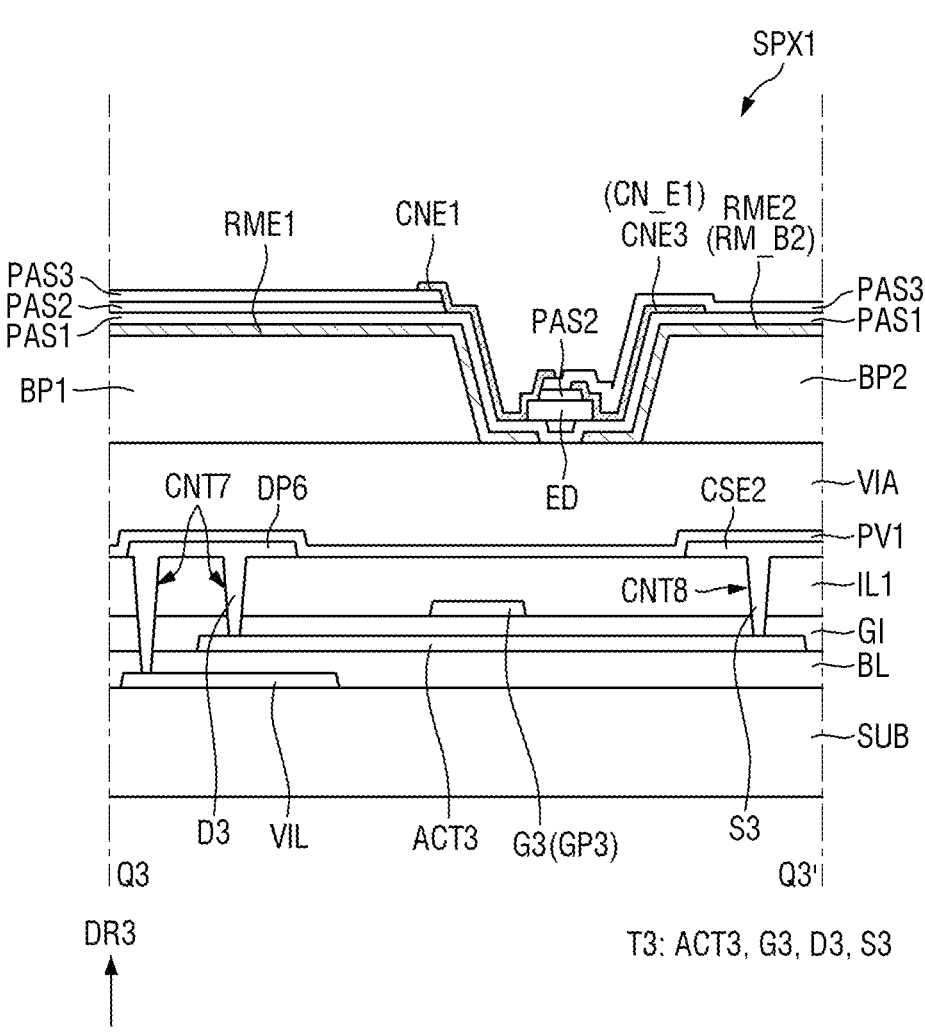
FIG. 11 is a cross-sectional view taken along the line Q3-Q3' of FIGS. 4 and 8.
Figure 12:
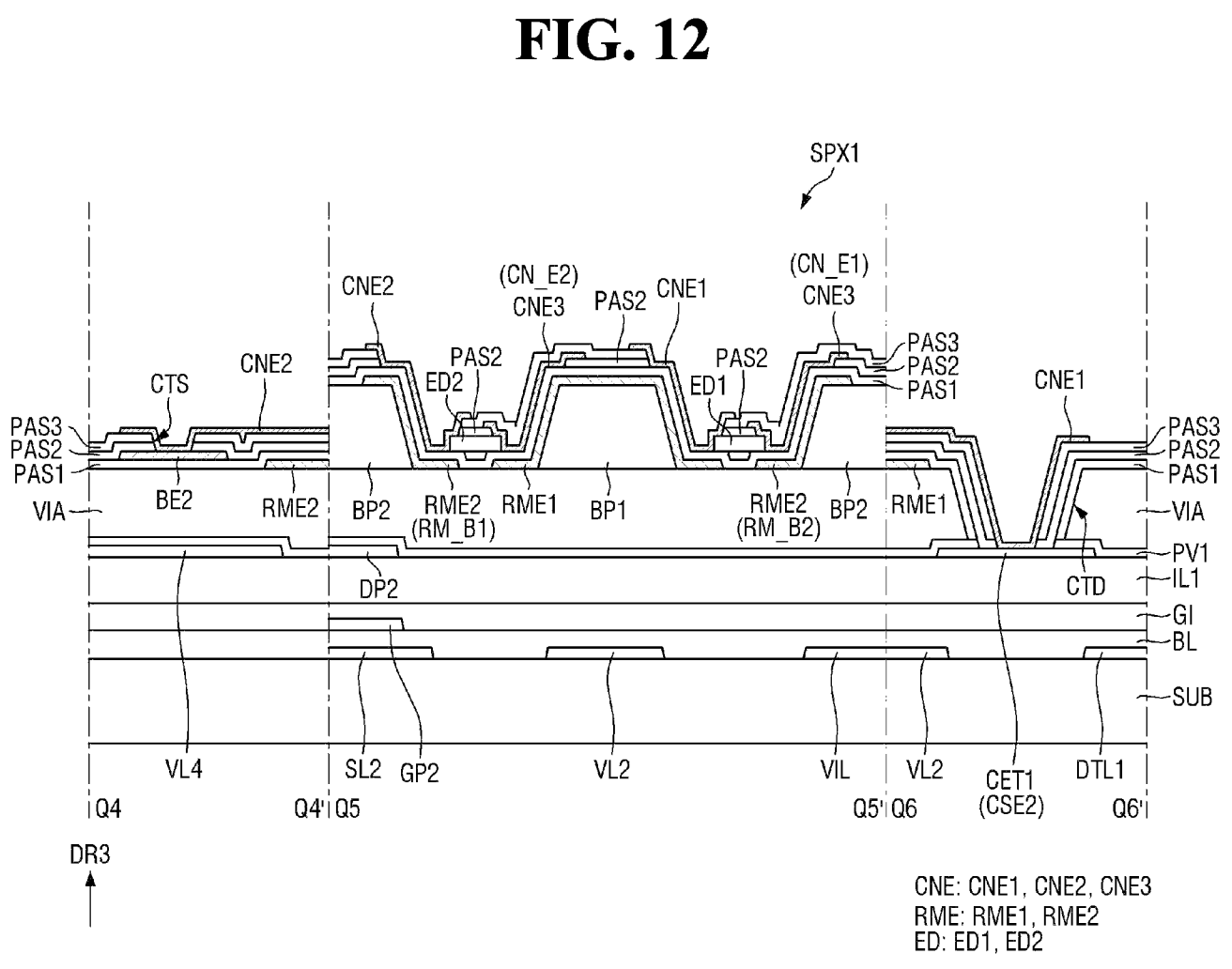

FIG. 4 is a layout diagram illustrating a plurality of wires disposed in a display device according to one or more embodiments. FIGS. 5 and 6 are layout views illustrating some wires of the plurality of wires of FIG. 4 that are distinguished from each other. FIG. 7 is a plan view illustrating the arrangement of some of the plurality of wires of FIG. 4 and electrodes disposed in one pixel. FIG. 8 is a schematic plan view illustrating a plurality of electrodes and a bank layer included in one pixel of a display device according to one embodiment. FIG. 9 is a cross-sectional view taken along the line Q1-Q1' of FIGS. 4 and 8. FIG. 10 is a cross-sectional view taken along the line Q2-Q2' of FIGS. 4 and 8. FIG. 11 is a cross-sectional view taken along the line Q3-Q3' of FIGS. 4 and 8. FIG. 12 is a cross-sectional view taken along the lines Q4-Q4', Q5-Q5', and Q6-Q6' of FIG. 8.

FIG. 4 is a layout diagram illustrating a plurality of wires, i.e., wires of the first conductive layer, a second conductive layer, and the third conductive layer, and active layers of a semiconductor layer, disposed in one pixel PX of the display device 10. FIG. 5 illustrates the first conductive layer, the semiconductor layer, and the second conductive layer together, and FIG. 6 illustrates only the first conductive layer, the second conductive layer, and the third conductive layer. FIG. 7 illustrates the arrangement of the third conductive layer, electrodes RME disposed thereon, and a bank layer BNL. FIG. 8 illustrates the arrangement of the plurality of electrodes RME, the bank layer BNL, and light emitting elements ED disposed on the plurality of wires. FIG. 9 illustrates a cross section of the first transistor T1 connected to a first sub-pixel SPX1 of one pixel PX. FIGS. 10 and 11 illustrate cross sections of the second transistor T2 and the third transistor T3 connected to the first sub-pixel SPX1, respectively. FIG. 12 illustrates a cross section traversing both ends of the light emitting elements ED (ED1 and ED2) disposed in the first sub-pixel SPX1 and cross sections traversing electrode contact holes CTD and CTS.

Referring to FIGS. 4 to 12, each of the pixels PX of the display device 10 may include a plurality of sub-pixels SPXn (where n is 1 to 3). For example, one pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the present disclosure is not limited thereto, and the sub-pixels SPXn may emit light of the same color. In one or more embodiments, each of the sub-pixels SPXn may emit blue light. In addition, although it is illustrated in the drawing that one pixel PX includes three sub-pixels SPXn, the present disclosure is not limited thereto, and the pixel PX may include a larger number of sub-pixels SPXn.

Each sub-pixel SPXn of the display device 10 may include an emission area EMA and a non-emission area. The emission area EMA may be an area in which the light emitting element ED is disposed to emit light of a specific wavelength band. The non-emission area may be a region in which the light emitting element ED is not disposed and a region from which light is not emitted because light emitted from the light emitting element ED does not reach it.

The emission area may include an area in which the light emitting element ED is disposed, and an area adjacent to the light emitting element ED to emit light emitted from the light emitting element ED. Without being limited thereto, the emission area EMA may also include an area in which light emitted from the light emitting element ED is reflected or refracted by another member and emitted. The plurality of light emitting elements ED may be disposed in each sub-pixel SPXn, and the emission area may be formed to include an area where the light emitting elements ED are disposed and an area adjacent thereto.

Although it is shown in the drawing that the sub-pixels SPXn have the emission areas EMA that are substantially identical in size, the present disclosure is not limited thereto. In someone or more embodiments, the emission areas EMA of the sub-pixels SPXn may have different sizes according to a color or wavelength band of light emitted from the light emitting element ED disposed in each sub-pixel.

In addition, each sub-pixel SPXn may further include sub-regions SA1 and SA2 disposed in the non-emission area. The sub-regions SA1 and SA2 may include a first sub-region SA1 disposed to the lower side, which is the other side in the first direction DR1, of the emission area EMA, and a second sub-region SA2 disposed to the upper side, which is one side in the first direction DR1, of the emission area EMA. The emission area EMA and the sub-regions SA1 and SA2 may be alternately arranged along the first direction DR1, and the first sub-region SA1 or the second sub-region SA2 may be disposed between different emission areas EMA that are spaced in the first direction DR1. In addition, the emission area EMA, the first sub-region SA1, and the second sub-region SA2 may each be repeatedly arranged along the first direction DR1. The first sub-region SA1 and the second sub-region SA2 may be divided according to the arrangement of bridge electrodes BE1 and BE2, which will be described later, and the voltage lines VL3 and VL4 of the third conductive layer. However, the present disclosure is not limited thereto, and the emission areas EMA and the sub-regions SA1 and SA2 in the plurality of pixels PX may have a different arrangement from that of FIG. 8.

The bank layer BNL may be disposed between the sub-regions SA1 and SA2 and the emission areas EMA, and a distance therebetween may vary depending on the width of the bank layer BNL. In the sub-regions SA1 and SA2, the light emitting element ED is not disposed, so that light is not emitted therefrom, but a part of the electrode RME disposed in each sub-pixel SPXn may be disposed. The first electrode RME1 disposed in different sub-pixels SPXn may be separated at a separation portion ROP of the sub-regions SA1 and SA2.

Each of the wires and the circuit elements of a circuit layer disposed on each pixel PX and connected to the light emitting diode EL may be connected to the first to third sub-pixels SPX1, SPX2, and SPX3. However, the wires and the circuit elements may not be disposed to correspond to the area occupied by each sub-pixel SPXn or the emission area EMA, and may be disposed regardless of the position of the emission area EMA within one pixel PX.

In one pixel PX, a circuit layer connected to the first to third sub-pixels SPX1, SPX2, and SPX3 is disposed in a specific pattern, and the patterns may be repeatedly arranged in units of one pixel PX, not the sub-pixel SPXn. The sub-pixels SPXn disposed in one pixel PX are areas divided based on the emission area EMA and the sub-regions SA1 and SA2, and a circuit layer connected thereto may be disposed regardless of the area of the sub-pixel SPXn. In the display device 10, the elements and wires of the circuit layer may be arranged on a basis of a unit pixel PX instead of the sub-pixel SPXn, thereby reducing or minimizing the area occupied by the elements and wires connected to each sub-pixel SPXn.

When the plurality of layers on one pixel PX of the display device 10 are specifically described, the display device 10 may include a first substrate SUB, and a semiconductor layer, a plurality of conductive layers, and a plurality of insulating layers that are disposed on the first substrate SUB. The semiconductor layer, the conductive layers, and the insulating layers may each constitute a circuit layer and a display element layer of the display device 10.

For example, the first substrate SUB may be an insulating substrate. The first substrate SUB may be made of an insulating material such as glass, quartz, or polymer resin. Further, the first substrate SUB may be a rigid substrate, but may also be a flexible substrate which can be bent, folded or rolled. The first substrate SUB may include the display area DPA and the non-display area NDA around (e.g., surrounding) the display area DPA, and the display area DPA may include the emission area EMA and the sub-regions SA1 and SA2 that are part of the non-emission area.

A first conductive layer may be disposed on the first substrate SUB. The first conductive layer includes the first scan line SL1 and the second scan line SL2 extending in the first direction DR1, the plurality of data lines DTL (DTL1, DTL2, and DTL3), the first voltage line VL1, the second voltage line VL2, the initialization voltage line VIL, and a plurality of lower metal layers BML1, BML2, and BML3.

The plurality of scan lines SL1 and SL2 are disposed to extend in the first direction DR1. The first scan line SL1 and the second scan line SL2 may be disposed in one pixel PX, and each of the scan lines SL1 and SL2 may be disposed over the plurality of pixels PX arranged along the first direction DR1. The first scan line SL1 and the second scan line SL2 may be spaced from each other in the second direction DR2 but disposed adjacent to each other. Any one scan line of the first scan line SL1 and the second scan line SL2 may be connected to one pixel PX, and the scan line connected to one pixel PX may be connected to each of the first to third sub-pixels SPX1, SPX2, and SPX3. The scan lines SL1 and SL2 may be connected to the second transistor ('T2' in FIG. 4) and the third transistor ('T3' in FIG. 4) through a conductive pattern disposed on a different conductive layer, and a scan signal may be applied to the second transistor T2 and the third transistor T3.

As described above, the first scan line SL1 and the second scan line SL2 may not be disposed to correspond to each area occupied by the first to third sub-pixels SPX1, SPX2, and SPX3, and may be disposed in a specific position within one pixel PX. In one or more embodiments, the first scan line SL1 and the second scan line SL2 may be disposed on the left side, which is the other side in the second direction DR2, of the center of the pixel PX, and may be disposed on the area occupied by the first sub-pixel SPX1 and the left side of the first sub-pixel SPX1 in a plan view.

Among the scan lines SL1 and SL2 shown in FIGS. 4 and 5, the scan lines SL1 and SL2 disposed on the left side may be connected to the sub-pixels SPXn of a corresponding pixel PX, and the scan lines SL1 and SL2 disposed on the right side may be connected to another pixel PX adjacent to the right side of the corresponding pixel PX. It may be understood that the wires illustrated in FIGS. 4 to 6 are the wires connected to a corresponding pixel PX shown in FIGS. 7 and 8 and the scan lines SL1 and SL2 connected to another pixel PX adjacent to the corresponding pixel PX.

The plurality of sub-pixels SPXn belonging to one pixel PX may be distinguished according to whether the scan lines SL1 and SL2 are disposed. For example, the first sub-pixel SPX1 may be a sub-pixel adjacent to the scan lines SL1 and SL2, and the second sub-pixel SPX2 and the third sub-pixel SPX3 may not be such a sub-pixel. Because the wires connected to each sub-pixel SPXn are disposed in a specific pattern with one pixel PX as a repeating unit regardless of the area occupied by each sub-pixel SPXn, the sub-pixels SPXn belonging to one pixel PX may have different patterns in the lower conductive layer.

The plurality of data lines DTL1, DTL2, and DTL3 are disposed to extend in the first direction DR1. The first data line DTL1, the second data line DTL2, and the third data line DTL3 are disposed in one pixel PX, and each of the data lines DTL1, DTL2, and DTL3 may be disposed over the plurality of pixels PX arranged along the first direction DR1. The first data line DTL1, the second data line DTL2, and the third data line DTL3 may be spaced from each other in the second direction DR2 but disposed adjacent to each other. The first data line DTL1, the second data line DTL2, and the third data line DTL3 may be sequentially arranged along the second direction DR2, and may each be connected to the first sub-pixel SPX1, the second sub-pixel SPX2, and the third sub-pixel SPX3. Each of the data lines DTL1, DTL2, and DTL3 may be connected to a second transistor ('T2' in FIG. 4) through a conductive pattern disposed on a different conductive layer to apply a data signal to the second transistor T2.

As described above, the first to third data lines DTL1, DTL2, and DTL3 may not be disposed to correspond to each area occupied by the first to third sub-pixels SPX1, SPX2, and SPX3, and may be disposed in a specific position within one pixel PX. In the drawings, it is exemplified that the first to third data lines DTL1, DTL2, and DTL3 are disposed between the first sub-pixel SPX1 and the second sub-pixel SPX2 in one pixel PX, but the present disclosure is not limited thereto.

The initialization voltage line VIL extends in the first direction DR1 and is disposed across the plurality of pixels PX arranged along the first direction DR1. The initialization voltage line VIL may be disposed to the right side of the third data line DTL3 in a plan view and between the third data line DTL3 and the lower metal layers BML1, BML2, and BML3, but is not limited thereto. The initialization voltage line VIL may be connected to a conductive pattern disposed on a different conductive layer to be connected to each of the sub-pixels SPXn. The initialization voltage line VIL may be electrically connected to the drain electrode of the third transistor ('T3' in FIG. 4) and may apply an initialization voltage to the third transistor T3.

The first voltage line VL1 and the second voltage line VL2 may be disposed to extend in the first direction DR1, and each of them may be disposed across the plurality of pixels PX arranged along the first direction DR1. The first voltage line VL1 may be disposed to the right side of the plurality of lower metal layers BML1, BML2, and BML3, and the second voltage line VL2 may be disposed between the first data line DTL1 and the second scan line SL2. Each of the first voltage line VL1 and the second voltage line VL2 may be connected to the plurality of sub-pixels SPXn belonging to one pixel PX. The first voltage line VL1 may be electrically connected to the first electrode RME1 of each sub-pixel SPXn through the first transistor T1 (see FIG. 4), and the second voltage line VL2 may be electrically connected to the second electrode RME2 through the fourth voltage line VL4 disposed in a different conductive layer. The first voltage line VL1 and the second voltage line VL2 may transmit the power voltage applied from the voltage line pads WPD_VL1 and WPD_VL2 to the electrodes RME1 and RME2 disposed in each sub-pixel SPXn, respectively. The first voltage line VL1 may be applied with a high potential voltage (or a first power voltage) transmitted to a first electrode RME1, and the second voltage line VL2 may be applied with a low potential voltage (or a second power voltage) transmitted to a second electrode RME2.

The plurality of lower metal layers BML1, BML2, and BML3 may be disposed between the first voltage line VL1 and the initialization voltage line VIL. Each of the lower metal layers BML1, BML2, and BML3 is disposed to overlap a first capacitance electrode CSE1 of the second conductive layer and a first active layer ACT1 of the semiconductor layer, which will be described later. The first lower metal layer BML1 is disposed to partially overlap the first active layer ACT1 of the first transistor T1_1 connected to the first sub-pixel SPX1. The second lower metal layer BML2 is disposed to partially overlap the first active layer ACT1 of the first transistor T1_2 connected to the second sub-pixel SPX2, and the third lower metal layer BML3 is disposed to partially overlap the first active layer ACT1 of the first transistor T1_3 connected to the third sub-pixel SPX3. The first to third lower metal layers BML1, BML2, and BML3 may be disposed to be spaced from each other in the first direction DR1 at the central portion of each pixel PX in a plan view. For example, the first lower metal layer BML1 may be disposed at the central portion of the pixel PX, the second lower metal layer BML2 may be disposed on the upper side, which is one side in the first direction DR1, of the central portion of the pixel PX, and the third lower metal layer BML3 may be disposed on the lower side, which is the other side in the first direction DR1, of the central portion of the pixel PX.

The lower metal layers BML1, BML2, and BML3 may include a light blocking material to prevent light from entering the first active layer ACT1 of the first transistor T1. For example, the lower metal layers BML1, BML2, and BML3 may be formed of an opaque metal material that blocks light transmission. However, the present disclosure is not limited thereto, and in some cases, the lower metal layers BML1, BML2, and BML3 may be omitted, and may be disposed to overlap the active layers of the other transistors T1, T2, and T3.

A buffer layer BL may be disposed on the first conductive layer and the first substrate SUB. The buffer layer BL may be formed on the first substrate SUB to protect the transistors of the pixel PX from moisture permeating through the first substrate SUB susceptible to moisture permeation, and may perform a surface planarization function.

The semiconductor layer is disposed on the buffer layer BL. The semiconductor layer may include active layers ACT1, ACT2, and ACT3 of the transistors T1, T2, and T3.

The semiconductor layer may include polycrystalline silicon, monocrystalline silicon, oxide semiconductor, and the like. In one or more embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

The plurality of first active layers ACT1 of the first transistors T1_1, T1_2, and T1_3 connected to each of the sub-pixels SPX1, SPX2, and SPX3 may be disposed on the right side of the center of each pixel PX. The first active layers ACT1 may be disposed in an area generally occupied by the third sub-pixel SPX3. The first active layers ACT1 may be disposed to be spaced from each other in the first direction DR1, and may be disposed to partially overlap the lower metal layers BML1, BML2, and BML3, the first capacitance electrode CSE1 of the second conductive layer, and a third conductive pattern DP3 and a second capacitance electrode CSE2 of the third conductive layer. For example, each first active layer ACT1 may include a first area overlapping the third conductive pattern DP3, a second area overlapping the first capacitance electrode CSE1, and a third area, which is a portion other than the first area and the second area, overlapping the second capacitance electrode CSE2.

The second active layers ACT2 of second transistors T2_1, T2_2, and T2_3 connected to each of the sub-pixels SPX1, SPX2, and SPX3 may be disposed adjacent to the center of each pixel PX. The second active layer ACT2 may be disposed in an area generally occupied by the second sub-pixel SPX2. The second active layers ACT2 may be disposed to be spaced from each other in the first direction DR1, and may be disposed to partially overlap a third gate pattern GP3 of the second conductive layer, and a fourth conductive pattern DP4 and a fifth conductive pattern DP5 of the third conductive layer. For example, the second active layer ACT2 may include a first area overlapping the fourth conductive pattern DP4, a second area overlapping the third gate pattern GP3, and a third area, which is a portion other than the first area and the second area, overlapping the fifth conductive pattern DP5. The first area of the second active layer ACT2 may be in contact with the fourth conductive pattern DP4, and the third area of the second active layer ACT2 may be in contact with the fifth conductive pattern DP5.

The second active layers ACT2 of the second transistors T2 may have lengths different from each other according to the disposition of the data lines DTL1, DTL2, and DTL3. For example, the third data line DTL3, the second data line DTL2, and the first data line DTL1 may be sequentially disposed along the second direction DR2 from the areas in which the second active layers ACT2 are disposed. The second active layer ACT2 of the second transistor T2_1 connected to the first sub-pixel SPX1 may have the longest length measured in the second direction DR2 as the first data line DTL1 is located farthest from the central region of the pixel, and the second active layer ACT2 of the third transistor T2_3 connected to the third sub-pixel SPX3 may have the shortest length measured in the second direction DR2 as the third data line DTL3 is located closest to the central region of the pixel. However, the relationship between the lengths of the second active layers ACT2 may vary according to the location of the sub-pixels SPXn and the location of the data lines DTL.

The third active layers ACT3 of the third transistors T3_1, T3_2, and T3_3 connected to each of the sub-pixels SPX1, SPX2, and SPX3 may also be disposed at the center of the pixel PX. The third active layers ACT3 may also be disposed in an area occupied by the second sub-pixel SPX2. The third active layers ACT3 may be spaced from each other along the first direction DR1, and may be disposed side by side with the second active layers ACT2 in the first direction DR1. The third active layers ACT3 may be disposed to partially overlap the third gate pattern GP3 of the second conductive layer, and a sixth conductive pattern DP6 and the second capacitance electrodes CSE2 of the third conductive layer. For example, the third active layer ACT3 may include a first area overlapping the sixth conductive pattern DP6, a second area overlapping the third gate pattern GP3, and a third area, which is a portion other than the first area and the second area, overlapping the second capacitance electrode CSE2. The first area of the third active layer ACT3 may be in contact with the sixth conductive pattern DP6, and the third area may be in contact with the second capacitance electrode CSE2.

Meanwhile, the third active layer ACT3 of the third transistors T3_1 and T3_2 connected to the first sub-pixel SPX1 and the second sub-pixel SPX2 is such that the first areas, which overlap the sixth conductive pattern DP6, may be integrated with each other. Because the third transistors T3 of each of the sub-pixels SPXn may be turned on at the same time, the third active layers ACT3 of transistors different from each other may be partially integrated with each other.

The first gate insulating layer GI is disposed on the semiconductor layer and the buffer layer BL. The first gate insulating layer GI may serve as a gate insulating film of the first transistor T1.

The second conductive layer is disposed on the first gate insulating layer GI. The second conductive layer may include a plurality of gate patterns GP1, GP2, and GP3, and the first capacitance electrode CSE1.

The first gate pattern GP1 and the second gate pattern GP2 may have a shape extending in the first direction DR1 and may be disposed on the left side of each pixel PX. The first gate pattern GP1 and the second gate pattern GP2 may be disposed to overlap the first scan line SL1 and the second scan line SL2, respectively. The first gate pattern GP1 may be directly connected to the first scan line SL1 through an eleventh contact hole CNT11 penetrating the buffer layer BL and the first gate insulating layer GI, and the second gate pattern GP2 may be directly connected to the second scan line SL2 through the eleventh contact hole CNT11 penetrating the buffer layer BL and the first gate insulating layer GI. Each of the first gate pattern GP1 and the second gate pattern GP2 may prevent the intensity of the scan signal applied from the pad area PDA through the first scan line SL1 and the second scan line SL2, from being lowered depending on the position of the display area DPA. In addition, even if the scan lines SL1 and SL2 are cut off in the middle while extending in the first direction DR1, the scan signal may flow through the first and second gate patterns GP1 and GP2.

The third gate pattern GP3 may have a shape extending in the first direction DR1 and may be disposed at the center of each pixel PX. The third gate pattern GP3 may extend from the upper side of the pixel PX in the first direction DR1 to overlap the plurality of second active layers ACT2 and third active layers ACT3. For example, the third gate pattern GP3 may overlap the second area of the second active layers ACT2 and the second area of the third active layers ACT3. The third gate pattern GP3 may serve as a second gate electrode G2 of the second transistor T2 and a third gate electrode G3 of the third transistor T3. As will be described later, the third gate pattern GP3 may be electrically connected to the first scan line SL1 or the second scan line SL2 through the third scan line SL3, and the scan signal may be transferred to the second transistor T2 and the third transistor T3 through the third gate pattern GP3.

The plurality of first capacitance electrodes CSE1 may be spaced from each other in the first direction DR1 to be disposed between the third gate pattern GP3 and the first voltage line VL1. Each of the first capacitance electrodes CSE1 may partially overlap the lower metal layers BML1, BML2, and BML3, the first active layer ACT1, and the second capacitance electrode CSE2 of the third conductive layer. For example, each of the first capacitance electrodes CSE1 may partially overlap the second area of the first active layer ACT1 and serve as the first gate electrode G1 of the first transistor T1. The first capacitance electrode CSE1 may be connected to the fourth conductive pattern DP4 as described later, and may transfer a data signal applied through the second transistor T2 to the first gate electrode G1 of the first transistor T1. In addition, the first capacitance electrode CSE1 may overlap the second capacitance electrode CSE2 to constitute the storage capacitor Cst.

A first interlayer insulating layer IL1 is disposed on the second conductive layer. The first interlayer insulating layer IL1 may function as an insulating film between the second conductive layer and other layers disposed thereon, and may protect the second conductive layer.

A third conductive layer is disposed on the first interlayer insulating layer IL1. The third conductive layer may include a third scan line SL3, the third voltage line VL3, the fourth voltage line VL4, and a plurality of conductive patterns DP1, DP2, DP3, DP4, DP5, and DP6.

The third scan line SL3 extends in the second direction DR2 and is disposed over the plurality of pixels PX arranged along the second direction DR2. The third scan line SL3 may be disposed on the upper side of each pixel PX in a plan view and may be disposed across the non-emission area of each sub-pixel SPXn. The third scan line SL3 may be connected to the first scan line SL1 or the second scan line SL2 of the first conductive layer. The third scan line SL3 may be connected to the first scan line SL1 or the second scan line SL2 through a ninth contact hole CNT9 penetrating through the buffer layer BL, the first gate insulating layer GI, and the first interlayer insulating layer IL1.

When the third scan line SL3 is connected to the first scan line SL1 disposed in one pixel PX, the corresponding third scan line SL3 may not be connected to the other second scan lines SL2 disposed in the same row as the corresponding pixel PX. The corresponding third scan line SL3 and the other third scan line SL3 that are spaced from each other in the first direction DR1 may be connected to the other scan lines SL1 and SL2 except for the first scan line SL1 disposed in the one pixel PX.

In addition, the third scan line SL3 may be connected to the third gate pattern GP3 of the second conductive layer and may be connected to the second transistor T2 and the third transistor T3. The third scan line SL3 may be connected to the third gate pattern GP3 through a tenth contact hole CNT10 penetrating the first interlayer insulating layer IL1. One third scan line SL3 may be connected to each of the third gate patterns GP3 disposed on the pixels PX in the same row. The third scan line SL3 may transmit a scan signal to the gate electrode of the second transistor T2 and the third transistor T3 through the first scan line SL1 or the second scan line SL2 and the third gate pattern GP3.

The third voltage line VL3 and the fourth voltage line VL4 extend in the second direction DR2 and are disposed over the plurality of pixels PX arranged along the second direction DR2. The third voltage line VL3 may be disposed on the lower side of each pixel PX in a plan view and may be disposed across the non-emission area of each sub-pixel SPXn. The fourth voltage line VL4 may be disposed to the upper side of the third scan line SL3, which is on the upper side of each pixel PX in a plan view. The third voltage line VL3 may be electrically connected to the first voltage line VL1, and the fourth voltage line VL4 may be electrically connected to the second voltage line VL2. The third voltage line VL3 and the fourth voltage line VL4 may be alternately and repeatedly arranged while being spaced from each other in the first direction DR1.

The plurality of voltage lines VL1, VL2, VL3, and VL4 may extend in the first direction DR1 and the second direction DR2 to be disposed in a mesh structure in the entire surface of the display area DPA. The first voltage line VL1 and the second voltage line VL2 may be formed of a first conductive layer and extend in the first direction DR1 to be disposed for each pixel PX, and the third voltage line VL3 and the fourth voltage line VL4 may be formed of the third conductive layer and extend in the second direction DR2 to be disposed in the pixels PXs in rows different from each other, and thus the wires may be disposed in a mesh shape in the entire surface of the display area DPA.

In addition, a plurality of pixel rows may be distinguished from each other according to the relative arrangement of the third voltage line VL3 and the fourth voltage line VL4. For example, as shown in the drawings, when the third voltage line VL3 is disposed on the lower side and the fourth voltage line VL4 is disposed on the upper side in the pixels PX of a certain pixel row, the third voltage line VL3 may be disposed on the upper side and the fourth voltage line VL4 may be disposed on the lower side in pixel rows adjacent in the first direction DR1 to the above pixel row. That is, the third voltage line VL3 and the fourth voltage line VL4 may be disposed between different pixel rows adjacent in the first direction DR1, and the pixels PX of the pixel row adjacent in the first direction DR1 may share the third voltage line VL3 or the fourth voltage line VL4.

Accordingly, the number of wires disposed in the display area DPA may be further reduced, and in a large-area display device, there is an effect of preventing an IR drop of a voltage applied through the voltage line. In addition, in the pixels PX of the pixel row adjacent in the first direction DR1, the relative arrangement of the third voltage line VL3, the fourth voltage line VL4, and the third scan line SL3 may be different, and corresponding thereto, the arrangement of the electrodes RME and the connection electrodes CNE disposed above the third conductive layer may also be different. A detailed description thereof will be given later with reference to other drawings.

In one or more embodiments, in the pixel row where the third voltage line VL3 is disposed on the upper side, the third voltage line VL3 may be integrally connected to the third conductive pattern DP3 connected to the first voltage line VL1, and the third voltage line VL3 may be connected to the first voltage line VL1 through the third conductive pattern DP3. In the pixel row where the fourth voltage line VL4 is disposed on the upper side, the fourth voltage line VL4 may be connected to the second voltage line VL2 through a thirteenth contact hole CNT13 penetrating the buffer layer BL, the first gate insulating layer GI, and the first interlayer insulating layer IL1. In the corresponding pixel row, the third voltage line VL3 may be spaced from the third conductive pattern DP3.

The second capacitance electrodes CSE2 may be spaced from each other in the first direction DR1 to be disposed to overlap the first capacitance electrode CSE1 and the lower metal layers BML1, BML2, and BML3. The second capacitance electrode CSE2 is spaced from the first capacitance electrode CSE1 with the first interlayer insulating layer IL1 interposed therebetween, and the storage capacitor Cst may be formed therebetween. Among the second capacitance electrodes CSE2, the second capacitance electrode CSE2 disposed on the upper side of the pixel PX may form the storage capacitor Cst of the first sub-pixel SPX1, the second capacitance electrode CSE2 disposed on the lower side of the pixel PX may form the storage capacitor Cst of the second sub-pixel SPX2, and the second capacitance electrode CSE2 disposed on the center of the pixel PX may form the storage capacitor Cst of the third sub-pixel SPX3.

The second capacitance electrode CSE2 may be disposed so that a portion thereof overlaps the first active layer ACT1 and the third active layer ACT3. Each second capacitance electrode CSE2 may be connected to the first active layer ACT1 through a second contact hole CNT2 penetrating the first gate insulating layer GI and the first interlayer insulating layer IL1 in a portion overlapping the first active layer ACT1, and may serve as a first source electrode S1 of the first transistor T1. Further, the second capacitance electrode CSE2 may be connected to the lower metal layers BML1, BML2, and BML3 through a fourth contact hole CNT4 penetrating the buffer layer BL, the first gate insulating layer GI, and the first interlayer insulating layer IL1. Furthermore, each of the second capacitance electrodes CSE2 may be connected to the third active layer ACT3 through an eighth contact hole CNT8 penetrating the first gate insulating layer GI and the first interlayer insulating layer IL1 at a portion overlapping the third active layer ACT3, and may serve as a third source electrode S3 of the third transistor T3.

Each of the second capacitance electrodes CSE2 may be connected to the first connection electrode CNE1 disposed on a via layer VIA (e.g., see FIG. 12), which will be described later. The second capacitance electrodes CSE2 forming the storage capacitor Cst of the first sub-pixel SPX1 and the second sub-pixel SPX2 may each be disposed not to overlap an area occupied by the corresponding sub-pixel SPXn in a third direction DR3, which is a thickness direction. The third conductive layer may include a plurality of electrode connection portions CET1 and CET2 connected to any one of the second capacitance electrodes CSE2. The first connection electrode CNE1 disposed in the first sub-pixel SPX1 may be directly connected to the first electrode connection portion CET1 (e.g., FIG. 12), and in one or more embodiments, the second connection electrode CNE2 disposed in the second sub-pixel SPX2 may be directly connected to the second electrode connection portion CET2. On the other hand, the second capacitance electrode CSE2 forming the storage capacitor Cst of the third sub-pixel SPX3 may be disposed to overlap an area occupied by the corresponding sub-pixel SPXn in the third direction DR3, and the first connection electrode CNE1 disposed in the third sub-pixel SPX3 may be directly connected to the second capacitance electrode CSE2 of the third sub-pixel SPX3.

The first conductive pattern DP1 and the second conductive pattern DP2 may have a shape extending in the first direction DR1 and may be disposed on the left side of each pixel PX. The first conductive pattern DP1 may be disposed to overlap the first scan line SL1 and the first gate pattern GP1, and the second conductive pattern DP2 may be disposed to overlap the second scan line SL2 and the second gate pattern GP2. The first conductive pattern DP1 may be directly connected to the first scan line SL1 through a twelfth contact hole CNT12 penetrating the buffer layer BL and the first gate insulating layer GI, and the second conductive pattern DP2 may be directly connected to the second scan line SL2 through the twelfth contact hole CNT12 penetrating the buffer layer BL and the first gate insulating layer GI.

The third conductive pattern DP3 may have a shape extending in the first direction DR1 and may be disposed on the right side of the second capacitance electrodes CSE2. The third conductive pattern DP3 may partially overlap the first voltage line VL1 and the first active layer ACT1, and may be connected to each of them. The third conductive pattern DP3 may be in contact with the first voltage line VL1 through the third contact hole CNT3 penetrating the buffer layer BL, the first gate insulating layer GI, and the first interlayer insulating layer IL1, and may be in contact with the first active layer ACT1 through the first contact hole CNT1 penetrating the first gate insulating layer GI and the first interlayer insulating layer IL1, respectively. The third conductive pattern DP3 may serve as a first drain electrode D1 of the first transistor T1. In addition, as described above, the third conductive pattern DP3 may be connected to the third voltage line VL3, or may be spaced therefrom.

The fourth conductive patterns DP4 may disposed to overlap any one of the second active layer ACT2 and the data lines DTL, and the fifth conductive patterns DP5 may be disposed to overlap the second active layer ACT2 and the first capacitance electrode CSE1. The fourth conductive patterns DP4 may be in contact with the data line DTL through the fifth contact hole CNT5 penetrating the buffer layer BL, the first gate insulating layer GI, and the first interlayer insulating layer IL1, and may be in contact with the second active layer ACT2 through the fifth contact hole CNT5 penetrating the first gate insulating layer GI and the first interlayer insulating layer IL1 (e.g., FIG. 10). The fourth conductive pattern DP4 may serve as the second drain electrode D2 of the second transistor T2. The fifth conductive patterns DP5 may be in contact with the first capacitance electrode CSE1 through a sixth contact hole CNT6 penetrating the first interlayer insulating layer IL1, and may be in contact with the second active layer ACT2 through the sixth contact hole CNT6 penetrating the first gate insulating layer GI and the first interlayer insulating layer IL1. The fifth conductive pattern DP5 may serve as a second source electrode S2 of the second transistor T2.

The sixth conductive patterns DP6 may be disposed to overlap the initialization voltage line VIL and the third active layer ACT3. The sixth conductive patterns DP6 may be in contact with the initialization voltage line VIL through the seventh contact hole CNT7 penetrating the buffer layer BL, the first gate insulating layer GI, and the first interlayer insulating layer IL1, and may be in contact with the third active layer ACT3 through the seventh contact hole CNT7 penetrating the first gate insulating layer GI and the first interlayer insulating layer IL1. The sixth conductive pattern DP6 may serve as a third drain electrode D3 of the third transistor T3.

A first passivation layer PV1 is disposed on the third conductive layer. The first passivation layer PV1 may function as an insulating film between the third conductive layer and other layers disposed thereon, and may protect the third conductive layer.

In the drawing, it is illustrated that the conductive layer below the via layer VIA to be described later is formed of the first to third conductive layers, but the present disclosure is not limited thereto. In one or more embodiments, the display device 10 may further include a fourth conductive layer disposed between the third conductive layer and the via layer VIA, and the fourth conductive layer may include several conductive patterns.

The buffer layer BL, the first gate insulating layer GI, the first interlayer insulating layer IL1, and the first passivation layer PV1 described above may be formed of a plurality of inorganic layers stacked in an alternating manner. For example, the buffer layer BL, the first gate insulating layer GI, the first interlayer insulating layer IL1, and the first passivation layer PV1 may be formed as a double layer formed by stacking, or a multilayer formed by alternately stacking, inorganic layers including at least one of silicon oxide ($SiO_x$), silicon nitride ($SiN_x$), or silicon oxynitride ($SiO_xN_y$). However, the present disclosure is not limited thereto, and the buffer layer BL, the first gate insulating layer GI, and the first interlayer insulating layer IL1 may be formed as a single inorganic layer containing the above-described insulating material. Further, in one or more embodiments, the first interlayer insulating layer IL1 may be made of an organic insulating material such as polyimide (PI) or the like.

The second conductive layer and the third conductive layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. However, the present disclosure is not limited thereto.

A via layer VIA is disposed on the first passivation layer PV1 in the display area DPA. The via layer VIA may include an organic insulating material, for example, an organic insulating material such as polyimide (PI), to perform a surface planarization function.

On the via layer VIA, the plurality of electrodes RME (RME1 and RME2), a plurality of bank patterns BP (BP1 and BP2), the bank layer BNL, the plurality of light emitting elements ED, and the plurality of connection electrodes CNE (CNE1, CNE2, and CNE3) are disposed as a display element layer. Further, a plurality of insulating layers PAS1, PAS2, and PAS3 may be disposed on the via layer VIA.

The bank patterns BP1 and BP2 may be directly disposed on the via layer VIA. The bank patterns BP1 and BP2 may have a suitable width (e.g., a predetermined width) in the second direction DR2 and may have a shape extending in the first direction DR1. The bank patterns BP1 and BP2 may have different widths measured in the second direction DR2, and may be disposed over or within the emission areas EMA of different sub-pixels SPXn. For example, the bank patterns BP1 and BP2 may include the first bank pattern BP1 disposed in the emission area EMA of each sub-pixel SPXn and the second bank pattern BP2 disposed across the emission areas EMA of different sub-pixels SPXn in the second direction DR2.

The first bank pattern BP1 is disposed in the center of the emission areas EMA, and the second bank patterns BP2 are disposed to be spaced from the first bank pattern BP1 interposed therebetween. The first bank pattern BP1 and the second bank pattern BP2 may be alternately disposed along the second direction DR2. The light emitting elements ED may be disposed between the first bank pattern BP1 and the second bank pattern BP2 that are spaced from each other.

The first bank pattern BP1 and the second bank pattern BP2 may have the same length in the first direction DR1, but may have different widths measured in the second direction DR2. In the bank layer BNL, a portion extending in the first direction DR1 may overlap the second bank pattern BP2 in the thickness direction. On the other hand, the extension lengths of the bank patterns BP1 and BP2 in the first direction DR1 may be smaller than the length of the emission area EMA surrounded by the bank layer BNL in the first direction DR1. The bank patterns BP1 and BP2 may be disposed in an island-like pattern on the entire surface of the display area DPA. However, the present disclosure is not limited thereto, and both sides of each of the bank patterns BP1 and BP2 in the first direction DR1 may partially overlap a part of the bank layer BNL extending in the second direction DR2.

The bank patterns BP1 and BP2 may have a structure in which at least a portion thereof protrudes from the top surface of the via layer VIA. The protruding portion of the bank patterns BP1 and BP2 may have an inclined or curved side surface. Unlike the illustrated example in the drawings, the bank patterns BP1 and BP2 may have a shape of a semi-circle or semi-ellipse whose outer surface is curved in cross-sectional view. The bank patterns BP1 and BP2 may include an organic insulating material such as polyimide (PI), but is not limited thereto.

The plurality of electrodes RME have a shape extending in one direction and are disposed for each sub-pixel SPXn. The plurality of electrodes RME may extend in the first direction DR1 to be disposed across the emission area EMA of the sub-pixel SPXn and the sub-regions SA1 and SA2, and may be disposed to be spaced from each other in the second direction DR2. The plurality of electrodes RME include the first electrode RME1 disposed at the central portion of each sub-pixel SPXn and the second electrode RME2 disposed across different sub-pixels SPXn. The first electrode RME1 and the second electrode RME2 may substantially have a shape extending in the first direction DR1, and the portions of the first electrode RME1 and the second electrode RME2 disposed in the emission area EMA may have different shapes.

The first electrode RME1 may be disposed at the center of the sub-pixel SPXn, and the portion of the first electrode RME1 disposed in the emission area EMA may be disposed on the first bank pattern BP1. The first electrode RME1 may extend from the first sub-region SA1 in the first direction DR1 to the first sub-region SA1 of another sub-pixel SPXn. For example, the first electrode RME1 may extend to the upper side, which is one side in the first direction DR1, from the separation portion ROP of the first sub-region SA1, pass through the emission area EMA and the second sub-region SA2, and be disposed up to the first sub-region SA1 of a pixel row adjacent in the first direction DR1. The first electrode RME1 may have a shape in which the width measured in the second direction DR2 changes depending on positions, and at least a portion of the first electrode RME1 disposed on the first bank pattern BP1 in the emission area EMA may have a width greater than that of the first bank pattern BP1. The first electrode RME1 may be disposed to cover both side surfaces of the first bank pattern BP1.

The second electrode RME2 may include a portion extending in the first direction DR1 and portions branched near the emission area EMA. In one or more embodiments, the second electrode RME2 may include an electrode stem portion RM_S extending in the first direction DR1, the plurality of electrode branch portions RM_B1 and RM_B2 branched from the electrode stem portion RM_S to be bent in the second direction DR2 and extending in the first direction DR1 again. The electrode stem portion RM_S may be disposed to overlap the portion of the bank layer BNL extending in the first direction DR1, and may be disposed at one side in the second direction DR2 of the sub-regions SA1 and SA2. The electrode branch portions RM_B1 and RM_B2 may be branched from the electrode stem portion RM_S disposed at the intersection of the portion of the bank layer BNL extending in the first direction DR1 and the portion of the bank layer BNL extending in the second direction DR2, and may be bent toward both sides in the second direction DR2. The electrode branch portions RM_B1 and RM_B2 may be disposed across the emission area EMA in the first direction DR1, and may be bent again to be integrally connected to the electrode stem portion RM_S. That is, the electrode branch portions RM_B1 and RM_B2 of the second electrode RME2 may be branched on the upper side of the emission area EMA of any one sub-pixel SPXn, and may be connected to each other again on the lower side thereof.

The second electrode RME2 may include a first electrode branch portion RM_B1 disposed on the left side of the first electrode RME1 and a second electrode branch portion RM_B2 disposed on the right side of the first electrode RME1. The electrode branch portions RM_B1 and RM_B2 included in one second electrode RME2 may be disposed in the emission areas EMA of the sub-pixels SPXn adjacent in the second direction DR2, and the electrode branch portions RM_B1 and RM_B2 of different second electrodes RME2 may be disposed in one sub-pixel SPXn. The first electrode branch portion RM_B1 of one second electrode RME2 may be disposed on the left side of the first electrode RME1, and the second electrode branch portion RM_B2 of another second electrode RME2 may be disposed on the right side of the first electrode RME1.

The first electrode RME1 may be disposed up to the separation portion ROP of the first sub-region SA1, while the second electrode RME2 may be disposed across the plurality of sub-regions SA1 and SA2 and the emission area EMA. That is, one second electrode RME2 may extend without being cut in the first direction DR1, while the first electrode RME1 may be disposed across the emission area EMA between the separation portions ROP disposed in different first sub-regions SA1.

The electrode branch portions RM_B1 and RM_B2 of the second electrode RME2 may be disposed on one side of the second bank pattern BP2. The first electrode branch portion RM_B1 may be disposed on the second bank pattern BP2 disposed on the left side of the first bank pattern BP1, and the second electrode branch portion RM_B2 may be disposed on the second bank pattern BP2 disposed on the right side of the first bank pattern BP1. Both sides of the first electrode RME1 may face (or oppose) and be spaced from different electrode branch portions RM_B1 and RM_B2 of different second electrodes RME2, and the gap between the first electrode RME1 and each of the electrode branch portions RM_B1 and RM_B2 may be smaller than the gap between bank patterns BP1 and BP2.

The width of the first electrode RME1 measured in the second direction DR2 may be greater than the widths of the electrode stem portion RM_S and the electrode branch portions RM_B1 and RM_B2 of the second electrode RME2. The first electrode RME1 may cover both sides of the first bank pattern BP1, while the second electrode RME2 may be formed to have a relatively small width, so that the electrode branch portions RM_B1 and RM_B2 may cover only one side of the second bank pattern BP2. The first electrode RME1 and the second electrode RME2 may be arranged to cover at least one side surfaces of the bank patterns BP1 and BP2 and may reflect the light emitted from the light emitting element ED. Further, the gap between the first electrode RME1 and the second electrode RME2 that are spaced from each other in the second direction DR2 may be smaller than the gap between the bank patterns BP1 and BP2. At least a part of the first electrode RME1 and the second electrode RME2 may be directly arranged on the via layer VIA, so that the first electrode RME1 and the second electrode RME2 may be arranged on (or at) the same plane.

The plurality of electrodes RME may include a conductive material having high reflectivity. For example, the electrodes RME may contain a metal such as silver (Ag), copper (Cu), or aluminum (Al), or may contain an alloy including aluminum (Al), nickel (Ni), lanthanum (La), or the like. Alternatively, the electrodes RME may have a structure in which a metal layer such as titanium (Ti) and molybdenum (Mo), and the alloy are stacked. In one or more embodiments, the electrodes RME may be formed as a double layer or a multilayer formed by stacking at least one metal layer made of an alloy including aluminum (Al) and titanium (Ti) or molybdenum (Mo).

The present disclosure is not limited thereto, and each electrode RME may further include a transparent conductive material. For example, each electrode RME may include a material such as ITO, IZO, and ITZO. In one or more embodiments, each of the electrodes RME may have a structure in which at least one transparent conductive material and at least one metal layer having high reflectivity are stacked, or may be formed as one layer including them. For example, each electrode RME may have a stacked structure of ITO/Ag/ITO, ITO/Ag/IZO, ITO/Ag/ITZO/IZO, or the like. The electrodes RME may be electrically connected to the light emitting element ED and may reflect light, emitted from the light emitting element ED and traveling to the side surfaces of the bank patterns BP1 and BP2, in the upward direction of each sub-pixel SPXn.

The first insulating layer PAS1 may be disposed in the entire display area DPA and may be disposed on the via layer VIA and the plurality of electrodes RME. The first insulating layer PAS1 may protect the plurality of electrodes RME and insulate electrodes RME that are different from each other. For example, the first insulating layer PAS1 is disposed to cover the electrodes RME before the bank layer BNL is formed, so that it is possible to prevent the electrodes RME from being damaged in a process of forming the bank layer BNL. In addition, the first insulating layer PAS1 may prevent the light emitting element ED disposed thereon from being damaged by direct contact with other members.

In one or more embodiments, the first insulating layer PAS1 may have stepped portions such that the top surface thereof is partially depressed between the electrodes RME that are spaced from each other in the second direction DR2. The light emitting element ED may be disposed on the top surface of the first insulating layer PAS1, where the stepped portions are formed, and thus a space may remain between the light emitting element ED and the first insulating layer PAS1.

The bridge electrodes BE1 and BE2 are disposed on the first insulating layer PAS1 in the sub-regions SA1 and SA2. The first bridge electrode BE1 is disposed in the first sub-region SA1, and the second bridge electrode BE2 is partially disposed in the second sub-region SA2. According to one or more embodiments, each of the bridge electrodes BE1 and BE2 may be in direct contact with any one of the third conductive layer below the via layer VIA and the electrodes RME above the via layer VIA. In the display device 10, in each sub-pixel SPXn, the electrodes RME disposed across the emission area EMA and the sub-regions SA1 and SA2 are electrically connected to the third conductive layer through the bridge electrodes BE1 and BE2. In the manufacturing process of the display device 10, a signal for aligning the light emitting elements ED disposed in the emission area EMA may be applied to each of the electrodes RME through the bridge electrodes BE1 and BE2. The arrangement of the bridge electrodes BE1 and BE2 and the connection relationship with other electrodes will be described later with reference to other drawings.

The bank layer BNL may be disposed on the first insulating layer PAS1. The bank layer BNL may include portions extending in the first direction DR1 and the second direction DR2 in a plan view to be arranged in a grid pattern over the entire surface of the display area DPA. The bank layer BNL may surround each of the sub-pixels SPXn, and the emission area EMA and the sub-regions SA1 and SA2 of each sub-pixel SPXn to distinguish them. In addition, the bank layer BNL may surround the outermost edge of the display area DPA and may distinguish the display area DPA from the non-display area NDA. A portion opened by the bank layer BNL in the display area DPA may be the emission area EMA and the sub-regions SA1 and SA2.

Similarly to the bank patterns BP1 and BP2, the bank layer BNL may have a certain height. In one or more embodiments, the top surface of the bank layer BNL may be higher than that of the bank patterns BP1 and BP2, and the thickness of the bank layer BNL may be equal to or greater than that of the bank patterns BP1 and BP2. The bank layer BNL may prevent ink from overflowing to adjacent sub-pixels SPXn in an inkjet printing process during the manufacturing process of the display device 10. Similarly to the bank patterns BP1 and BP2, the bank layer BNL may include an organic insulating material such as polyimide.

The plurality of light emitting elements ED may be arranged on the first insulating layer PAS1. The light emitting element ED may have a shape extending in one direction, and may be disposed such that one direction in which the light emitting element ED extends is parallel to the first substrate SUB. As will be described later, the light emitting element ED may include a plurality of semiconductor layers arranged along one direction in which the light emitting element ED extends, and the plurality of semiconductor layers may be sequentially arranged along the direction parallel to the top surface of the first substrate SUB. However, the present disclosure is not limited thereto, and the plurality of semiconductor layers may be arranged in the direction perpendicular to the first substrate SUB when the light emitting element ED has another structure.

The plurality of light emitting elements ED may be disposed on the electrodes RME that are spaced from each other in the second direction DR2 between the bank patterns BP1 and BP2. The extension length of the light emitting element ED may be greater than the gap between the electrodes RME that are spaced from each other in the second direction DR2. The light emitting elements ED may have at least one end disposed on any one of the electrodes RME, or may have both ends disposed on the electrodes RME that are different from each other, respectively. The light emitting elements ED may be spaced from each other along the first direction DR1 in which the electrodes RME extend, and may be aligned substantially parallel to each other. However, the present disclosure is not limited thereto, and the light emitting elements ED may each be arranged to extend in a direction oblique to the extension direction of the electrodes RME.

The plurality of light emitting elements ED may be disposed on different electrodes RME between different bank patterns BP1 and BP2. The light emitting element ED may include the first light emitting element ED1 having both ends disposed on the first electrode RME1 and the second electrode branch portion RM_B2 of the second electrode RME2, and the second light emitting element ED2 having both ends disposed on the first electrode RME1 and the first electrode branch portion RM_B1 of another second electrode RME2. The first light emitting elements ED1 may be disposed on the right side with respect to the first electrode RME1, and the second light emitting elements ED2 may be disposed on the left side with respect to the first electrode RME1. The first light emitting elements ED1 may be disposed on the first electrode RME1 and the second electrode RME2, and the second light emitting elements ED2 may be disposed on the first electrode RME1 and the second electrode RME2.

The light emitting elements ED may be electrically connected to the conductive layers below the via layer VIA while being in contact with the connection electrodes CNE (CNE1 and CNE2), and may emit light of a specific wavelength band by receiving an electrical signal. The light emitting elements ED may emit light from both ends thereof in its extension direction, and the light may be reflected from the electrodes RME on the bank patterns BP1 and BP2.

In one or more embodiments, the light emitting elements ED disposed in the sub-pixels SPXn different from each other may emit light of different wavelength bands depending on a material constituting the semiconductor layer. However, the present disclosure is not limited thereto, and the light emitting elements ED arranged in each sub-pixel SPXn may include the semiconductor layer of the same material and emit light of the same color.

The second insulating layer PAS2 may be disposed on the plurality of light emitting elements ED, the first insulating layer PAS1, and the bank layer BNL. The second insulating layer PAS2 may include a pattern portion disposed on the plurality of light emitting elements ED while extending in the first direction DR1 between the bank patterns BP1 and BP2. The pattern portion is disposed to partially surround the outer surface of the light emitting element ED, and may not cover both sides or both ends of the light emitting element ED. The pattern portion may form a linear or island-like pattern in each sub-pixel SPXn in a plan view. The pattern portion of the second insulating layer PAS2 may protect the light emitting element ED and fix the light emitting elements ED during a manufacturing process of the display device 10. Further, the second insulating layer PAS2 may be disposed to fill the space between the light emitting element ED and the first insulating layer PAS1 thereunder. Further, a part of the second insulating layer PAS2 may be disposed on the bank layer BNL and in the sub-regions SA1 and SA2.

The plurality of connection electrodes CNE1, CNE2, and CNE3 may be disposed on the plurality of electrodes RME and the light emitting elements ED. The connection electrodes CNE may be in contact with any one end of the light emitting element ED, and some of them may be electrically connected to at least one of the voltage lines VL1, VL2, VL3, and VL4 below the via layer VIA. For example, the plurality of connection electrodes CNE (CNE1, CNE2, and CNE3) may include a first connection electrode CNE1 and a second connection electrode CNE2, which are first type connection electrodes directly connected to the conductive layer therebelow, and a third connection electrode CNE3, which is a second type connection electrode not directly connected to the conductive layer therebelow.

The first connection electrode CNE1 may have a shape extending in the first direction DR1 and may be disposed on the first electrode RME1. The first connection electrode CNE1 may overlap the first electrode RME1 on the first bank pattern BP1, and in some embodiments, extend therefrom in the first direction DR1 up to the sub-regions SA1 and/or SA2 beyond the bank layer BNL. The first connection electrode CNE1 disposed in the first sub-pixel SPX1 and the second sub-pixel SPX2 may extend from the emission area EMA to the second sub-region SA2 beyond the bank layer BNL, and may be in direct contact with the electrode connection portions CET1 and CET2 of the third conductive layer through a first electrode contact hole CTD in the second sub-region SA2 (e.g., see FIGS. 12-13). On the other hand, the first connection electrode CNE1 disposed in the third sub-pixel SPX3 may extend from the emission area EMA to the first sub-region SA1 beyond the bank layer BNL, and may be in direct contact with the second capacitance electrode CSE2 of the third conductive layer through the first electrode contact hole CTD in the first sub-region SA1 (e.g., see FIG. 13).

The second connection electrode CNE2 may have a shape extending in the first direction DR1 and may be disposed on the first electrode branch portion RM_B1 and the electrode stem portion RM_S of the second electrode RME2. The second connection electrode CNE2 may be disposed to overlap the first electrode branch portion RM_B1 on the second bank pattern BP2, and extend therefrom in the first direction DR1 up to the second sub-region SA2, disposed to the upper side of the emission area EMA, beyond the bank layer BNL. The second connection electrode CNE2 may be in direct contact with the second bridge electrode BE2 or the fourth voltage line VL4 through the second electrode contact hole CTS in the second sub-region SA2.

The third connection electrode CNE3 may include the extension portions CN_E1 and CN_E2 extending in the first direction DR1 and a first connection portion CN_B1 connecting the extension portions CN_E1 and CN_E2. The first extension portion CN_E1 may be disposed on the second electrode branch portion RM_B2 of the second electrode RME2 while facing (or opposing) the first connection electrode CNE1 in the emission area EMA, and the second extension portion CN_E2 may be disposed on the first electrode RME1 while facing (or opposing) the second connection electrode CNE2 in the emission area EMA. The first connection portion CN_B1 may extend in the second direction DR2 on the bank layer BNL to connect the first extension portion CN_E1 to the second extension portion CN_E2. The first connection portion CN_B1 of the third connection electrode CNE3 provided in the first sub-pixel SPX1 and the second sub-pixel SPX2 is disposed on the bank layer between the emission area EMA and the first sub-region SA1, and the first connection portion CN_B1 of the third connection electrode CNE3 provided in the third sub-pixel SPX3 is disposed on the bank layer between the emission area EMA and the second sub-region SA2. The third connection electrode CNE3 may not be directly connected to the conductive layer therebelow.

Figure 13:
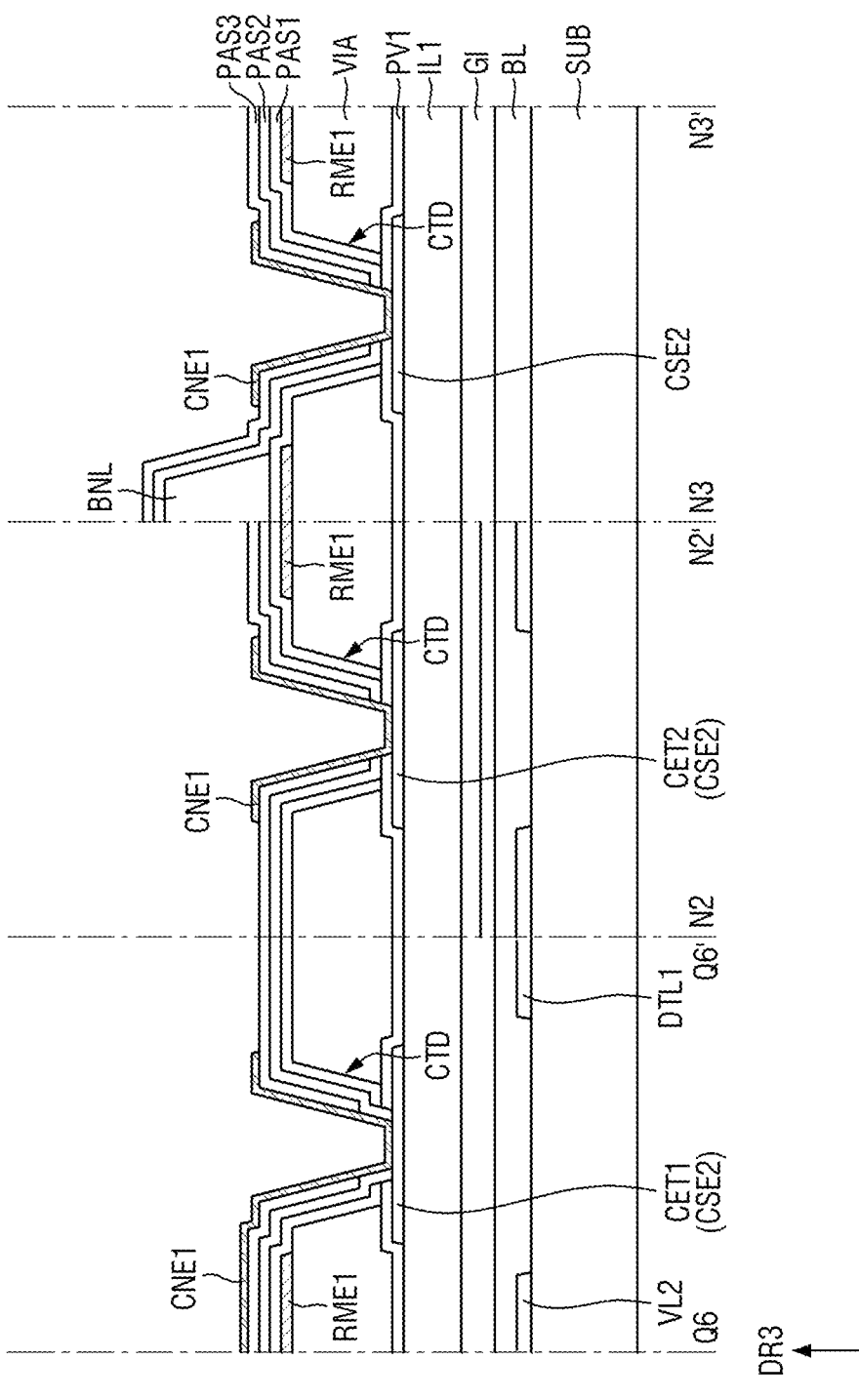
FIG. 13 is a cross-sectional view taken along the lines Q6-Q6', N2-N2', and N3-N3' of FIG. 8.

The first connection electrode CNE1 may be electrically connected to the first transistor T1 connected to each sub-pixel SPXn, by being in direct contact with the second capacitance electrode CSE2 or the electrode connection portions CET1 and CET2 of the third conductive layer (see FIGS. 12-13). The first transistor T1 may be electrically connected to the first voltage line VL1, and thus the first power voltage applied to the first voltage line VL1 may be transmitted to the light emitting elements ED through the first transistor T1 and the first connection electrode CNE1. For example, the first connection electrode CNE1 may be in contact with one end of the first light emitting element ED1 disposed between the first bank pattern BP1 and the second bank pattern BP2 disposed to the right side of the first bank pattern BP1 (e.g., see FIGS. 8-10).

The second connection electrode CNE2 may be electrically connected to the fourth voltage line VL4 and the second voltage line VL2 through the second bridge electrode BE2. The second power voltage applied to the second voltage line VL2 may be transmitted to the light emitting elements ED through the fourth voltage line VL4 and the second connection electrode CNE2. For example, the second connection electrode CNE2 may be in contact with one end of the second light emitting element ED2 disposed between the first bank pattern BP1 and the second bank pattern BP2 disposed to the left side of the first bank pattern BP1 (e.g., see FIGS. 8-10).

The first extension portion CN_E1 of the third connection electrode CNE3 may be in contact with the other end of the first light emitting element ED1, and the second extension portion CN_E2 thereof may be in contact with the other end of the second light emitting element ED2. The first power voltage transmitted to the first connection electrode CNE1 may flow through the first light emitting element ED1, the third connection electrode CNE3, the second light emitting element ED2, and the second connection electrode CNE2. The first light emitting element ED1 and the second light emitting element ED2 may be connected to each other in series through the third connection electrode CNE3, and luminous efficiency per unit area may be improved.

The third insulating layer PAS3 is disposed on the third connection electrode CNE3 and the second insulating layer PAS2. The third insulating layer PAS3 may be entirely disposed on the second insulating layer PAS2 and may cover the third connection electrode CNE3, and the first connection electrode CNE1 and the second connection electrode CNE2 may be disposed on the third insulating layer PAS3. The third insulating layer PAS3 may insulate the first connection electrode CNE1 and the second connection electrode CNE2 from each other so that they are not directly in contact with the third connection electrode CNE3.

In one or more embodiments, another insulating layer may be further disposed on the third insulating layer PAS3. The insulating layer may function to protect the members disposed on the first substrate SUB against the external environment.

The first insulating layer PAS1, the second insulating layer PAS2, and the third insulating layer PAS3 described above may include an inorganic insulating material or an organic insulating material.

According to one or more embodiments, in the display device 10, the bridge electrodes BE1 and BE2 disposed on the first insulating layer PAS1 may be included to electrically connect some electrodes RME to the third conductive layer, and the connection electrodes CNE may be directly connected to the third conductive layer or may be electrically connected to the third conductive layer through the bridge electrodes BE1 and BE2. During the manufacturing process of the display device 10, an electrical signal may be applied to the electrodes RME connected to the voltage lines VL3 and VL4 of the third conductive layer through the bridge electrodes BE1 and BE2, and when driving the display device 10, an electrical signal may be applied to the connection electrodes CNE connected to the third conductive layer directly or through the bridge electrodes BE1 and BE2. The electrodes RME and the connection electrode CNE may be disposed to overlap each other in the emission area EMA, but they are not directly connected to each other and a signal for aligning or driving the light emitting element ED may be applied thereto.

Figure 14:
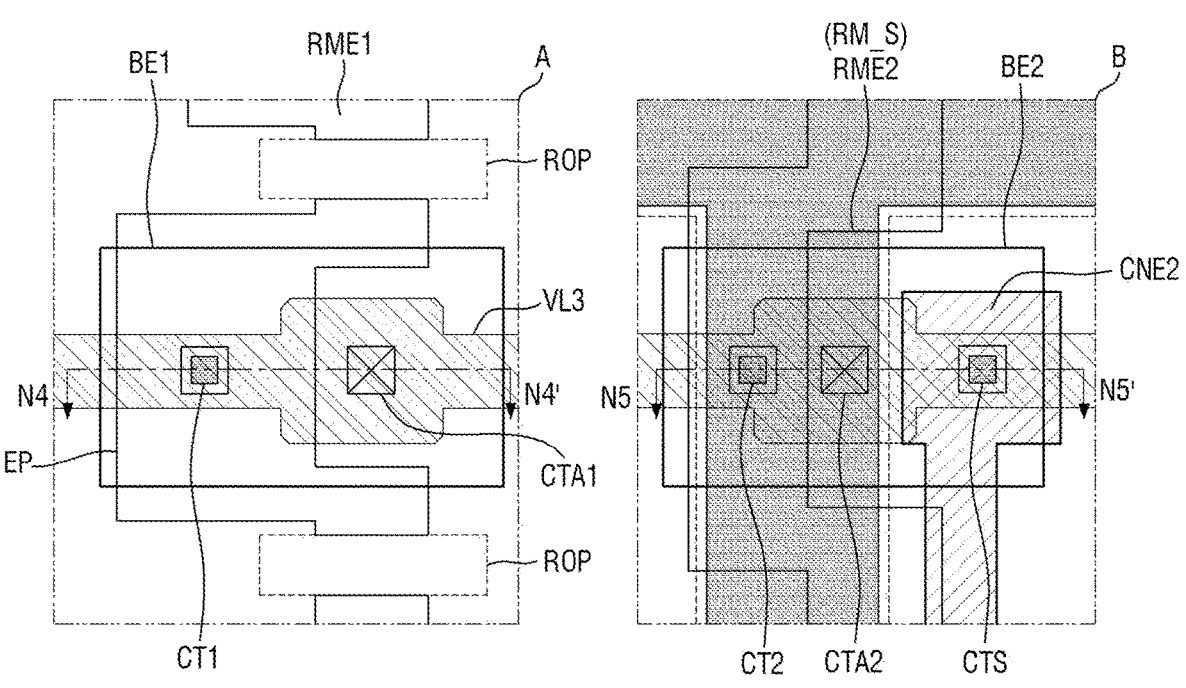
FIG. 14 is an enlarged view of portions A and B of FIG. 8.
Figure 15:
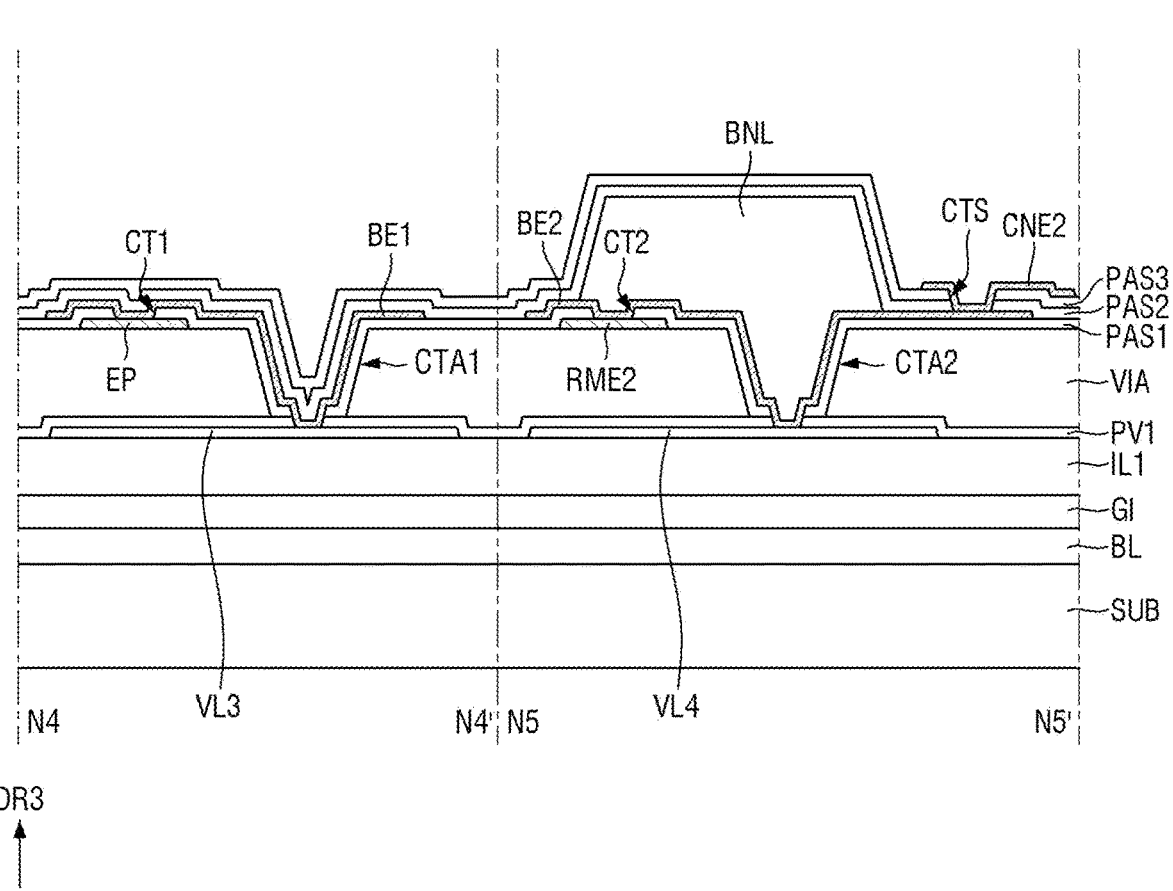
FIG. 15 is a cross-sectional view taken along the lines N4-N4' and N5-N5' of FIG. 14.

FIG. 13 is a cross-sectional view taken along the lines Q6-Q6', N2-N2', and N3-N3' of FIG. 8. FIG. 14 is an enlarged view of portions A and B of FIG. 8. FIG. 15 is a cross-sectional view taken along the lines N4-N4' and N5-N5' of FIG. 14. FIG. 14 illustrates an enlarged view of portions in which the bridge electrodes BE1 and BE2 are disposed in one sub-pixel SPXn. FIG. 15 illustrates a cross section traversing the first bridge electrode BE1 and the second bridge electrode BE2 in the second direction DR2.

Referring to FIGS. 13 to 15 in conjunction with FIGS. 4 to 12, the display device 10 according to one or more embodiments may include the plurality of bridge electrodes BE1 and BE2 disposed in an area, e.g., the sub-regions SA1 and SA2, other than the emission area EMA or disposed to partially overlap the bank layer BNL. The bridge electrodes BE1 and BE2 may be in direct contact with the electrodes RME and the voltage lines VL3 and VL4 of the third conductive layer, and their arrangement may be designed in consideration of the position of the third voltage line VL3 and the fourth voltage line VL4. For example, the first bridge electrode BE1 may be disposed in the first sub-region SA1 so as to be in direct contact with the third voltage line VL3, and the second bridge electrode BE2 may be disposed in a portion where the second sub-region SA2 is positioned so as to be in direct contact with the fourth voltage line VL4. In addition, because the first electrode RME1 has a shape extending in the first direction DR1 and is disposed in the central portion of the first sub-region SA1, the first bridge electrode BE1 may be disposed in the first sub-region SA1. On the other hand, because the electrode stem portion RM_S of the second electrode RME2 extends in the first direction DR1 below the bank layer BNL, the second bridge electrode BE2 may be disposed below a portion of the bank layer BNL extending in the first direction DR1.

Each of the bridge electrodes BE1 and BE2 may be in direct contact with the voltage lines VL3 and VL4 exposed through via holes CTA1 and CTA2 formed in the via layer VIA and an opening penetrating the first passivation layer PV1 and the first insulating layer PAS1. The via layer VIA may include the first via hole CTA1 disposed to overlap the third voltage line VL3 in the first sub-region SA1, and the second via hole CTA2 disposed to overlap the bank layer BNL and the fourth voltage line VL4 at one side of the second sub-region SA2. The first passivation layer PV1 and the first insulating layer PAS1 may include an opening exposing a part of the top surface of the third voltage line VL3 or the fourth voltage line VL4 in each of the via holes CTA1 and CTA2.

According to one or more embodiments, the display device includes an electrode pattern EP spaced from the first electrode RME1 with the separation portion ROP interposed therebetween in the first sub-region SA1. The electrode pattern EP may be formed integrally with the first electrode RME1 in the manufacturing process of the display device 10 and then separated from the first electrode RME1 after the light emitting element ED is disposed. The electrode pattern EP is disposed adjacent to the first via hole CTA1 without overlapping it in the thickness direction. The first electrode RME1 may be formed to bypass the first via hole CTA1 so as not to overlap it while extending in the first direction DR1, and then may be separated at the separation portions ROP located to both sides in the first direction DR1 of the first via hole CTA1 to be spaced from the electrode pattern EP. The first bridge electrode BE1 may be disposed to partially overlap the first via hole CTA1 and the electrode pattern EP, and may be spaced from the separation portions ROP at both sides thereof in the first direction DR1.

The first bridge electrode BE1 may be in direct contact with the third voltage line VL3 exposed by the first via hole CTA1 and the opening of the first passivation layer PV1 and the first insulating layer PAS1. In addition, the first bridge electrode BE1 may be partially disposed on the electrode pattern EP and may be in direct contact with the electrode pattern EP through a first contact portion CT1 penetrating the first insulating layer PAS1. The electrode pattern EP may be electrically connected to the third voltage line VL3 through the first bridge electrode BE1, and during the manufacturing process of the display device 10, an electrical signal applied to the third voltage line VL3 may be transmitted to the first electrode RME1 formed integrally with electrode pattern EP.

The electrode stem portion RM_S of the second electrode RME2 extends in the first direction DR1 between the second sub-regions SA2 of different sub-pixels SPXn. The second via hole CTA2 formed to overlap the fourth voltage line VL4 below the via layer VIA may be formed below the bank layer BNL surrounding the second sub-region SA2. The electrode stem portion RM_S of the second electrode RME2 may have a shape that bypasses the second via hole CTA2 so as not to overlap it while extending in the first direction DR1 below the bank layer BNL.

The second bridge electrode BE2 may be disposed to overlap the second via hole CTA2 and the electrode stem portion RM_S. A part of the second bridge electrode BE2 may be disposed to overlap the electrode stem portion RM_S and the second via hole CTA2 below the bank layer BNL, and the other part thereof may be disposed in the second sub-region SA2. The first passivation layer PV1 and the first insulating layer PAS1 may include an opening exposing a part of the top surface of the fourth voltage line VL4 in the second via hole CTA2, and the second bridge electrode BE2 may be in direct contact with the fourth voltage line VL4 through the opening exposing a part of the top surface of the fourth voltage line VL4. In addition, the second bridge electrode BE2 may be in direct contact with the second electrode RME2 through a second contact portion CT2 penetrating the first insulating layer PAS1. The second electrode RME2 may be electrically connected to the fourth voltage line VL4 through the second bridge electrode BE2, and during the manufacturing process of the display device 10, an electrical signal applied to the fourth voltage line VL4 may be transmitted to the second electrode RME2.

Each of the bridge electrodes BE1 and BE2 may include a conductive material, and the voltage lines VL3 and VL4 of the third conductive layer may be electrically connected to the electrode RME or the electrode pattern EP on the via layer VIA through the bridge electrodes BE1 and BE2. For example, the bridge electrodes BE1 and BE2 may include ITO, IZO, ITZO, aluminum (Al), or the like.

When the light emitting element ED emits light in the driving state of the display device 10, a power voltage may be directly applied to the first connection electrode CNE1 and the second connection electrode CNE2 of each sub-pixel SPXn. The first connection electrode CNE1 may be electrically connected to the first transistor T1 through the second capacitance electrode CSE2 of the third conductive layer, and the second connection electrode CNE2 may be electrically connected to the fourth voltage line VL4 directly or through the second bridge electrode BE2 (e.g., see FIGS. 12-13).

For example, the first connection electrode CNE1 may be in direct contact with the third conductive layer through the first electrode contact hole CTD formed in the first sub-region SA1 or the second sub-region SA2. The first electrode contact hole CTD passes through the first passivation layer PV1, the via layer VIA, the first insulating layer PAS1, the second insulating layer PAS2, and the third insulating layer PAS3. The first electrode contact hole CTD of the first sub-pixel SPX1 may be disposed in the second sub-region SA2 to expose a part of the top surface of the first electrode connection portion CET1, and the first connection electrode CNE1 of the first sub-pixel SPX1 may be in direct contact with the first electrode connection portion CET1. The first electrode contact hole CTD of the second sub-pixel SPX2 may be disposed in the second sub-region SA2 to expose a part of the top surface of the second electrode connection portion CET2, and the first connection electrode CNE1 of the second sub-pixel SPX2 may be in direct contact with the second electrode connection portion CET2. On the other hand, the first electrode contact hole CTD of the third sub-pixel SPX3 may be disposed in the first sub-region SA1 to expose a part of the top surface of any one of the second capacitance electrodes CSE2, and the first connection electrode CNE1 of the third sub-pixel SPX3 may be in direct contact with the second capacitance electrode CSE2. In each sub-pixel SPXn, the first electrode contact hole CTD is formed in a portion that does not overlap the first electrode RME1. In the first sub-pixel SPX1, the first electrode contact hole CTD may be positioned between the first electrode RME1 and the bank layer BNL, and in the second sub-pixel SPX2 and the third sub-pixel SPX3, the first electrode contact hole CTD may be positioned between the first electrode RME1 and the second electrode RME2.

The second connection electrode CNE2 may be in direct contact with the second bridge electrode BE2 through the second electrode contact hole CTS formed in the second sub-region SA2 and may be electrically connected to the fourth voltage line VL4. The second electrode contact hole CTS may be positioned not to overlap the second via hole CTA2, and may penetrate the second insulating layer PAS2 and the third insulating layer PAS3. The second connection electrode CNE2 of each sub-pixel SPXn may extend from the emission area EMA to the second sub-region SA2 to be in direct contact with the second bridge electrode BE2. However, the present disclosure is not limited thereto, and in one more embodiments, similarly to the first electrode contact hole CTD, the second electrode contact hole CTS may penetrate the via layer VIA, and the second connection electrode CNE2 may be in direct contact with the fourth voltage line VL4.

As described above, the first connection electrode CNE1 may be electrically connected to the first transistor T1, and the second connection electrode CNE2 may be electrically connected to the fourth voltage line VL4 and the second voltage line VL2. The power voltage applied to the first voltage line VL1 and the second voltage line VL2 may be transmitted to the light emitting element ED through the first connection electrode CNE1 or the second connection electrode CNE2 that is a first type connection electrode. In addition, the first light emitting element ED1 and the second light emitting element ED2 may be connected in series to each other through the third connection electrode CNE3 that is a second type connection electrode.

The display device 10 according to one or more embodiments may be manufactured with a process of applying an electrical signal to the electrodes RME disposed in the emission area EMA and arranging the light emitting elements ED above the electrodes RME. In the manufacturing process of the display device 10, a process for aligning the light emitting elements ED may be performed by electrically connecting the electrode RME to the voltage lines VL3 and VL4 of the third conductive layer through the bridge electrodes BE1 and BE2. When the light emitting element ED emits light, the connection electrodes CNE may be brought into direct contact with the third conductive layer or may be electrically connected thereto through the bridge electrodes BE1 and BE2 to transmit a driving signal to the light emitting element ED. As the electrode RME and the voltage lines VL3 and VL4 of the third conductive layer are connected through the bridge electrodes BE1 and BE2, the connection electrodes CNE may be electrically connected to the third conductive layer without being in direct contact with the electrode RME, and it is possible to prevent an increase in contact resistance that may occur due to a difference in materials when the connection electrode CNE is brought into direct contact with the electrode RME. In addition, because the bridge electrodes BE1 and BE2 are disposed on the electrodes RME, a process of forming the electrodes RME is performed in a state where the bridge electrodes BE1 and BE2 are not formed. Accordingly, when a developing solution or a cleaning solution is treated in a patterning process of the electrode RME, because the electrode RME is in a state not in contact with the bridge electrodes BE1 and BE2, damage due to a difference in materials between the electrode RME and the bridge electrodes BE1 and BE2 may also be prevented.

Because the bridge electrodes BE1 and BE2 are disposed on the first insulating layer PAS1 and are in contact with the electrode RME and the voltage lines VL3 and VL4 of the third conductive layer concurrently (e.g., simultaneously), a process of partially etching the first insulating layer PAS1 and the first passivation layer PV1 may be performed before a process of forming the bridge electrodes BE1 and BE2. As will be described later, in the manufacturing process of the display device 10, the first passivation layer PV1 may be formed to entirely cover the third conductive layer, and may be partially removed during the patterning process of the first insulating layer PAS1. The via holes CTA1 and CTA2 of the via layer VIA may be formed to expose the top surface of the first passivation layer PV1 in a process of forming the via layer VIA. Thereafter, during the process of forming the electrode RME, the third conductive layers below the via holes CTA1 and CTA2 may be protected by the first passivation layer PV1, so that there is an advantage in that the material of the voltage lines VL3 and VL4 of the third conductive layer is prevented from being damaged by the contact between the electrode RME and the voltage lines VL3 and VL4.

Although it is illustrated in the drawings that the first bridge electrode BE1 and the second bridge electrode BE2 are each formed in a rectangular pattern, the present disclosure is not limited thereto. As long as the first bridge electrode BE1 and the second bridge electrode BE2 are able to be in direct contact with the voltage lines VL3 and VL4 of the third conductive layer and the electrode pattern EP or the second electrode RME2 on the via layer VIA, the pattern shape thereof may be variously modified. As an example, each of the bridge electrodes BE1 and BE2 may be formed to have a size larger than that of the plurality of contact portions CT1 and CT2 and the via holes CTA1 and CTA2, so that it may be in contact with the electrode RME and the voltage line VL3, VL4 of the third conductive layer concurrently (e.g., simultaneously). For example, the width of the first bridge electrode BE1 may be large enough to cover the first contact portion CT1 and the first via hole CTA1, and the width of the second bridge electrode BE2 may be large enough to cover at least the second contact portion CT2 and the second via hole CTA2.

Figure 16:
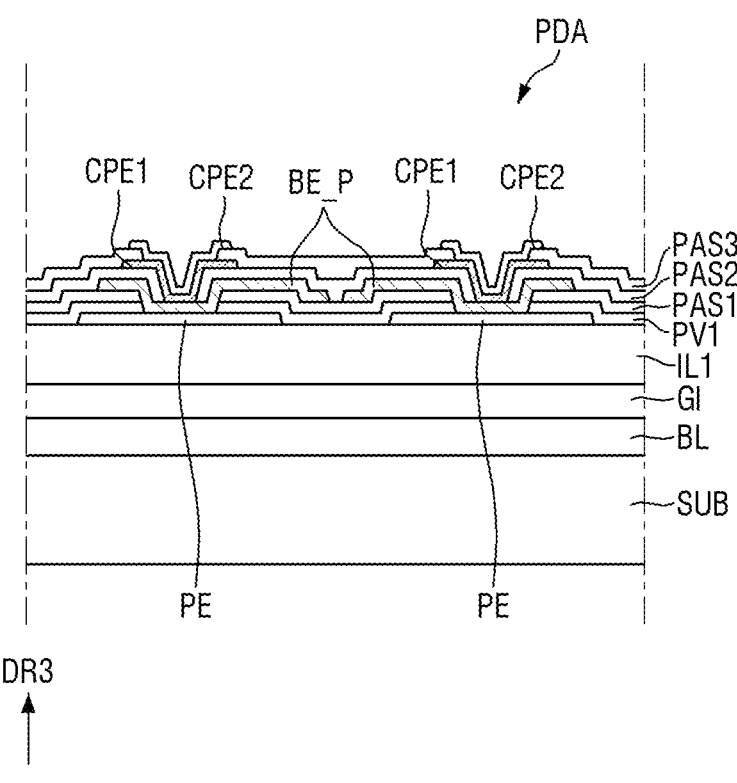
FIG. 16 is a cross-sectional view of a pad electrode disposed in a pad area of a display device according to one or more embodiments.

FIG. 16 is a cross-sectional view of a pad electrode disposed in a pad area of a display device according to one or more embodiments.

Referring to FIG. 16, the display device 10 according to one or more embodiments may include a plurality of pad electrodes PE disposed in the pad area PDA, pad electrode capping layers CPE1 and CPE2 and a pad bridge electrode BE_P disposed on the pad electrode PE. The pad electrode PE may be formed of the third conductive layer disposed on the first interlayer insulating layer IL1, and the pad bridge electrode BE_P may be formed in the same layer as the bridge electrodes BE1 and BE2 of the display area DPA, and the pad electrode capping layers CPE1 and CPE2 may be disposed in the same layer as the third connection electrode CNE3 and the first connection electrode CNE1, respectively. In the display area DPA, the bridge electrodes BE1 and BE2 are disposed, and the voltage lines VL3 and VL4 of the third conductive layer are electrically connected to the electrode RME or the electrode pattern EP through the bridge electrodes BE1 and BE2. Similarly, in the pad area PDA, the pad electrodes PE of the third conductive layer may be electrically connected to the pad electrode capping layers CPE1 and CPE2 through the pad bridge electrode BE_P.

The pad electrode PE may be disposed in the pad area PDA and may be connected to any one of the plurality of line pads WPD described above with reference to FIG. 2. The pad electrode PE may be formed of the third conductive layer, and an electrical signal applied from the line pad WPD may be transmitted to the wires of the display area DPA through the pad electrode PE.

Because the first passivation layer PV1 is disposed on the pad electrode PE and the via layer VIA is not disposed in the pad area PDA, the pad bridge electrode BE_P may be disposed directly on the first passivation layer PV1 in the pad area PDA.

The pad bridge electrode BE_P may include the same material as the bridge electrodes BE1 and BE2 of the display area DPA and may be disposed in substantially the same layer. The pad bridge electrode BE_P may be formed to have a width greater than that of the pad electrode PE, thereby covering the pad electrode PE.

The second insulating layer PAS2 and the first pad electrode capping layer CPE1 are disposed on the pad bridge electrode BE_P. The first pad electrode capping layer CPE1 may include the same material as that of the third connection electrode CNE3 and may be disposed in the same layer. The second insulating layer PAS2 disposed in the pad area PDA may have an opening exposing a part of the top surface of the pad bridge electrode BE_P, and the first pad electrode capping layer CPE1 may be in direct contact with the pad bridge electrode BE_P through the above opening.

The third insulating layer PAS3 and the second pad electrode capping layer CPE2 are disposed on the first pad electrode capping layer CPE1. The second pad electrode capping layer CPE2 may include the same material as those of the first connection electrode CNE1 and the second connection electrode CNE2 and may be disposed in the same layer. The third insulating layer PAS3 disposed in the pad area PDA may have an opening exposing a part of the top surface of the first pad electrode capping layer CPE1, and the second pad electrode capping layer CPE2 may be in direct contact with the first pad electrode capping layer CPE1 through the above opening.

Figure 17:
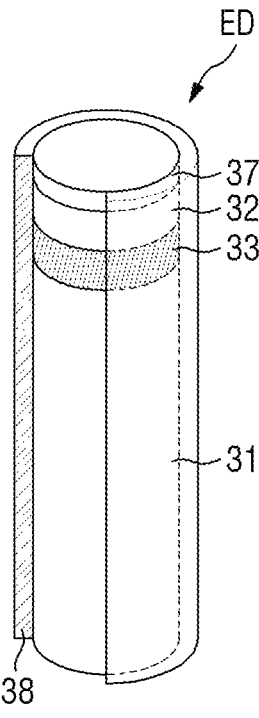
FIG. 17 is a schematic view of a light emitting element according to one or more embodiments.

FIG. 17 is a schematic view of a light emitting element according to one or more embodiments.

Referring to FIG. 17, the light emitting element ED may be a light emitting diode. For example, the light emitting element ED may be an inorganic light emitting diode that has a nanometer or micrometer size, and is made of an inorganic material. The light emitting element ED may be aligned between two electrodes having polarity when an electric field is formed in a specific direction between two electrodes facing (or opposing) each other.

The light emitting element ED according to one or more embodiments may have a shape elongated in one direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in one direction and having an outer surface partially inclined.

The light emitting element ED may include a semiconductor layer doped with any conductivity type (e.g., p-type or n-type) impurities. The semiconductor layer may emit light of a specific wavelength band by receiving an electrical signal applied from an external power source. The light emitting element ED may include a first semiconductor layer 31, a second semiconductor layer 32, a light emitting layer 33, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0\leq x\leq1$, $0\leq y\leq1$, $0\leq x+y\leq1$). For example, the first semiconductor layer 31 may be any one or more of AlGaInN, GaN, AlGaN, InGaN, AlN and InN doped with an n-type dopant. The n-type dopant doped into the first semiconductor layer 31 may be Si, Ge, Sn, or the like.

The second semiconductor layer 32 is disposed on the first semiconductor layer 31 with the light emitting layer 33 therebetween. The second semiconductor layer 32 may be a p-type semiconductor, and the second semiconductor layer 32 may include a semiconductor material having a chemical formula of $Al_xGa_yIn_{1-x-y}N$ ($0\leq x\leq1$, $0\leq y\leq1$, $0\leq x+y\leq1$). For example, the second semiconductor layer 32 may be any one or more of AlGaInN, GaN, AlGaN, InGaN, AlN and InN doped with a p-type dopant. The p-type dopant doped into the second semiconductor layer 32 may be Mg, Zn, Ca, Ba, or the like.

Although it is illustrated in the drawing that the first semiconductor layer 31 and the second semiconductor layer 32 are configured as one layer, the present disclosure is not limited thereto. Depending on the material of the light emitting layer 33, the first semiconductor layer 31 and the second semiconductor layer 32 may further include a larger number of layers, such as a cladding layer or a tensile strain barrier reducing (TSBR) layer.

The light emitting layer 33 is disposed between the first semiconductor layer 31 and the second semiconductor layer 32. The light emitting layer 33 may include a material having a single or multiple quantum well structure. When the light emitting layer 33 includes a material having a multiple quantum well structure, a plurality of barrier layers and well layers may be stacked alternately. The light emitting layer 33 may emit light by coupling of electron-hole pairs according to an electrical signal applied through the first semiconductor layer 31 and the second semiconductor layer 32. The light emitting layer 33 may include a material such as AlGaN, AlGaInN, or InGaN. For example, when the light emitting layer 33 has a multiple quantum well structure in which barrier layers and well layers are alternately stacked, the barrier layer may include a material such as AlGaN or AlGaInN, and the well layer may include a material such as GaN, InGaN, or AlInN.

The light emitting layer 33 may have a structure in which semiconductor materials having large band gap energy and semiconductor materials having small band gap energy are alternately stacked, and may include other Group III to V semiconductor materials according to the wavelength band of the emitted light. The light emitted by the light emitting layer 33 is not limited to the light of the blue wavelength band, but the light emitting layer 33 may also emit light of a red or green wavelength band in some cases.

The electrode layer 37 may be disposed at one end of the light emitting element ED. For example, the electrode layer 37 may be disposed on the second semiconductor layer 32 at one end of the light emitting element ED. However, in one or more embodiments, the electrode layer 37 may be disposed on the first semiconductor layer 31 at the other end of the light emitting element ED. The electrode layer 37 may be an ohmic connection electrode. However, the present disclosure is not limited thereto, and it may be a Schottky connection electrode. The light emitting element ED may include at least one electrode layer 37. The light emitting element ED may include one or more electrode layers 37, but the present disclosure is not limited thereto, and the electrode layer 37 may be omitted.

In the display device 10, when the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO.

The insulating film 38 is arranged to be around (e.g., to surround) the outer surfaces (e.g., outer peripheral or circumferential surfaces) of the plurality of semiconductor layers and electrode layers described above. For example, the insulating film 38 may be disposed to be around (e.g., to surround) at least the outer surface (e.g., the outer peripheral or circumferential surface) of the light emitting layer 33, and may be formed to expose both ends of the light emitting element ED in the longitudinal direction. Further, in cross-sectional view, the insulating film 38 may have a top surface, which is rounded in a region adjacent to at least one end of the light emitting element ED.

The insulating film 38 may include at least one of materials having insulating properties, for example, silicon oxide $(SiO_x)$, silicon nitride $(SiN_x)$, silicon oxynitride $(SiO_xN_y)$, aluminum nitride $(AlN_x)$, aluminum oxide $(AlO_x)$, zirconium oxide $(ZrO_x)$, hafnium oxide $(HfO_x)$, or titanium oxide $(TiO_x)$. It is illustrated in the drawing that the insulating film 38 is formed as a single layer, but the present disclosure is not limited thereto. In one or more embodiments, the insulating film 38 may be formed in a multilayer structure having a plurality of layers stacked therein.

The insulating film 38 may function to protect the members. The insulating film 38 may prevent an electrical short circuit that is likely to occur at the light emitting layer 33 when an electrode to which an electrical signal is transmitted is in direct contact with the light emitting element ED. In addition, the insulating film 38 may prevent a decrease in luminous efficiency of the light emitting element ED.

Further, the insulating film 38 may have an outer surface (e.g., an outer peripheral or circumferential surface) which is surface-treated. The light emitting elements ED may be aligned in such a way of spraying the ink in which the light emitting elements ED are dispersed on the electrodes. Here, the surface of the insulating film 38 may be treated to have a hydrophobic property or hydrophilic property in order to keep the light emitting elements ED in the dispersed state without being aggregated with other adjacent light emitting elements ED in the ink.

Hereinafter, a fabricating process of the display device 10 according to one or more embodiments will be described with reference to other drawings.

FIGS. 18 to 24 are cross-sectional views illustrating a part of a manufacturing process of a display device according to one or more embodiments. FIGS. 18 to 24 illustrate a manufacturing process of a portion where the electrode pattern EP and the third voltage line VL3 are connected through the first bridge electrode BE1 in the display area DPA, and a portion where the pad bridge electrode BE_P and the pad electrode PE are connected in the pad area PDA. The process of forming the respective layers may be performed by a general patterning process. Hereinafter, the method of forming the respective layers will be briefly described, and the sequence of the formation will be mainly described.

Figure 18:
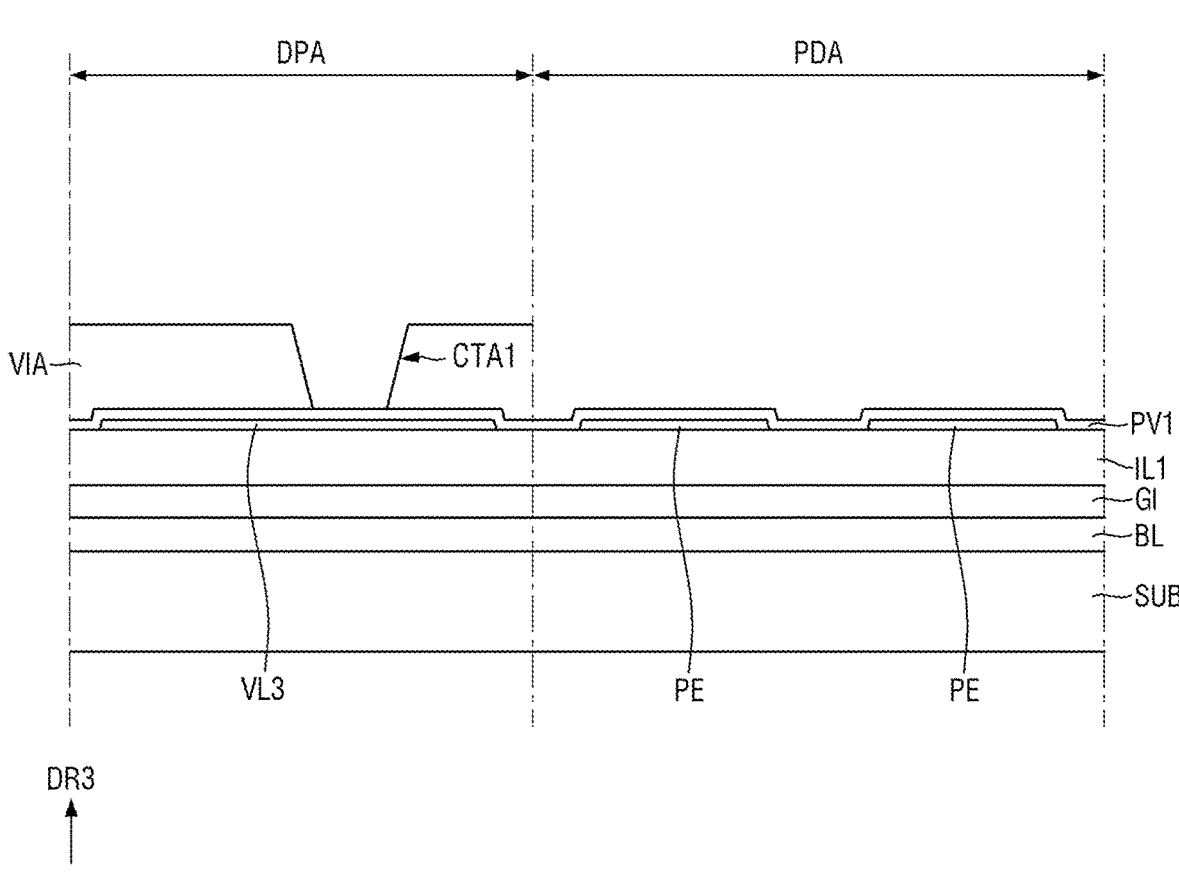
FIGS. 18 to 24 are cross-sectional views illustrating a part of a manufacturing process of a display device according to one or more embodiments.

First, referring to FIG. 18, a first substrate SUB is prepared, and the first to third conductive layers, the buffer layer BL, the first gate insulating layer GI, the first interlayer insulating layer IL1, the first passivation layer PV1, and the via layer VIA are formed on the first substrate SUB. The first to third conductive layers disposed on the first substrate SUB may be formed by depositing a material, e.g., a metal material, of each of the layers, and performing a patterning process using a mask. Further, the buffer layer BL, the first gate insulating layer GI, the first interlayer insulating layer IL1, the first passivation layer PV1, and the via layer VIA disposed on the first substrate SUB may be formed by coating a material, e.g., an insulating material, of each layer, or by a patterning process using a mask, if necessary. In FIG. 18, the third voltage line VL3 of the display area DPA and the pad electrodes PE of the pad area PDA are illustrated as the third conductive layer. The via layer VIA may be disposed in the display area DPA but not in the pad area PDA, and the first via hole CTA1 may be formed in an area overlapping the third voltage line VL3. Because description of these structures is the same as described above, detailed description thereof will be omitted.

In one or more embodiments, the first passivation layer PV1 may be formed to completely cover the third conductive layer in a process of forming the via layer VIA. As described above, in a process of forming the first insulating layer PAS1, the first passivation layer PV1 may be etched to expose a part of the top surfaces of the patterns of the third conductive layer. The first passivation layer PV1 may protect the third conductive layer by completely covering it until the first insulating layer PAS1 is formed.

Figure 19:
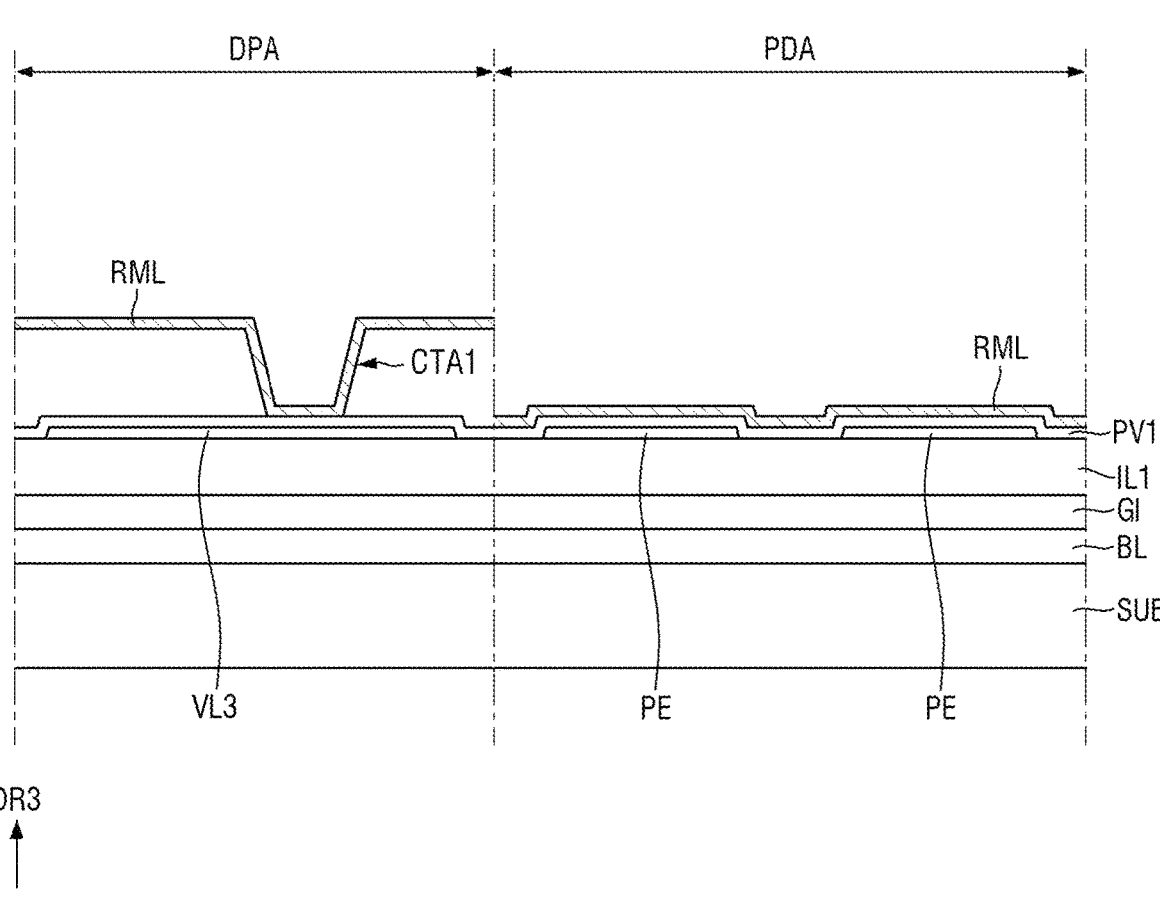
Figure 20:
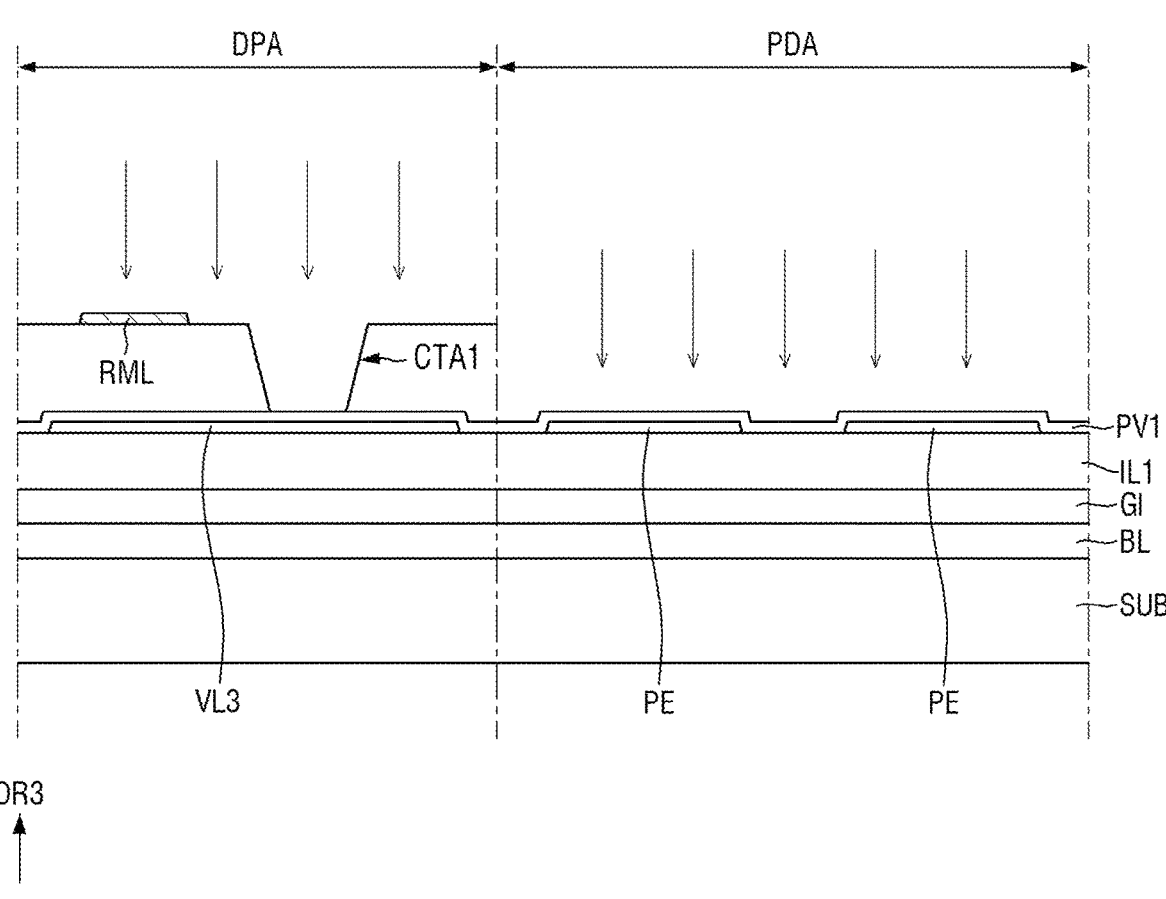

Next, referring to FIGS. 19 and 20, a metal layer RML is formed on the via layer VIA and patterned to partially remain in the display area DPA. In this process of forming the plurality of electrodes RME in the display area DPA, the metal layer RML is provided on the entire surface of the display area DPA and the pad area PDA and then patterned, so that the metal layer RML in the pad area PDA is completely removed and only the metal layer RML serving as the electrode RME in the display area DPA remains.

The metal layer RML deposited on the entire surface of the display area DPA and the pad area PDA may be disposed directly on the via layer VIA or the first passivation layer PV1. Even though a process of partially removing the metal layer RML is performed, because the third conductive layer is protected by the first passivation layer PV1, the voltage lines VL3 and VL4 and the pad electrode PE may be protected.

Figure 21:
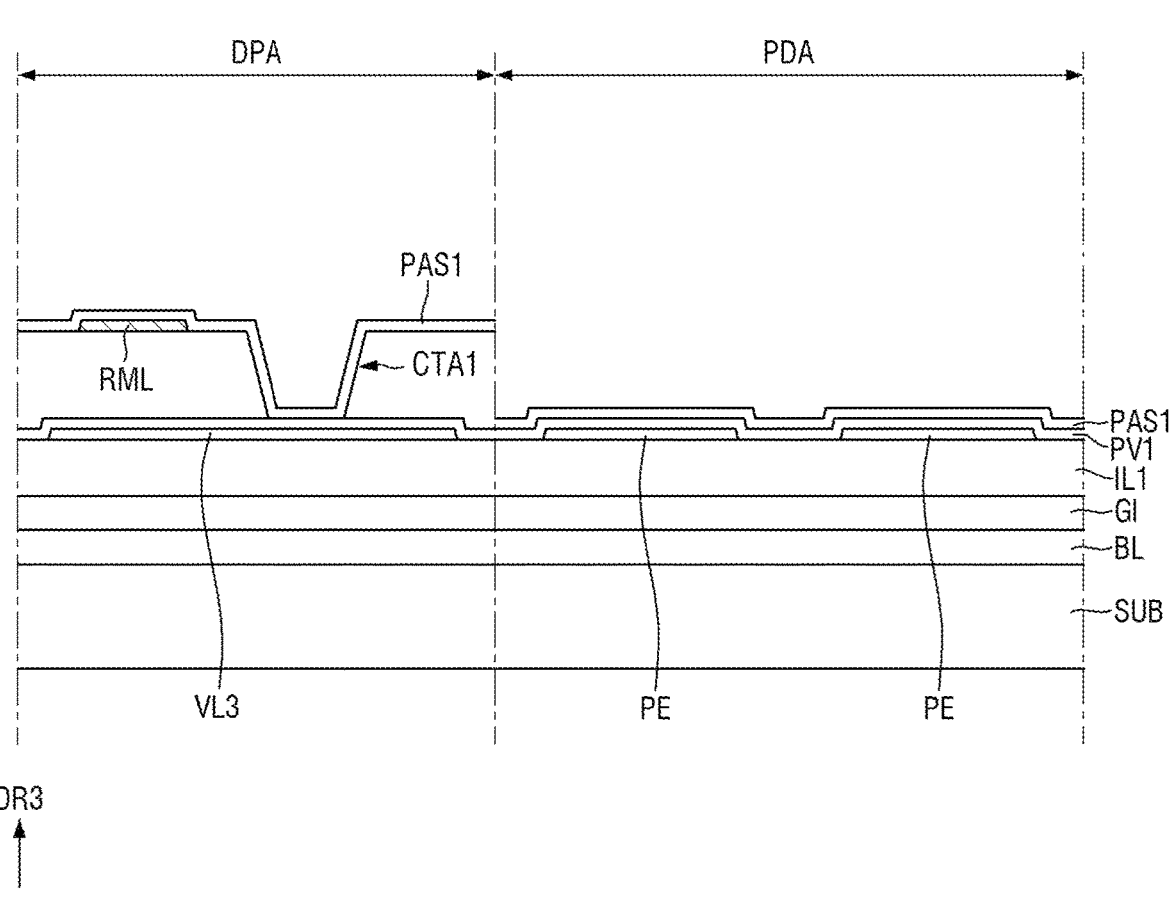
Figure 22:
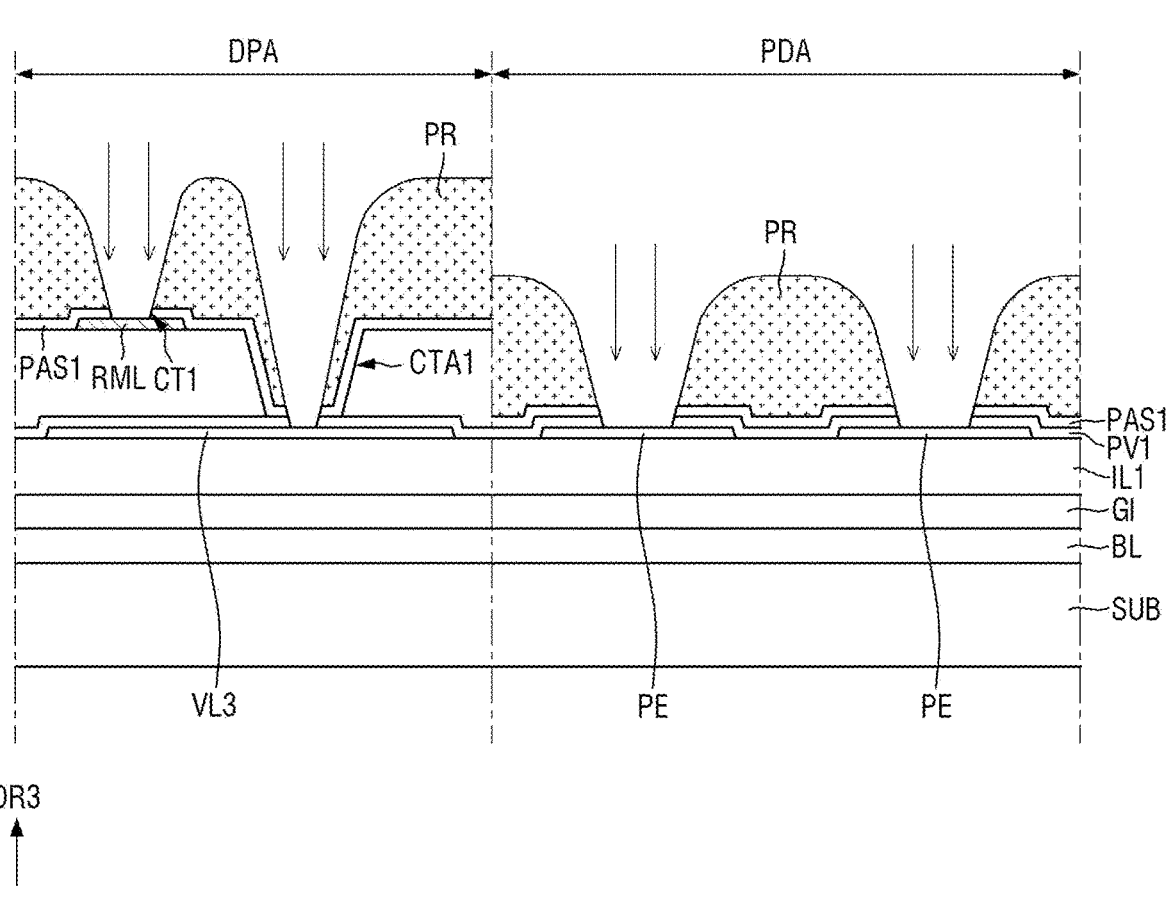
Figure 23:
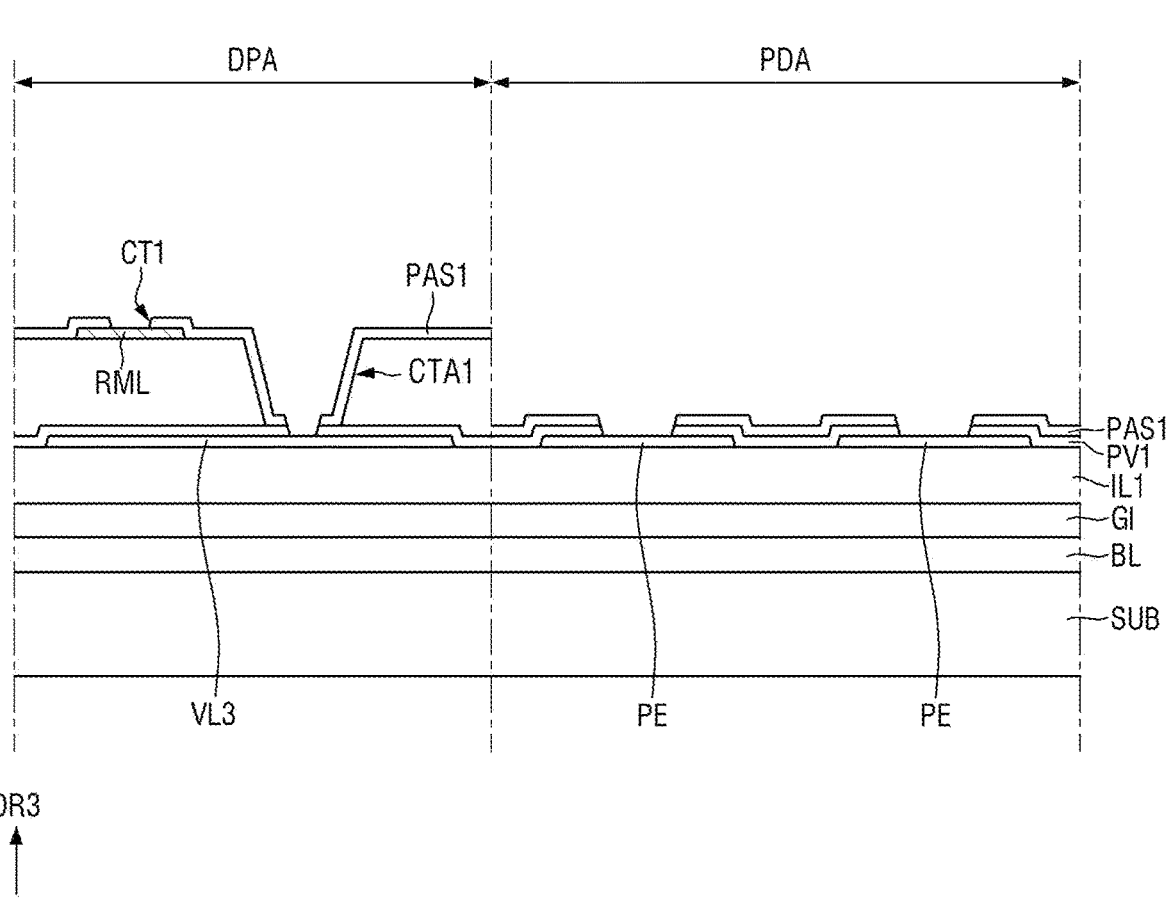

Next, referring to FIGS. 21 to 23, a process of depositing the first insulating layer PAS1 on the via layer VIA, the metal layer RML, and the first passivation layer PV1 and patterning the same is performed. Similarly to the metal layer RML, the first insulating layer PAS1 may be formed entirely on the via layer VIA and the first passivation layer PV1 in the display area DPA and the pad area PDA. When the first insulating layer PAS1 is formed, a part of the first insulating layer PAS1 and the first passivation layer PV1 is patterned to form openings exposing a part of the metal layer RML and the third conductive layer.

As shown in FIGS. 22 and 23, a photoresist PR is formed on the first insulating layer PAS1, and an area where the photoresist PR is not formed is etched to remove a part of the first insulating layer PAS1 and the first passivation layer PV1. This process may be performed as an overetching process on the first insulating layer PAS1 so that the first insulating layer PAS1 and the first passivation layer PV1 are removed concurrently (e.g., simultaneously).

For example, as the first passivation layer PV1 and the first insulating layer PAS1 are patterned concurrently (e.g., simultaneously), the inner sidewalls of the first insulating layer PAS1 and the first passivation layer PV1 may be formed to be aligned with each other in the openings disposed in the via holes CTA1 and CTA2. Also in the pad area PDA, in an opening exposing a part of the top surface of the pad electrode PE, the inner sidewalls of the first insulating layer PAS1 and the first passivation layer PV1 may be formed to be aligned with each other.

Figure 24:
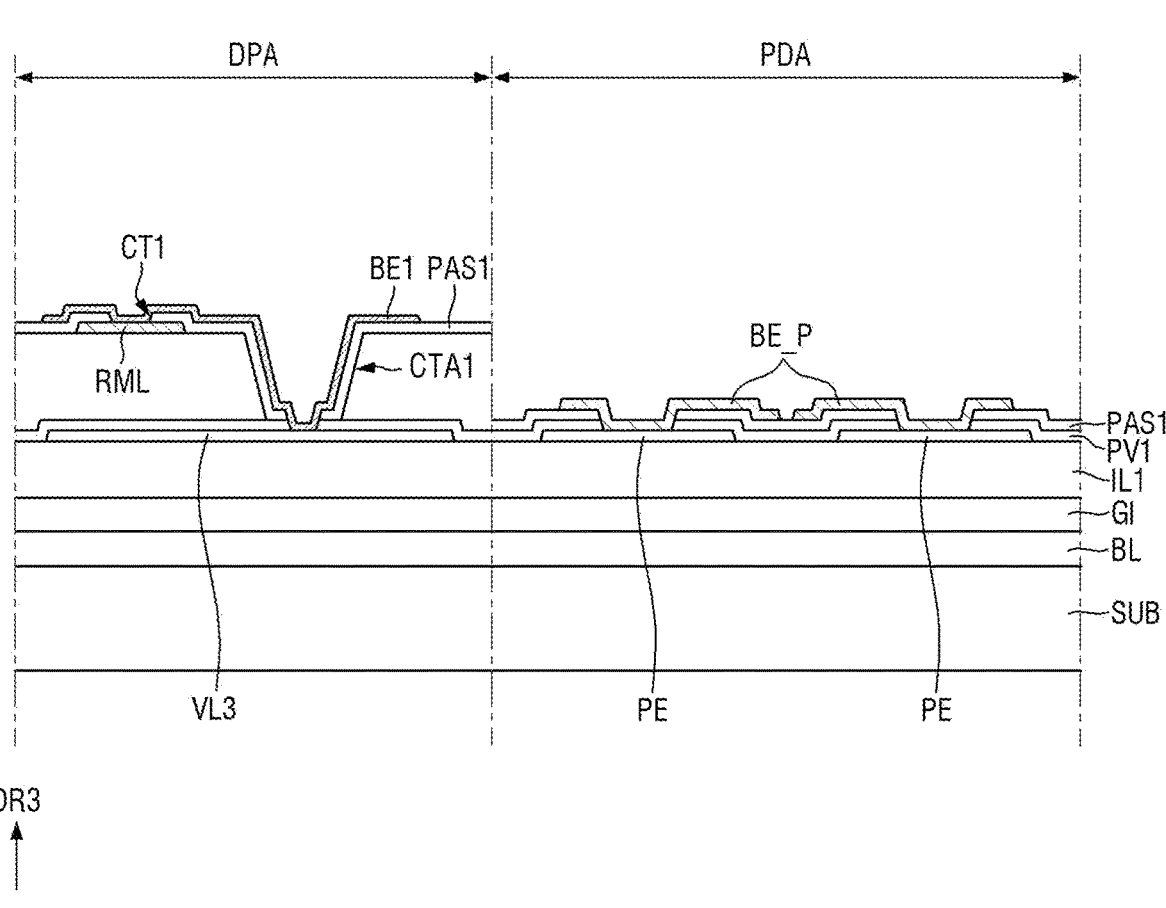

Subsequently, referring to FIG. 24, the bridge electrodes BE1 and BE2 and the pad bridge electrode BE_P are formed in the display area DPA and the pad area PDA, respectively. The bridge electrodes BE1 and BE2 disposed in the display area DPA may be in contact with the metal layer RML or the electrode RME through the contact portions CT1 and CT2 formed in the first insulating layer PAS1, and may be in contact with the voltage lines VL3 and VL4 of the third conductive layer through the openings formed in the via holes CTA1 and CTA2. The pad bridge electrode BE_P disposed in the pad area PDA may be in contact with the pad electrode PE through an opening penetrating the first insulating layer PAS1 and the first passivation layer PV1.

The description of these structures is the same as the above description.

Next, after disposing the light emitting elements ED in the emission area EMA, the second insulating layer PAS2, the third connection electrode CNE3, the first pad electrode capping layer CPE1, the third insulating layer PAS3, the first connection electrode CNE1, the second connection electrode CNE2, and the second pad electrode capping layer CPE2 may be formed to manufacture the display device 10.

In one or more embodiments, among the electrodes RME disposed in the display area DPA, the first electrode RME1 may be formed integrally with the electrode pattern EP, and then separated from the electrode pattern EP in a patterning process performed at the separation portion ROP. After the second insulating layer PAS2 is formed, the first electrode RME1 and the electrode pattern EP may be separated from each other at the separation portion ROP positioned in the first sub-region SA1. As described above, the first insulating layer PAS1 may be formed to completely cover the first electrode RME1 or the metal layer RML, and then may be partially patterned together with the first passivation layer PV1 through an overetching process. Here, a portion of the first insulating layer PAS1 disposed in the separation portion ROP may also be patterned, and the top surface of a portion connecting the first electrode RME1 to the electrode pattern EP may be exposed. Next, the second insulating layer PAS2 is also disposed to expose the top surface of the portion connecting the first electrode RME1 to the electrode pattern EP, and in a subsequent process, the first electrode RME1 may be separated from the electrode pattern EP.

Figure 25:
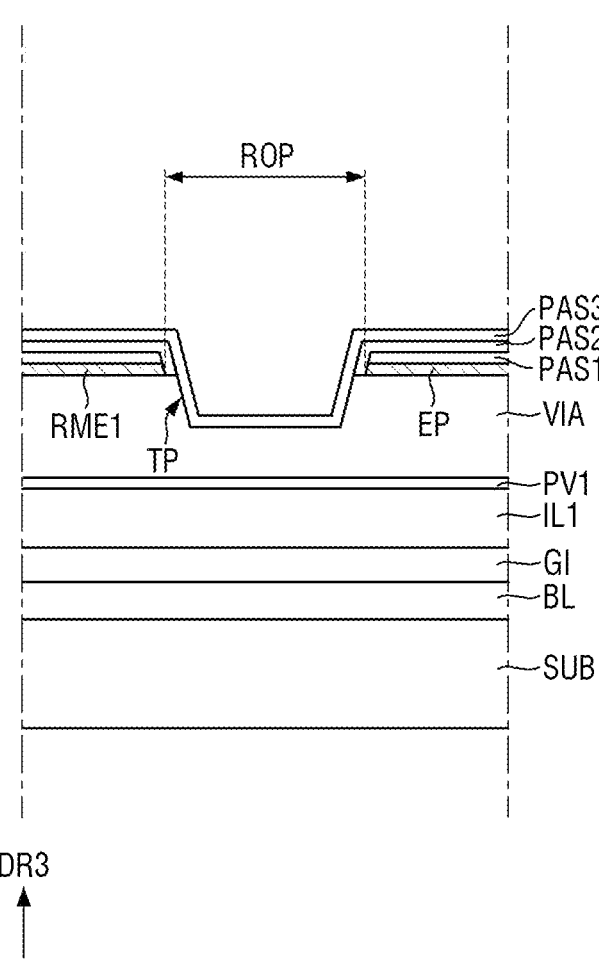
FIG. 25 is a cross-sectional view illustrating a separation portion of a display device according to one or more embodiments.

FIG. 25 is a cross-sectional view illustrating a separation portion of a display device according to one or more embodiments. FIG. 25 illustrates a cross section traversing the separation portion ROP in the first direction DR1 between the first electrode RME1 and the electrode pattern EP.

Referring to FIG. 25, according to one or more embodiments, in the separation portion ROP, which is a region where the first electrode RME1 and the electrode pattern EP are spaced apart from each other, a part of the top surface of the via layer VIA may be depressed to form a trench portion TP. The trench portion TP formed in the via layer VIA may be formed in a patterning process for separating the first electrode RME1 from the electrode pattern EP. Because the process of separating the first electrode RME1 from the electrode pattern EP is performed after the second insulating layer PAS2 is formed, the third insulating layer PAS3 may be disposed directly on the trench portion TP of the via layer VIA positioned in the separation portion ROP.

The process of patterning the first insulating layer PAS1 and the first passivation layer PV1 may be performed by overetching the first insulating layer PAS1. Accordingly, the top surface of the portion connecting the first electrode RME1 to the electrode pattern EP may be completely exposed, and a residue of the electrode material may be prevented from remaining when the first electrode RME1 is separated from the electrode pattern EP. Because the first insulating layer PAS1 is completely removed at the separation portion ROP, the via layer VIA may also be partially etched in the separation process of the first electrode RME1 and the electrode pattern EP. In the separation process, a part of the top surface of the via layer VIA may be depressed to form the trench portion TP in the separation portion ROP.

As the process of etching the first insulating layer PAS1 and the first passivation layer PV1 together is performed as an overetching process on the first insulating layer PAS1, the first electrode RME1 and the electrode pattern EP may be smoothly separated at the separation portion ROP. In the display device 10 according to one or more embodiments, the occurrence of dark spots in the pixel according to the amount of separation between the first electrode RME1 and the electrode pattern EP in each sub-pixel SPXn may be prevented.

Figure 26:
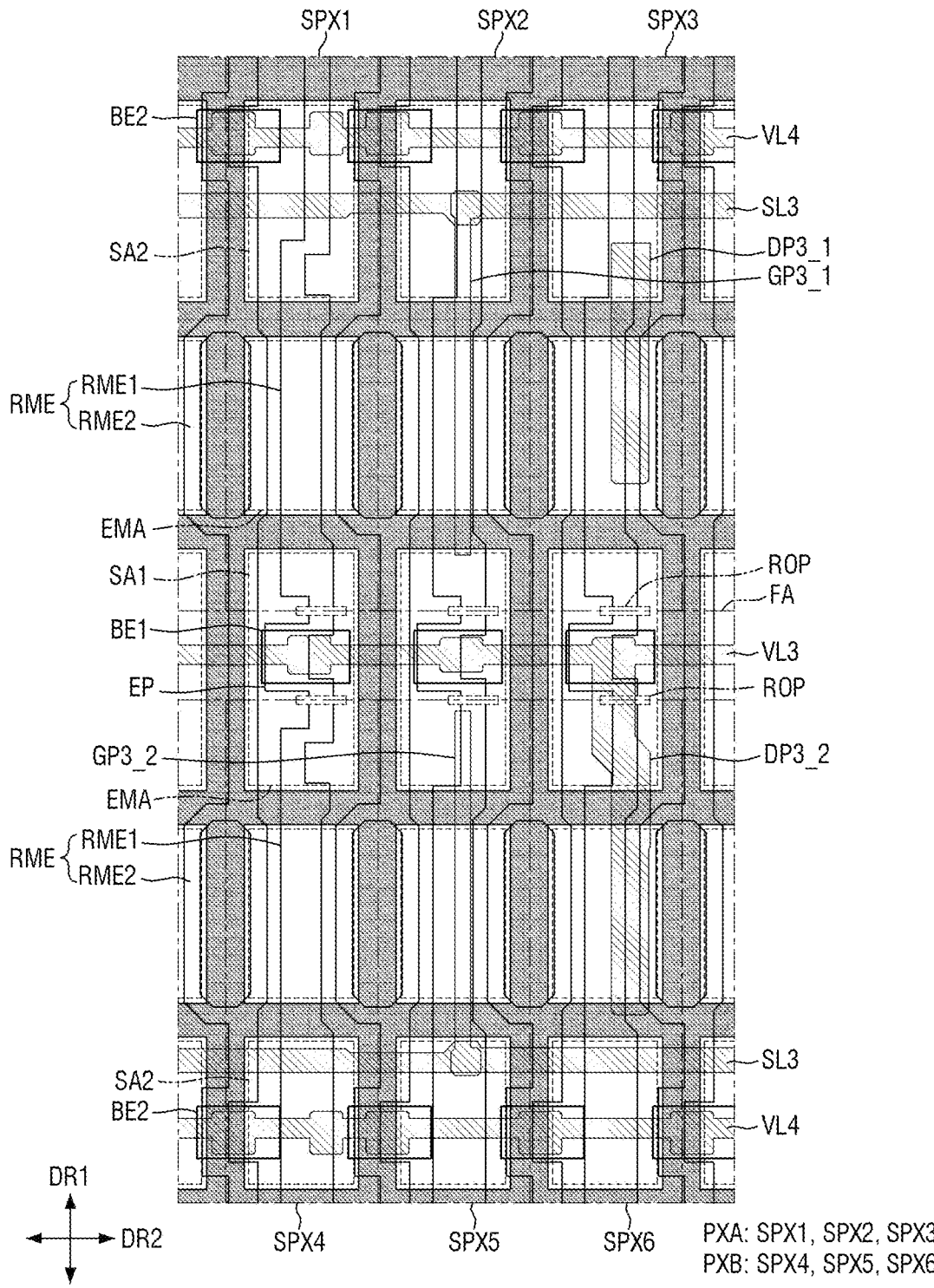
FIG. 26 is a schematic plan view illustrating a plurality of pixels of a display device according to one or more embodiments.
Figure 27:
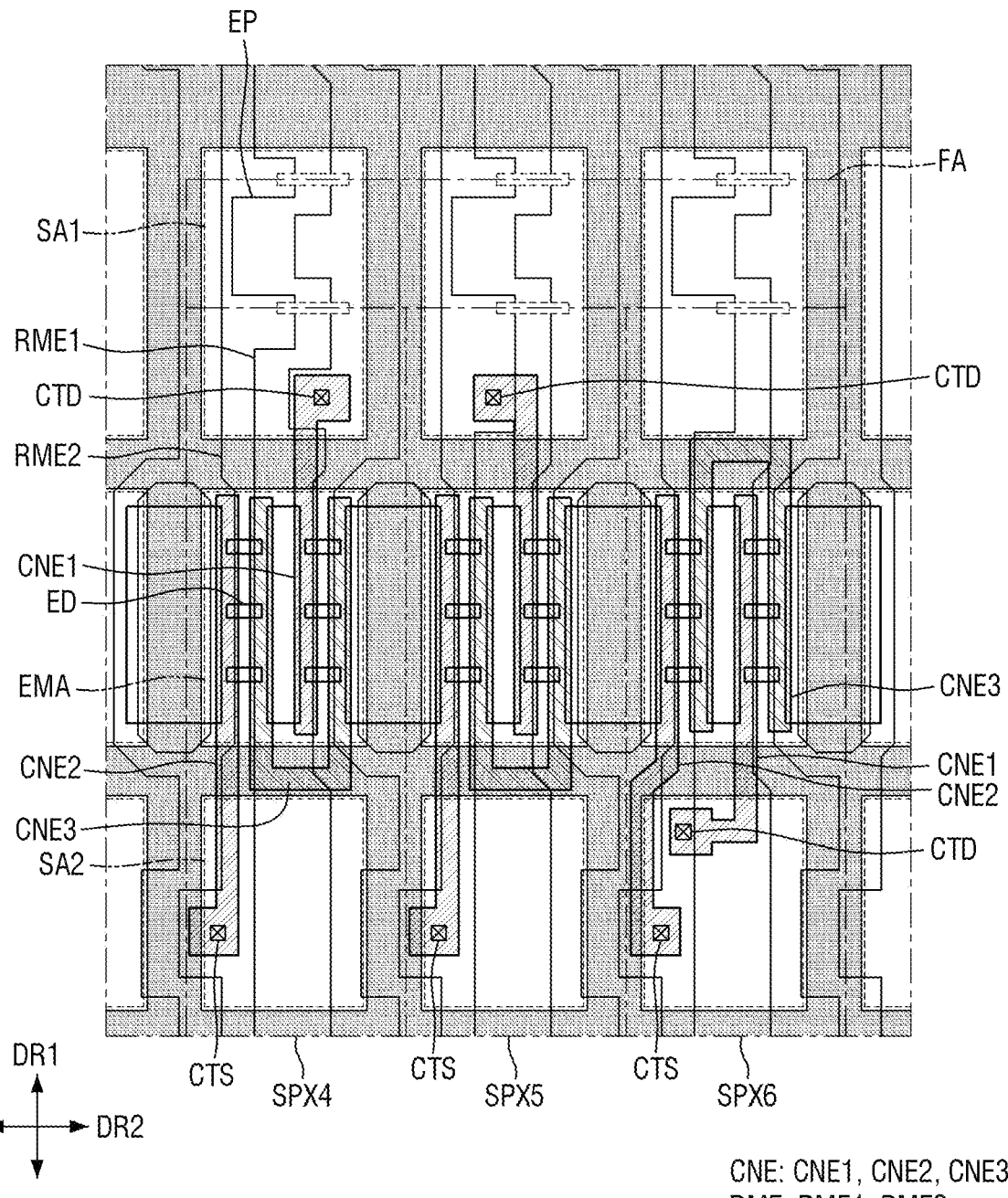
FIG. 27 is a plan view showing a second pixel of FIG. 26.

FIG. 26 is a schematic plan view illustrating a plurality of pixels of a display device according to one or more embodiments. FIG. 27 is a plan view showing a second pixel of FIG. 26. FIG. 26 is a plan view of different pixels PX (PXA and PXB) adjacent in the first direction DR1, and illustrates the relative arrangement of some wires or patterns of the second conductive layer and the third conductive layer, the bank layer BNL, the electrodes RME, and the bridge electrodes BE1 and BE2. FIG. 27 illustrates the relative arrangement of the electrodes RME and the connection electrodes CNE disposed in the second pixel PXB.

Referring to FIGS. 26 and 27, in the display device 10, different pixels PX adjacent in the first direction DR1 may share the third voltage line VL3 or the fourth voltage line VL4, and accordingly, in the adjacent pixels PX, the arrangement of the third scan line SL3, the third gate pattern GP3, the electrodes RME, and the connection electrodes CNE may be different. FIG. 26 exemplarily illustrates the first pixel PXA and the second pixel PXB sharing the third voltage line VL3.

As described above, the emission area EMA in which the light emitting elements ED are disposed and the plurality of sub-regions SA1 and SA2 that are a part of the non-emission area in which the light emitting elements ED are not disposed may be disposed in the display area DPA. The emission area EMA and the sub-regions SA1 and SA2 may be alternately and repeatedly arranged along the first direction DR1, and the first sub-region SA1 and the second sub-region SA2 may also be alternately and repeatedly arranged. For example, in the first pixel PXA, the second sub-region SA2 may be disposed to the upper side of the emission area EMA, and the first sub-region SA1 may be disposed to the lower side of the emission area EMA. In the second pixel PXB, the first sub-region SA1 may be disposed to the upper side of the emission area EMA, and the second sub-region SA2 may be disposed to the lower side of the emission area EMA. The first pixel PXA and the second pixel PXB may share the third voltage line VL3, and the emission areas EMA of each of the pixels PXA and PXB may be spaced from each other in the first direction DR1 with the first sub-region SA1 interposed therebetween.

In each pixel PX, when an area including the emission area EMA, the second sub-region SA2, and the first sub-region SA1 including the separation portion ROP is defined as an area occupied by the sub-pixel SPXn, a floating area FA in which the electrode pattern EP and the third voltage line VL3 are disposed may be defined between the sub-pixels SPXn of the first pixel PXA and the sub-pixels SPXn of the second pixel PXB. The floating area FA may be a part of the first sub-region SA1 and may be an area in which the electrode pattern EP and the first bridge electrode BE1 are disposed. The first electrode RME1 of each sub-pixel SPXn may be spaced from the floating area FA with the separation portion ROP therebetween.

However, the floating area FA may be defined for simplicity of description in this drawing and the following description, and may not be necessarily distinguished from the sub-pixel SPXn within the corresponding pixel PX. The floating area FA may be an area in which a voltage line (e.g., the third voltage line VL3) shared by the pixels PXs adjacent in the first direction DR1 is disposed, and may be defined as an area shared by the adjacent pixels PX, and may be distinguished from the sub-pixel SPXn for simplicity of description.

As the first pixel PXA and the second pixel PXB share the third voltage line VL3, the shapes of the wires and some patterns disposed in each pixel PX may have a symmetrical structure. For example, in the first pixel PXA, as the fourth voltage line VL4 is disposed to the upper side of the emission area EMA, and the third scan line SL3 is also disposed to the upper side of the emission area EMA, a third gate pattern GP3_1 may have a shape extending downward from the third scan line SL3. In the first pixel PXA, the third gate pattern GP3_1 may be disposed to extend to the emission area EMA from the second sub-region SA2 in which the first electrode contact hole CTD is disposed with respect to the second sub-pixel SPX2. On the other hand, in the second pixel PXB, the fourth voltage line VL4 and the third scan line SL3 may be disposed to the lower side of the emission area EMA, and a third gate pattern GP3_2 may have a shape extending upward from the third scan line SL3. In the second pixel PXB, the third gate pattern GP3_2 may be disposed to extend to the emission area EMA from the second sub-region SA2 in which the first electrode contact hole CTD is not disposed with respect to a fifth sub-pixel SPX5.

In addition, a third conductive pattern DP3_1 of the first pixel PXA may be disposed to be spaced from the third voltage line VL3, while a third conductive pattern DP3_2 of the second pixel PXB may be integrally connected to the third voltage line VL3. On the other hand, in one or more embodiments, the relative arrangement of other patterns of the third conductive layer, e.g., the first and second conductive patterns DP1 and DP2, the second capacitance electrodes CSE2, and other conductive patterns may be the same in the first pixel PXA and the second pixel PXB.

In the first pixel PXA, if the third voltage line VL3 is disposed on the lower side and the third scan line SL3 is disposed on the upper side, no other wires are disposed between the third scan line SL3 and other patterns of the third conductive layer. On the other hand, in the second pixel PXB, because the third voltage line VL3 is disposed on the upper side and integrally connected to the third conductive pattern DP3_2, if the third scan line SL3 is disposed on the upper side, other wires may be disposed between different patterns of the third conductive layer. For example, when the third scan line SL3 is disposed adjacent to and below the third voltage line VL3 in the second pixel PXB, the third scan line SL3 crosses a connection portion between the third voltage line VL3 and the third conductive pattern DP3_2. Alternatively, when the third scan line SL3 is disposed adjacent to and above the third voltage line VL3, a step may be generated at a portion where the third gate pattern GP3_2 crosses the third voltage line VL3. In consideration of this, the relative arrangement of the third scan line SL3 may be different in the first pixel PXA and the second pixel PXB, and corresponding thereto, the extension directions of the third gate patterns GP3_1 and GP3_2 may also be different.

In response to a change in the positions of the first sub-region SA1 and the second sub-region SA2 with respect to the emission area EMA in each of the pixels PXA and PXB, the arrangement of the electrodes RME and the connection electrodes CNE on the via layer VIA may also be changed.

The shapes of the first electrode RME1 and the second electrode RME2 and the shape of each connection electrode CNE (CNE1, CNE2, CNE3) may be designed differently depending on the arrangement of the voltage lines VL3 and VL4 of the third conductive layer, the electrode connection portions CET1 and CET2, and the bridge electrodes BE1 and BE2.

As described above in FIG. 8, the first electrode RME1 of the first pixel PXA extends substantially in the first direction DR1 to be spaced from the electrode pattern EP with respect to the separation portion ROP in the first sub-region SA1. That is, the first electrode RME1 may have a shape extending from the lower side of the emission area EMA to the upper side thereof. In addition, in the first sub-pixel SPX1, the first electrode RME1 may have a bypassing portion so as not to overlap the first electrode connection portion CET1 of the third conductive layer, and the bypassing portion of the first electrode RME1 may be disposed in the second sub-region SA2 above the emission area EMA. Similarly, the second electrode RME2 may also include a bypassing portion in the electrode stem portion RM_S so as not to overlap the second via hole CTA2, and in the first pixel PXA, the electrode stem portion RM_S may have a shape that bypasses the second via hole CTA2 in the bank layer BNL adjacent to the second sub-region SA2 above the emission area EMA.

On the other hand, the first electrode RME1 of the second pixel PXB may be spaced from the electrode pattern EP with respect to the separation portion ROP in the first sub-region SA1 disposed to the upper side of the emission area EMA, and the first electrode RME1 may have a shape extending from the upper side to the lower side. In a fourth sub-pixel SPX4, the first electrode RME1 may have a bypassing portion so as not to overlap the first electrode connection portion CET1 of the third conductive layer, and the bypassing portion of the first electrode RME1 may be disposed in the first sub-region SA1 above the emission area EMA. In the second pixel PXB, a portion of the electrode stem portion RM_S of the second electrode RME2 that bypasses the second via hole CTA2 may be disposed to overlap the bank layer BNL adjacent to the second sub-region SA2 below the emission area EMA.

That is, in the first pixel PXA and the second pixel PXB, the extension direction of the first electrode RME1 with respect to the separation portion ROP may be different, and in the first sub-pixel SPX1 and the fourth sub-pixel SPX4, the position of a portion of the first electrode RME1 that bypasses the first electrode connection portion CET1 so as not to overlap it may be different. In the first pixel PXA and the second pixel PXB, the position of a portion of the electrode stem portion RM_S of the second electrode REM2 that bypasses the second via hole CTA2 may be different.

In the first sub-pixel SPX1 and the second sub-pixel SPX2 of the first pixel PXA, the first electrode contact hole CTD is disposed in the second sub-region SA2 above the emission area EMA, and in the third sub-pixel SPX3, the first electrode contact hole CTD is disposed in the first sub-region SA1 below the emission area EMA. Accordingly, the first connection electrode CNE1 of the first sub-pixel SPX1 and the second sub-pixel SPX2 may extend upward from the emission area EMA, and the first connection electrode CNE1 of the third sub-pixel SPX3 may extend downward from the emission area EMA.

In the fourth sub-pixel SPX4 and the fifth sub-pixel SPX5 of the second pixel PXB, the first electrode contact hole CTD is disposed in the first sub-region SA1 above the emission area EMA, and in a sixth sub-pixel SPX6, the first electrode contact hole CTD is disposed in the second sub-region SA2 below the emission area EMA. Accordingly, the first connection electrode CNE1 of the fourth sub-pixel SPX4 and the fifth sub-pixel SPX5 may extend upward from the emission area EMA, and the first connection electrode CNE1 of the sixth sub-pixel SPX6 may extend downward from the emission area EMA. The first connection electrode CNE1 may have a substantially similar pattern shape in a plan view regardless of the different pixels PXA and PXB. The position of the first electrode contact hole CTD may be adjusted according to the arrangement positions of the electrode connection portions CET1 and CET2 and the second capacitance electrode CSE2 of the third conductive layer, and in the first pixel PXA and the second pixel PXB, the arrangement positions of the second capacitance electrode CSE2 and the electrode connection portions CET1 and CET2 may be the same.

In each sub-pixel SPXn (SPX1, SPX2, SPX3) of the first pixel PXA, the second electrode contact hole CTS is disposed in the second sub-region SA2 above the emission area EMA according to the position of the fourth voltage line VL4. Accordingly, the second connection electrode CNE2 in each sub-pixel SPXn (SPX1, SPX2, SPX3) of the first pixel PXA may extend upward from the emission area EMA.

On the other hand, in each sub-pixel SPXn (SPX4, SPX5, SPX6) of the second pixel PXB, the second electrode contact hole CTS is disposed in the second sub-region SA2 below the emission area EMA according to the position of the fourth voltage line VL4. Accordingly, the second connection electrode CNE2 in each sub-pixel SPXn (SPX4, SPX5, SPX6) of the second pixel PXB may extend downward from the emission area EMA. In the display device 10, as different pixels PX adjacent in the first direction DR1 share any one of the voltage lines VL3 and VL4 of the third conductive layer, the arrangement of some patterns, the electrodes RME, and the connection electrode CNE may be different.

On the other hand, in the case of the sixth sub-pixel SPX6 of the second pixel PXB, the first electrode contact hole CTD is positioned in a path where the second connection electrode CNE2 extends downward, and the second connection electrode CNE2 may have a shape that bypasses the first electrode contact hole CTD. Among the connection electrodes CNE, the first connection electrode CNE1 and the second connection electrode CNE2 are disposed on the third insulating layer PAS3, and there is a risk that the pattern connection may be broken due to a stepped portion therebelow. In particular, because the second connection electrode CNE2 of the sixth sub-pixel SPX6 extends in the first direction DR1 and is bent to bypass the first electrode contact hole CTD, it may be vulnerable to breakage of the pattern. To prevent this, in the display device 10, the arrangement of the connection electrodes CNE may be designed differently from that of other sub-pixels SPXn according to the arrangement of the electrode contact holes CTD and CTS.

Figure 28:
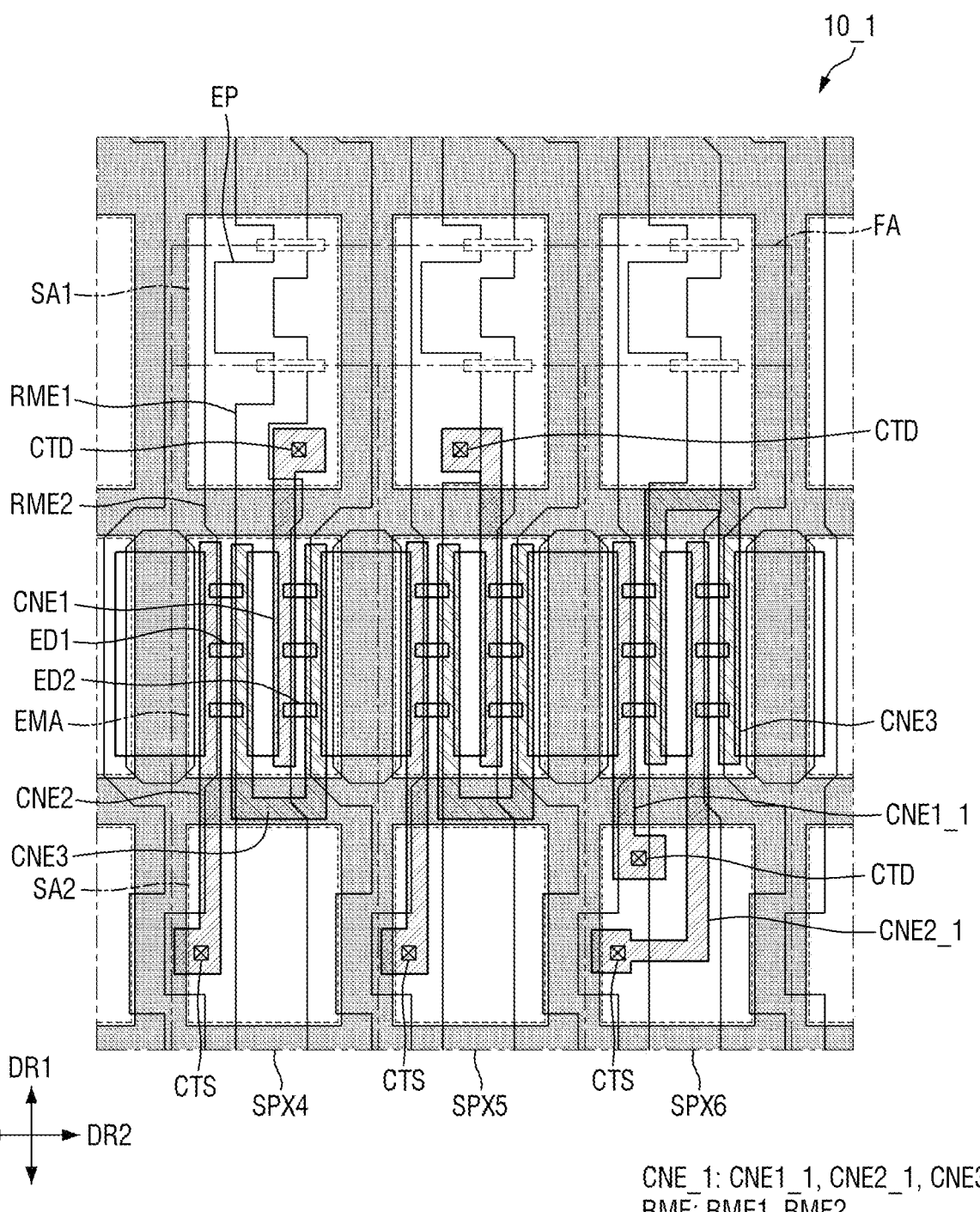
FIG. 28 is a plan view illustrating a second pixel of a display device according to one or more embodiments.

FIG. 28 is a plan view illustrating a second pixel of a display device according to one or more embodiments. FIG. 28 illustrates the relative arrangement of the electrode RME and the connection electrode CNE in the fourth sub-pixel SPX4, the fifth sub-pixel SPX5, and the sixth sub-pixel SPX6 of the second pixel PXB corresponding to FIG. 27.

Referring to FIG. 28 in conjunction with FIG. 27, in a display device 10_1 according to one or more embodiments, the arrangement of a first connection electrode CNE1_1 and a second connection electrode CNE2_1 in the sixth sub-pixel SPX6 of the second pixel PXB may be different from that in other sub-pixels SPXn. In the sixth sub-pixel SPX6, the connection electrode disposed on the first electrode RME1 between the extension portions CN_E1 and CN_E2 (see FIG. 8) of the third connection electrode CNE3 may be the second connection electrode CNE2_1, and the connection electrode disposed on the second electrode RME2 may be the first connection electrode CNE1_1. The second connection electrode CNE2_1 of the sixth sub-pixel SPX6 may be in contact with one sides of the first light emitting elements ED1, and the first connection electrode CNE1_1 may be in contact with one sides of the second light emitting elements ED2. The first connection electrode CNE1_1 may extend in the first direction DR1 on the second electrode RME2 and may be in contact with the second capacitance electrode CSE2 through the first electrode contact hole CTD positioned in the second sub-region SA2. The second connection electrode CNE2_1 may extend in the first direction DR1 on the first electrode RME1 and be bent in the second direction DR2 in the second sub-region SA2 to be in contact with the second bridge electrode BE2 through the second electrode contact hole CTS.

The light emitting element ED may include a plurality of semiconductor layers, and a first end and a second end may be distinguished according to the positions of the semiconductor layers. If the light emitting elements ED disposed in the sub-pixel SPXn are arranged such that their first ends face in the same direction, the connection electrodes CNE1_1 and CNE2_1 connected through the electrode contact holes CTD and CTS need to be specified. For example, when each of the first ends of the first light emitting element ED1 and the second light emitting element ED2 is placed above the first electrode RME1, in order for the light emitting elements ED to emit light normally, the first end of the first light emitting element ED1 needs to be connected to the first connection electrode CNE1 and the second end of the second light emitting element ED2 needs to be connected to the second connection electrode CNE2. However, the first light emitting element ED1 and the second light emitting element ED2 may be arranged such that their first ends do not face in a specific direction. Among the plurality of first light emitting elements ED1 and second light emitting elements ED2, some may be arranged such that their first ends are placed above the first electrode RME1 and some others may be arranged such that their first ends are placed above the second electrode RME2. In this case, even though the second connection electrode CNE2_1 is disposed on the first electrode RME1 and the first connection electrode CNE1_1 is disposed on the second electrode RME2, the second ends of some of the first light emitting elements ED1 may be connected to the second connection electrode CNE2_1, and the first ends of some of the second light emitting elements ED2 may be connected to the first connection electrode CNE1_1, thereby enabling normal light emission. That is, if the direction in which the first ends of the light emitting elements ED disposed above the first electrode RME1 and the second electrode RME2 face is not limited, the first connection electrode CNE1_1 and the second connection electrode CNE2_1 may be freely modified in design to correspond to the pattern shape of the third conductive layer.

According to one or more embodiments, in the sixth sub-pixel SPX6 of the second pixel PXB, the arrangement design of the connection electrodes CNE_1 may be changed so that the second connection electrode CNE2_1 has a shape extending in one direction as in the case of other sub-pixels. The first connection electrode CNE1_1 and the second connection electrode CNE2_1 may be distinguished according to members connected through the electrode contact holes CTD and CTS rather than according to the disposed electrodes, and in some sub-pixels (e.g., the sixth sub-pixel SPX6) unlike other sub-pixels SPXn, the first connection electrode CNE1_1 may be disposed on the second electrode RME2 and the second connection electrode CNE2_1 may be disposed on the first electrode RME1.

Figure 29:
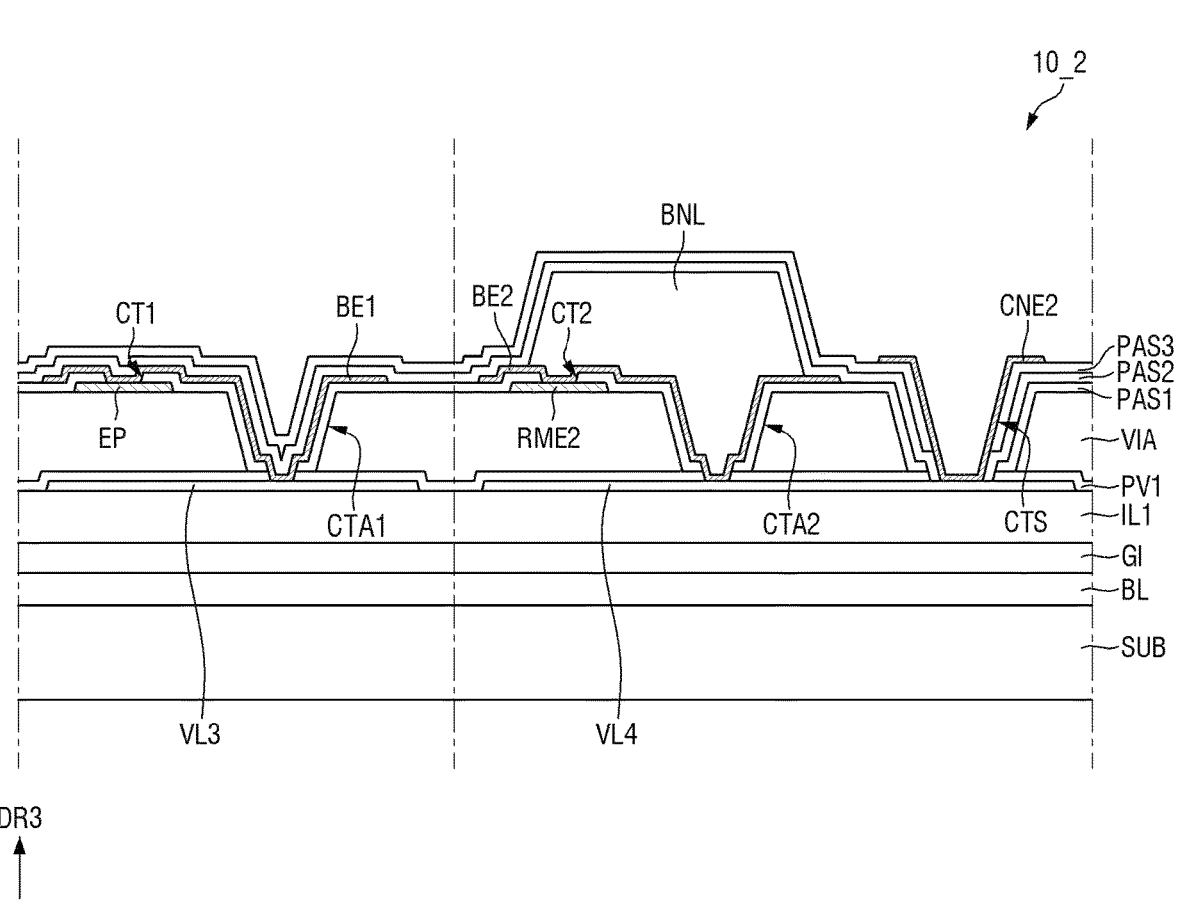
FIG. 29 is a cross-sectional view illustrating a connection portion between a second connection electrode and a fourth voltage line in a display device according to one or more embodiments.

FIG. 29 is a cross-sectional view illustrating a connection portion between a second connection electrode and a fourth voltage line in a display device according to one or more embodiments.

Referring to FIG. 29, in a display device 10_2 according to one or more embodiments, the second connection electrode CNE2 may be in direct contact with the fourth voltage line VL4 through the second electrode contact hole CTS penetrating the via layer VIA. According to one or more embodiments, similarly to the first connection electrode CNE1, the second connection electrode CNE2 may be in direct contact with the third conductive layer without being in contact with the second bridge electrode BE2. The embodiment is different from the embodiment of FIG. 15 in that the second connection electrode CNE2 is in direct contact with the fourth voltage line VL4.

The second electrode contact hole CTS may penetrate the via layer VIA, and an opening exposing a part of the top surface of the fourth voltage line VL4 may be formed in the second electrode contact hole CTS in each of the first passivation layer PV1, the first insulating layer PAS1, the second insulating layer PAS2, and the third insulating layer PAS3. In the opening penetrating the first passivation layer PV1 and the first insulating layer PAS1, the inner sidewalls of the first passivation layer PV1 and the first insulating layer PAS1 may be aligned with each other, and in the opening penetrating the second insulating layer PAS2 and the third insulating layer PAS3, the inner sidewalls of the second insulating layer PAS2 and the third insulating layer PAS3 may be aligned with each other. This structure may be formed by concurrently (e.g., simultaneously) etching the first insulating layer PAS1 and the first passivation layer PV1, and concurrently (e.g., simultaneously) etching the second insulating layer PAS2 and the third insulating layer PAS3, in the process of patterning the insulating layers so as to expose the top surface of the fourth voltage line VL4.

In concluding the detailed description, those skilled in the art will appreciate that many variations and modifications can be made to the described embodiments without substantially departing from the scope and principles of the present disclosure. Therefore, the embodiments of the present invention are used in a generic and descriptive sense only and not for purposes of limitation.

What is claimed is:

1. A display device comprising:
   an emission area, a first sub-region on one side of the emission area in a first direction, and a second sub-region on an other side of the emission area in the first direction;
   a bank layer surrounding the emission area, the first sub-region, and the second sub-region;
   a first voltage line extending in a second direction crossing the first direction in the first sub-region, and a second voltage line extending in the second direction in the second sub-region;
   a first electrode extending in the first direction and located across the first sub-region, the emission area, and the second sub-region;
   a second electrode extending in the first direction and comprising a portion spaced from the first electrode in the second direction in the emission area;
   a plurality of light emitting elements on the first electrode and the second electrode in the emission area;
   an electrode pattern in the first sub-region and spaced from the first electrode in the first direction;
   a first bridge electrode overlapping the electrode pattern and the first voltage line in the first sub-region while being in direct contact with each of the electrode pattern and the first voltage line; and
   a second bridge electrode partially located in the second sub-region, and overlapping the second electrode and the second voltage line while being in direct contact with each of the second electrode and the second voltage line.

2. The display device of claim 1, further comprising:
   a first via hole in the first sub-region and overlapping the first voltage line without overlapping the electrode pattern; and
   a first contact portion overlapping the electrode pattern, wherein the first bridge electrode overlaps the first via hole and the first contact portion.

3. An electronic device comprising:
   an emission area, a first sub-region on one side of the emission area in a first direction, and a second sub-region on an other side of the emission area in the first direction;

a bank layer surrounding the emission area, the first sub-region, and the second sub-region;

a first voltage line extending in a second direction crossing the first direction in the first sub-region, and a second voltage line extending in the second direction in the second sub-region;

a first electrode extending in the first direction and located across the first sub-region, the emission area, and the second sub-region;

a second electrode extending in the first direction and comprising a portion spaced from the first electrode in the second direction in the emission area;

a plurality of light emitting elements on the first electrode and the second electrode in the emission area;

an electrode pattern in the first sub-region and spaced from the first electrode in the first direction;

a first bridge electrode overlapping the electrode pattern and the first voltage line in the first sub-region while being in direct contact with each of the electrode pattern and the first voltage line;

a second bridge electrode partially located in the second sub-region, and overlapping the second electrode and the second voltage line while being in direct contact with each of the second electrode and the second voltage line;

a second via hole overlapping the second voltage line without overlapping the second electrode; and a second contact portion overlapping the second electrode, wherein the second bridge electrode overlaps the second via hole and the second contact portion under the bank layer.

4. The electronic device of claim 3, wherein the second via hole and the second contact portion overlap a portion of the bank layer on one side of the second sub-region in the second direction.

5. The electronic device of claim 3, further comprising:

a first connection electrode on the first electrode and in contact with some of the plurality of light emitting elements; and a second connection electrode on the second electrode and in contact with some of the plurality of light emitting elements.

6. The electronic device of claim 5, wherein the first connection electrode extends from the emission area to the other side in the first direction so that a portion thereof is disposed to overlap a first electrode contact hole disposed not to overlap the first electrode in the second sub-region.

7. The electronic device of claim 6, further comprising:

a scan line on one side of the second voltage line in the first direction and extending in the second direction in the second sub-region; and a gate pattern extending from the scan line to one side in the first direction and located across the emission area and the second sub-region in which the first electrode contact hole is formed.

8. The electronic device of claim 6, further comprising:

a scan line disposed on one side of the second voltage line in the first direction and extending in the second direction in the second sub-region; and a gate pattern extending from the scan line to one side in the first direction and disposed across the emission area and the second sub-region in which the first electrode contact hole is not formed.

9. The electronic device of claim 5, wherein the first connection electrode extends from the emission area to one side in the first direction so that a portion thereof overlaps a first electrode contact hole located between the first electrode and the second electrode in the first sub-region.

10. The electronic device of claim 5, wherein the second connection electrode extends from the emission area to the other side in the first direction so that a portion thereof is located in the second sub-region, and is in direct contact with the second bridge electrode through a second electrode contact hole in the second sub-region while overlapping the second bridge electrode.

11. The electronic device of claim 5, wherein the second connection electrode extends from the emission area to the other side in the first direction so that a portion thereof is in the second sub-region, and is in direct contact with the second voltage line through a second electrode contact hole in the second sub-region while overlapping the second voltage line.

12. The electronic device of claim 5, wherein the second electrode comprises an electrode stem portion extending in the first direction, and a first electrode branch portion and a second electrode branch portion branched from the electrode stem portion, wherein the first electrode branch portion of the second electrode and the second electrode branch portion of another second electrode are located in the emission area with the first electrode interposed therebetween, wherein the plurality of light emitting elements comprises a first light emitting element and a second light emitting element, the first light emitting element being on the first electrode and the second electrode branch portion, and the second light emitting element being on the first electrode and the first electrode branch portion.

13. The electronic device of claim 12, wherein the first connection electrode is on the first electrode and is in contact with the first light emitting element, wherein the second connection electrode is on the first electrode branch portion of the second electrode and is in contact with the second light emitting element, and wherein the electronic device further comprises a third connection electrode located across the first electrode and the second electrode branch portion of another second electrode, the third connection electrode being in contact with the first light emitting element and the second light emitting element.

14. A display device comprising:

a first substrate comprising a display area and a pad area on one side of the display area;

a first conductive layer on the first substrate, the first conductive layer comprising a plurality of voltage lines in the display area and a plurality of pad electrodes in the pad area;

a first passivation layer on the first conductive layer;

a via layer on the first passivation layer in the display area and comprising a plurality of via holes overlapping the plurality of voltage lines;

a first electrode and a second electrode on the via layer in the display area, and spaced from each other without overlapping the via holes;

a first insulating layer on the first electrode and the second electrode in the display area and located on the first passivation layer in the pad area;

a plurality of bridge electrodes overlapping one of the first and second electrodes and the via hole;

a plurality of light emitting elements on the first electrode and the second electrode that are spaced from each other on the first insulating layer; and a first connection electrode on the first electrode and in contact with some of the plurality of light emitting elements, and a second connection electrode on the second electrode and in contact with some of the plurality of light emitting elements, wherein the plurality of bridge electrodes comprises a first bridge electrode and a second bridge electrode, the first bridge electrode being in direct contact with a first voltage line of the plurality of voltage lines and the first electrode through a first via hole exposing a part of a top surface of the first voltage line and a first contact portion exposing a part of a top surface of the first electrode, respectively, and wherein the second bridge electrode in direct contact with a second voltage line of the plurality of voltage lines and the second electrode through a second via hole exposing a part of a top surface of the second voltage line and a second contact portion exposing a part of a top surface of the second electrode, respectively.

15. The display device of claim 14, wherein the first insulating layer and the first passivation layer comprise openings exposing parts of top surfaces of the first voltage line and the second voltage line in the first via hole and the second via hole, respectively, and wherein the first bridge electrode and the second bridge electrode are in direct contact with the first voltage line and the second voltage line through the openings, respectively.

16. The display device of claim 15, wherein inner sidewalls of the first insulating layer and the first passivation layer are aligned with each other in the opening.

17. The display device of claim 14, wherein the first connection electrode is in direct contact with a first electrode connection portion of the first conductive layer through a first electrode contact hole penetrating the via layer without overlapping the first electrode, and wherein the first passivation layer and the first insulating layer further comprise an opening exposing a part of a top surface of the first electrode connection portion in the first electrode contact hole.

18. The display device of claim 17, further comprising:

a second insulating layer on the plurality of light emitting elements and the first insulating layer; and a third insulating layer on the second insulating layer, wherein the second connection electrode is in direct contact with the second bridge electrode through a second electrode contact hole penetrating the second insulating layer and the third insulating layer to expose a part of a top surface of the second bridge electrode without overlapping the second electrode.

19. The display device of claim 17, wherein the second connection electrode is in direct contact with the second voltage line through a second electrode contact hole penetrating the via layer without overlapping the second electrode.

20. The display device of claim 19, wherein the first insulating layer and the first passivation layer comprise openings exposing parts of top surfaces of the pad electrodes, the display device further comprising pad bridge electrodes in direct contact with the pad electrodes through the openings.

* * * * *